(12) United States Patent
Pappu

(10) Patent No.: US 10,056,155 B2
(45) Date of Patent: *Aug. 21, 2018

(54) SYSTEMS, METHODS, AND APPARATUSES FOR IMPLEMENTING TESTING OF A FAR MEMORY SUBSYSTEM WITHIN TWO-LEVEL MEMORY (2LM) STACKED DIE SUBSYSTEMS

(71) Applicant: Intel Corporation, Santa Clara, CA (US)

(72) Inventor: Lakshminarayana Pappu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/475,902

(22) Filed: Mar. 31, 2017

(65) Prior Publication Data

US 2018/0096735 A1 Apr. 5, 2018

Related U.S. Application Data

(63) Continuation-in-part of application No. 15/283,055, filed on Sep. 30, 2016.

(51) Int. Cl.
*G11C 29/00* (2006.01)
*G11C 29/14* (2006.01)
(Continued)

(52) U.S. Cl.
CPC .............. *G11C 29/14* (2013.01); *G06F 3/061* (2013.01); *G06F 3/0655* (2013.01); *G06F 3/0688* (2013.01); *G11C 5/063* (2013.01); *G11C 11/4096* (2013.01); *H01L 25/0657* (2013.01); *H01L 25/18* (2013.01); *G06F 2212/7201* (2013.01); *H01L 2225/0652* (2013.01); *H01L 2225/06517* (2013.01); *H01L 2225/06544* (2013.01)

(58) Field of Classification Search
CPC ..... G11C 29/14; G11C 11/4096; G11C 5/063; G06F 3/0688; G06F 3/061; G06F 3/0655; G06F 2212/7201; H01L 25/18; H01L 25/0657; H01L 2225/06544; H01L 2225/0652; H01L 2225/06517
USPC ................... 365/200, 201, 63, 51
See application file for complete search history.

(56) References Cited

U.S. PATENT DOCUMENTS

2015/0270000 A1* 9/2015 Perego ................ G06F 12/0246
  711/103
2017/0078813 A1* 3/2017 Murrells .............. H04R 29/004

* cited by examiner

*Primary Examiner* — David Lam
(74) *Attorney, Agent, or Firm* — Schwabe, Williamson & Wyatt, P.C.

(57) ABSTRACT

A stacked semiconductor package includes a functional silicon die, and a test controller having signature accumulation logic embedded therein. A fabric to route transactions is between the test controller and a far memory controller of the functional silicon die. The far memory controller includes a physical memory interface having no physical memory attached. A Two Level Memory (2LM) controller is included having logic to modify received transactions to indicate a cache miss forcing all received transactions to be routed to the far memory controller via the fabric. An auto response mechanism is included to observe the transactions on the fabric and route responses and completions issued in reply to the transactions back to an agent having initiated the transactions.

25 Claims, 31 Drawing Sheets

(51) Int. Cl.
*H01L 25/18* (2006.01)
*H01L 25/065* (2006.01)
*G11C 11/4096* (2006.01)
*G11C 5/06* (2006.01)
*G06F 3/06* (2006.01)

Fig. 6

| 699 Detour Encoding | 600 Mux Selects (In Order of Signals Starting with CA9) | 615 DA8 | 620 CA9 | 625 CA10 | 630 CA8 | 635 CA7 | 640 CA6 | 645 CA3 | 650 CA4 | 655 CA5 | 660 CA2 | 665 CA1 | 670 CA0 |
|---|---|---|---|---|---|---|---|---|---|---|---|---|---|
| 0h | 616 Mux Select: Signal on Lane | NC | 0 CA9 | 0 CA10 | 0 CA8 | 0 CA7 | 0 CA6 | 0 CA3 | 0 CA4 | 0 CA5 | 0 CA2 | 0 CA1 | 0 CA0 |
| 1h | 602 Mux Select: Signal on Lane | NC | 1 NC | 0 CA10 | 0 CA8 | 0 CA7 | 0 CA6 | 0 CA3 | 0 CA4 | 0 CA5 | 0 CA2 | 0 CA1 | 0 CA0 |
| 2h | 614 Mux Select: Signal on Lane | CA9 | 1 CA10 | 1 NC | 0 CA8 | 0 CA7 | 0 CA6 | 0 CA3 | 0 CA4 | 0 CA5 | 0 CA2 | 0 CA1 | 0 CA0 |
| 3h | 603 Mux Select: Signal on Lane | CA9 | 1 CA10 | 1 CA8 | 1 NC | 0 CA7 | 0 CA6 | 0 CA3 | 0 CA4 | 0 CA5 | 0 CA2 | 0 CA1 | 0 CA0 |
| 4h | 604 Mux Select: Signal on Lane | CA9 | 1 CA10 | 1 CA8 | 1 CA7 | 1 NC | 0 CA6 | 0 CA3 | 0 CA4 | 0 CA5 | 0 CA2 | 0 CA1 | 0 CA0 |
| 5h | 605 Mux Select: Signal on Lane | CA9 | 1 CA10 | 1 CA8 | 1 CA7 | 1 CA6 | 1 NC | 0 CA3 | 0 CA4 | 0 CA5 | 0 CA2 | 0 CA1 | 0 CA0 |
| 6h | 606 Mux Select: Signal on Lane | CA9 | 1 CA10 | 1 CA8 | 1 CA7 | 1 CA6 | 1 CA3 | 1 NC | 0 CA4 | 0 CA5 | 0 CA2 | 0 CA1 | 0 CA0 |
| 7h | 607 Mux Select: Signal on Lane | CA9 | 1 CA10 | 1 CA8 | 1 CA7 | 1 CA6 | 1 CA3 | 1 CA4 | 1 NC | 0 CA5 | 0 CA2 | 0 CA1 | 0 CA0 |
| 8h | 608 Mux Select: Signal on Lane | CA9 | 1 CA10 | 1 CA8 | 1 CA7 | 1 CA6 | 1 CA3 | 1 CA4 | 1 CA5 | 1 NC | 0 CA2 | 0 CA1 | 0 CA0 |
| 9h | 609 Mux Select: Signal on Lane | CA9 | 1 CA10 | 1 CA8 | 1 CA7 | 1 CA6 | 1 CA3 | 1 CA4 | 1 CA5 | 1 CA2 | 1 NC | 0 CA1 | 0 CA0 |
| Ah | 610 Mux Select: Signal on Lane | CA9 | 1 CA10 | 1 CA8 | 1 CA7 | 1 CA6 | 1 CA3 | 1 CA4 | 1 CA5 | 1 CA2 | 1 CA1 | 1 NC | 0 CA0 |
| Bh | 611 Mux Select: Signal on Lane | CA9 | 1 CA10 | 1 CA8 | 1 CA7 | 1 CA6 | 1 CA3 | 1 CA4 | 1 CA5 | 1 CA2 | 1 CA1 | 1 CA0 | 1 NC |
| Ch - Fh | 612 Mux Select: Signal on Lane | NC | 0 CA9 | 0 CA10 | 0 CA8 | 0 CA7 | 0 CA6 | 0 CA3 | 0 CA4 | 0 CA5 | 0 CA2 | 0 CA1 | 0 CA0 |

601

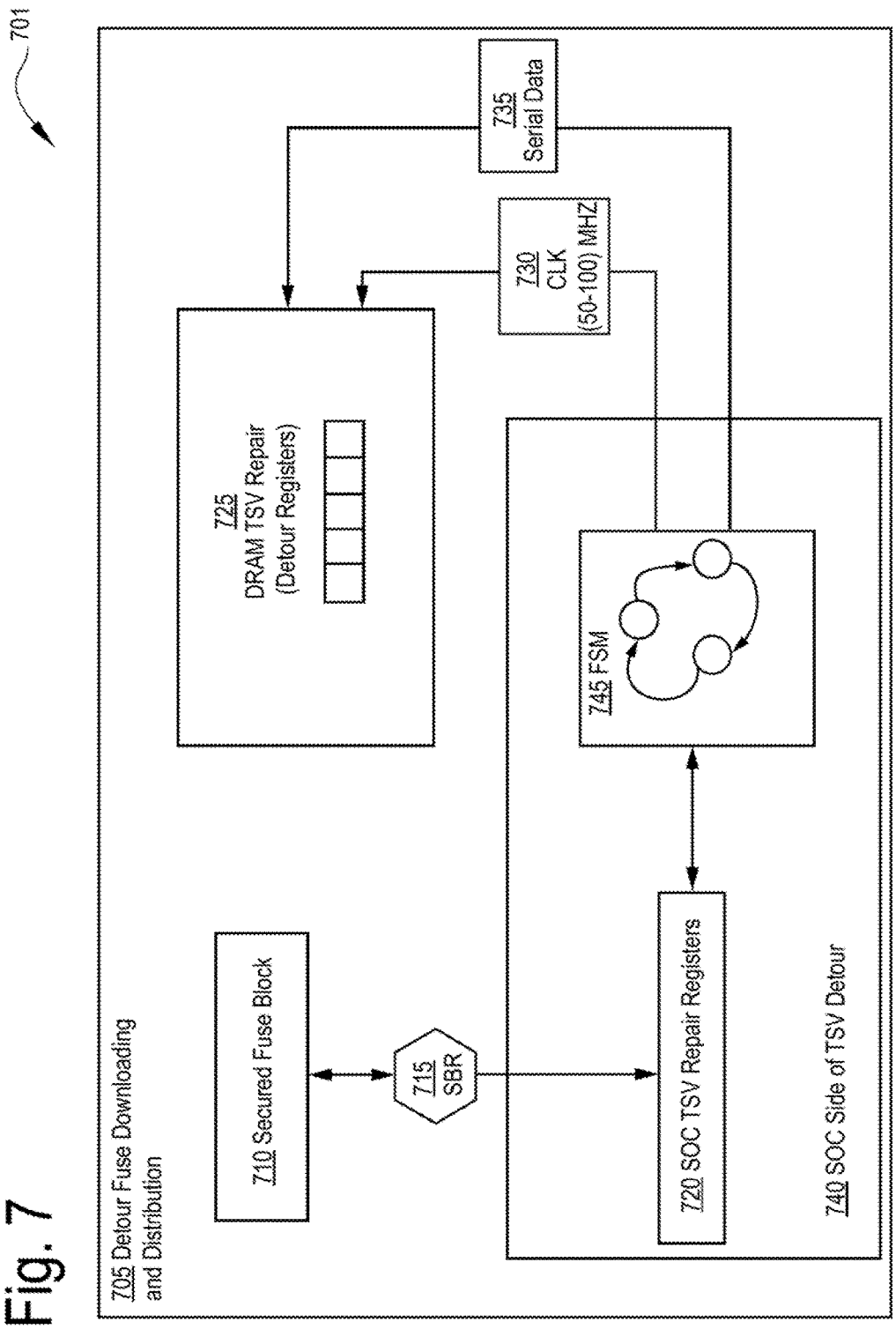

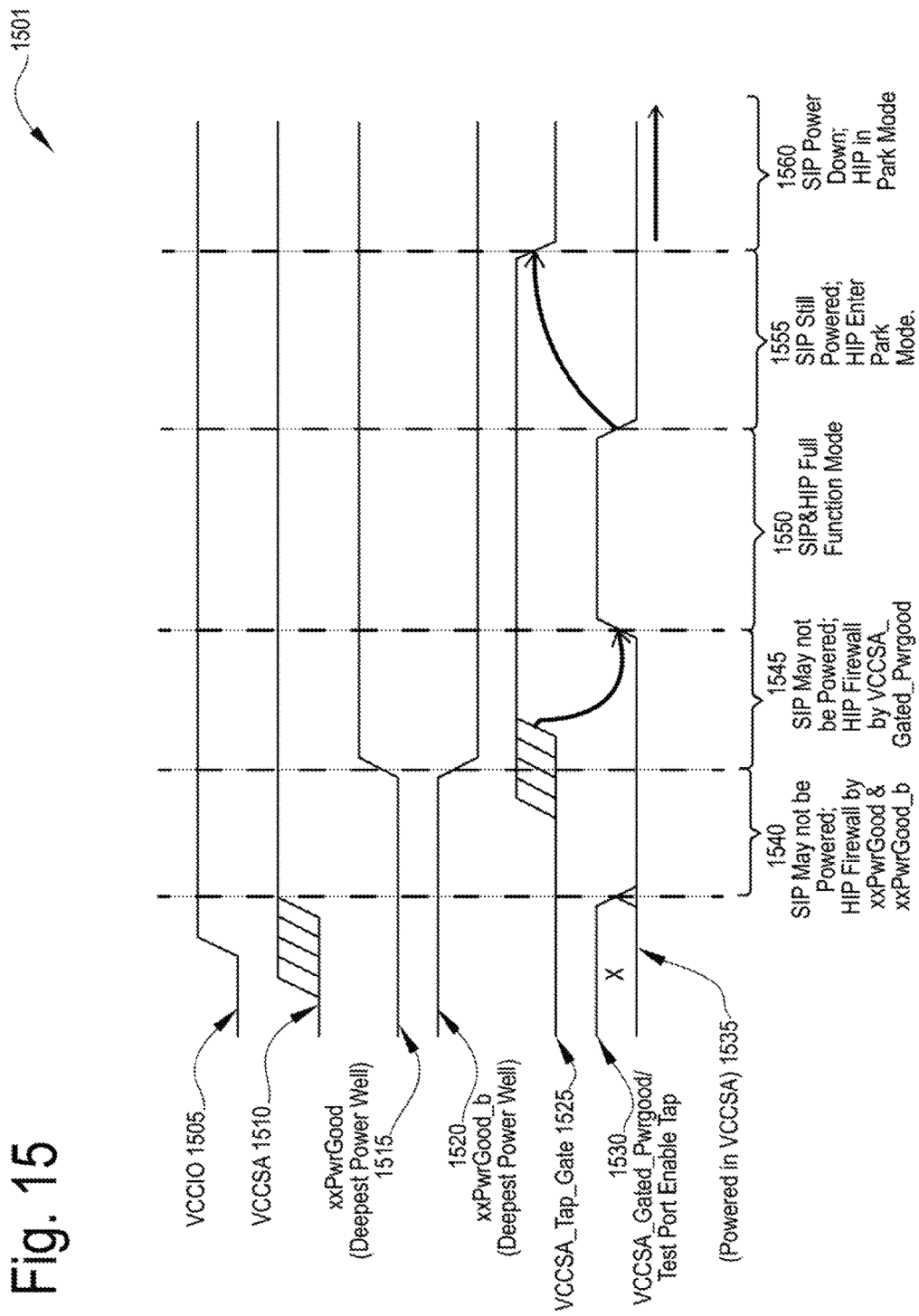

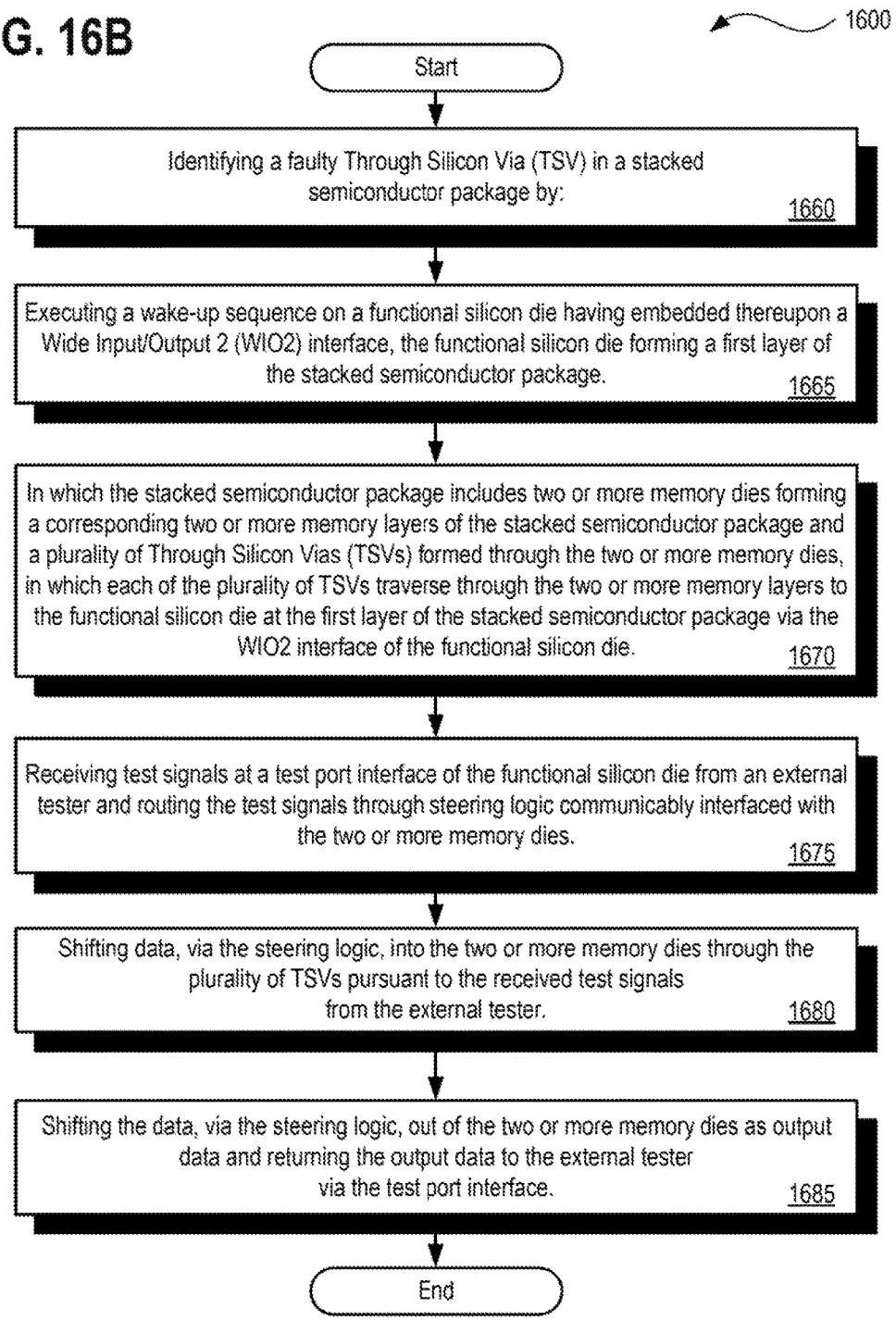

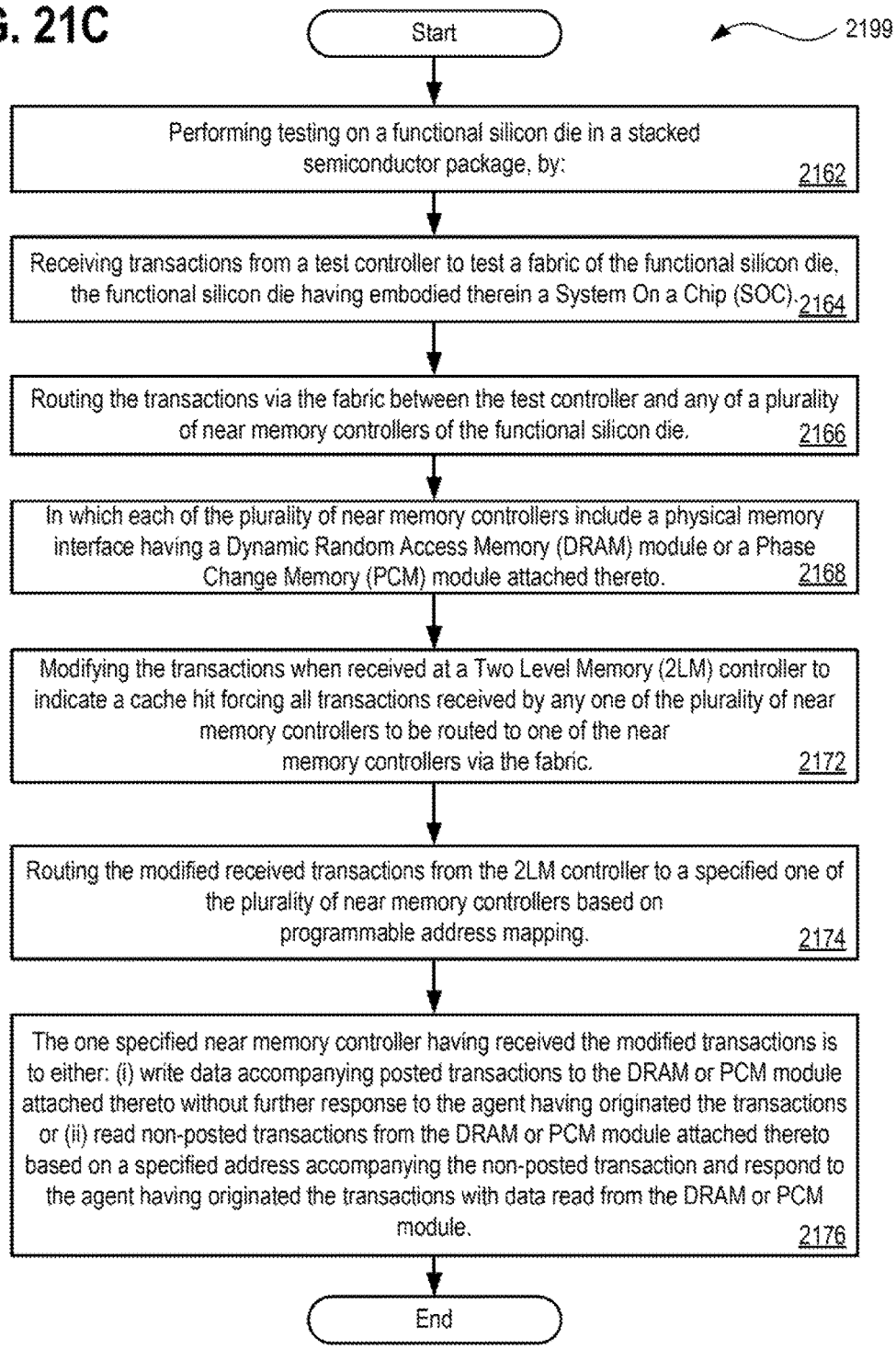

SYSTEMS, METHODS, AND APPARATUSES FOR IMPLEMENTING TESTING OF A FAR MEMORY SUBSYSTEM WITHIN TWO-LEVEL MEMORY (2LM) STACKED DIE SUBSYSTEMS

CLAIM OF PRIORITY

This application is a Continuation-In Part (CIP) patent application of, and claims priority to, U.S. patent application entitled "SYSTEMS, METHODS, AND APPARATUSES FOR IMPLEMENTING DIE RECOVERY IN TWO-LEVEL MEMORY (2LM) STACKED DIE SUBSYSTEMS," filed on Sep. 30, 2016, having an application Ser. No. 15/283,055, the entire contents of which are incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to embodiments related to the (i) systems, methods, and apparatuses for implementing die recovery in Two-Level Memory (2LM) stacked die subsystems; the (ii) systems, methods, and apparatuses for implementing fault identification of a Through Silicon Via (TSV) in Two-Level Memory (2LM) stacked die subsystems; (iii) systems, methods, and apparatuses for implementing testing of fault repairs to a Through Silicon Via (TSV) in Two-Level Memory (2LM) stacked die subsystems; and (iv) additionally to the systems, methods, and apparatuses for implementing testing of a far memory subsystem within Two-Level Memory (2LM) stacked die subsystems.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

The modern consumer electronics market frequently demands complex functions requiring very intricate circuitry. Scaling to smaller and smaller fundamental building blocks, (e.g. transistors), has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support increased circuit density.

One solution to such a problem is to stack the functional silicon devices into 3D (three dimensional) semiconductor packages formed from multiple functional silicon dies including one or more memories and one or more logic dies.

The more densely packed the functional elements become within any given semiconductor package, the better the performance will be for that semiconductor package as there can be more "stuff" within the same physical space capable of performing functional aspects of the functional semiconductor silicon dies and devices of the semiconductor package and the shorter the information must travel, thus resulting in faster processing.

Reducing the total space occupied by the same number of functional silicon dies helps to address this problem by stacking the functional silicon dies into a package to realize such physical space reductions.

But such a solution introduces additional complexity and brings additional problems which must now be addressed.

The present state of the art may therefore benefit from (i) the means for implementing die recovery in Two-Level Memory (2LM) stacked die subsystems; (ii) the means for implementing fault identification of a Through Silicon Via (TSV) in Two-Level Memory (2LM) stacked die subsystems; (iii) the means for implementing testing of fault repairs to a Through Silicon Via (TSV) in Two-Level Memory (2LM) stacked die subsystems; and (iv) the means for implementing testing of a far memory subsystem within Two-Level Memory (2LM) stacked die subsystems, each of which are described herein.

BRIEF DESCRIPTION OF THE DRAWINGS

Embodiments are illustrated by way of example, and not by way of limitation, and will be more fully understood with reference to the following detailed description when considered in connection with the figures in which:

FIG. 6 depicts a table which may be used for shifting the address signals for any possible failed lane in accordance with described embodiments;

FIG. 7 depicts an exemplary process flow implementing a detour fuse downloading and distribution scheme in accordance with described embodiments;

FIG. 15 depicts an exemplary wake-up sequence of a test port during a power-up sequence in accordance with described embodiments;

FIG. 16B is a flow diagram illustrating a method for implementing fault identification of a Through Silicon Via (TSV) in two-level memory (2LM) stacked die subsystems in accordance with described embodiments;

DETAILED DESCRIPTION

Figure 1A:
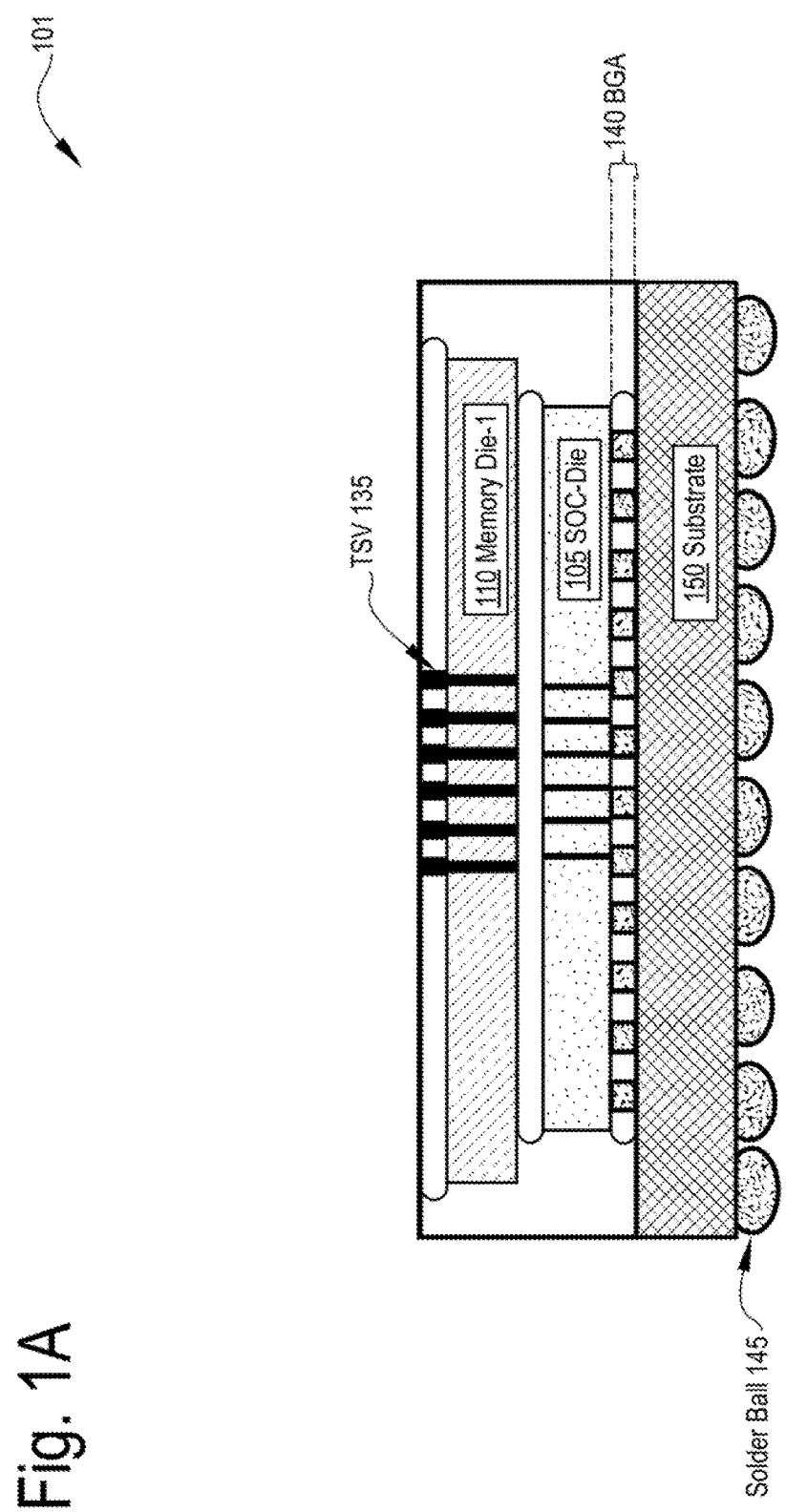
FIG. 1A depicts an exemplary stacked semiconductor device in accordance with which embodiments may operate.

Described herein are systems, methods, and apparatuses for implementing die recovery in Two-Level Memory (2LM) stacked die subsystems. For instance, there is disclosed in accordance with one embodiment a stacked semiconductor package having therein: a processor functional silicon die at a first layer of the stacked semiconductor package; one or more memory dies forming a corresponding one or more memory layers of the stacked semiconductor package; a plurality of Through Silicon Vias (TSVs) formed through the one or more memory dies, in which each of the plurality of TSVs traverse through the one or more memory layers to the processor functional silicon die at the first layer of the stacked semiconductor package; a plurality of physical memory interfaces electrically interfacing the one or more memory dies to the processor functional silicon die at the first layer through the memory layers via the plurality of TSVs; a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV.

Such means are utilized within exemplary 2LM memory die packages, such as a die package having a CPU die at the bottom and multiple on-die memories attached to the CPU which connect to a bottom substrate through TSVs traversing down through the sub-layer memories and the CPU to the substrate. Such TSVs create traversable pillars through the die stack by which the memories electrically connect to the substrate. According to described embodiments, a redundant memory interface path is provided electrically connecting the memories to the substrate through the redundant via which may then be manipulated using routing/remapping schemes to re-route a data path of one of the memories around a broken or faulty TSV connection through the redundant memory interface such that the complete die stack functions to the specification without having to scrap an entire stacked die package. Such means provide for significant cost savings as the redundancy permits an otherwise faulty package due to a faulty TSV to be saved and perform to specifications. Additionally provided are means by which to shift decoded mapping strings from a main die into a memory die using a two wire interface with a clock and a data interface and shifting the decoded fuse string used for remapping the logical path from the CPU die (e.g., a main die) to the memory die on every warm or cold boot of the stacked memory die.

Additionally described herein are the systems, methods, and apparatuses for implementing fault identification of a Through Silicon Via (TSV) in Two-Level Memory (2LM) stacked die subsystems. For instance, there is disclosed in accordance with one embodiment a stacked semiconductor package which includes a functional silicon die having embedded thereupon a Wide Input/Output 2 (WIO2) interface, the functional silicon die forming a first layer of the stacked semiconductor package; two or more memory dies forming a corresponding two or more memory layers of the stacked semiconductor package; a plurality of Through Silicon Vias (TSVs) formed through the two or more memory dies, in which each of the plurality of TSVs traverse through the two or more memory layers to the functional silicon die at the first layer of the stacked semiconductor package via the WIO2 interface of the functional silicon die; a test port interface to receive test signals from an external tester and route the test signals through steering logic communicably interfaced with the two or more memory dies; in which the steering logic is to shift data into the two or more memory dies through the plurality of TSVs pursuant to the received test signals from the external tester; and further in which the steering logic is to further shift the data out of the two or more memory dies as output data and return the output data to the external tester via the test port interface.

Within exemplary 2LM memory die packages, means are described by which to test the die package to systematically identify faulty TSVs through various hardware mechanisms by communicating data between an external tester and the stacked memory dies according to certain embodiments. For instance, by building a hardware analog interface to the memory dies through which control signals are then sent to the memories, it may be determined which of a plurality of TSVs within such a stacked die are working and specifically identify any defective TSVs within the 2LM die package which are faulty and thus require repair via the re-routing algorithms described the preceding embodiments.

Also described herein are the systems, methods, and apparatuses for implementing testing of fault repairs to a Through Silicon Via (TSV) in Two-Level Memory (2LM) stacked die subsystems. For instance, there is in accordance with one embodiment, a stacked semiconductor package, including: a functional silicon die; a test controller having signature accumulation logic embedded therein; a fabric to route transactions between the test controller and any of a plurality of near memory controllers of the functional silicon die; in which each of the plurality of near memory controllers include a physical memory interface having no physical memory attached; and a buffer embedded on the functional silicon die to operate as a cache for the transactions; a Two Level Memory (2LM) controller having logic to modify received transactions to indicate a cache hit forcing all received transactions to be routed to one of the near memory controllers via the fabric; an auto response mechanism to observe the transactions on the fabric and route responses and completions issued in reply to the transactions back to an agent having initiated the transactions; and a configurable mux to route the transactions to the cache or to the auto response mechanism.

In accordance with an alternative embodiment there is a stacked semiconductor package, including: a functional silicon die having embodied therein a System On a Chip (SOC); a test controller having signature accumulation logic embedded therein; a fabric to route transactions between the test controller and any of a plurality of near memory controllers of the functional silicon die; in which each of the plurality of near memory controllers include a physical memory interface having a Dynamic Random Access Memory (DRAM) module or a Phase Change Memory (PCM) module attached thereto; and a Two Level Memory (2LM) controller having logic to modify received transactions to indicate a cache hit forcing all received transactions to be routed to one of the near memory controllers via the fabric; the 2LM controller further including logic to route the modified received transactions to a specified one of the plurality of near memory controllers based on programmable address mapping; in which the one specified near memory controller having received the modified transactions is to either: (i) write data accompanying posted transactions to the DRAM or PCM module attached thereto without further response to the agent having originated the transactions or (ii) read non-posted transactions from the DRAM or PCM module attached thereto based on a specified address accompanying the non-posted transaction and respond to the agent having originated the transactions with data read from the DRAM or PCM module.

For instance, again within exemplary 2LM memory die packages, means are described by which to test a 2LM semiconductor package for which faulty TSVs have been previously identified and "repaired" utilizing the re-routing or re-mapping of the data paths using a redundant TSV. More particularly, according to certain embodiments, a test controller is built on-die and transactions are sent to a near memory (e.g., memory provided within the package via memory die layers) subsequent to which the transactions are then received back from the near memory to verify that correct operation subsequent to the re-routing and repair of a faulty TSV within the die stack. For instance, according to certain embodiments, a hardware structure is built within the 2LM controller which serves to transform incoming requests such that the requests go only to the near memory for the purposes of testing while ordinarily, requests may go to either the near or far memories. Nevertheless, proper test coverage post repair necessitates testing of the near memory specifically. A DFX mechanism may thus be provided to direct the transactions to only the near memory controller.

Still further, there are described herein systems, methods, and apparatuses and systems for implementing testing of a far memory subsystem within Two-Level Memory (2LM) stacked die subsystems. For instance, there is disclosed in accordance with one embodiment a stacked semiconductor package having therein: a functional silicon die; a test controller having signature accumulation logic embedded therein; a fabric to route transactions between the test controller and a far memory controller of the functional silicon die; in which the far memory controller includes a physical memory interface having no physical memory attached; a Two Level Memory (2LM) controller having logic to modify received transactions to indicate a cache miss forcing all received transactions to be routed to the far memory controller via the fabric; and an auto response mechanism to observe the transactions on the fabric and route responses and completions issued in reply to the transactions back to an agent having initiated the transactions.

For instance, again within exemplary 2LM memory die packages, means are described by which to test a far memory controller for the 2LM memory package subsystem. When a request misses at the near memory during normal operation the request will then proceed to the far memory controller and then to any external SXP memory device. Unfortunately, because there is no external SXP memory connected with the far memory interface during testing there is no way to test the far memory controller sub-system at the time of manufacture without connecting such an external SXP memory device which inhibits manufacturing throughput, requires extensive manufacturing space, and increases capital costs for test. It is therefore provided in accordance with described embodiments a virtual device which is built into the far memory controller and mimics the far memory controller's operations and responds on behalf of the missing external SXP memory devices with a corresponding protocol appropriate response such that comprehensive testing may be conducted without necessitating the connection of an external SXP memory at the time of manufacture. Additionally provided is a DFX mechanism used to bypass the near memory controller direct transactions only to the far memory controller in accordance with specific embodiments.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1A depicts an exemplary stacked semiconductor device 101 in accordance with which embodiments may operate.

In particular, the depicted semiconductor device 101 embodies a Two-Level Memory (2LM) stacked die subsystem having both a System On a Chip (SOC) die 105 at a bottom layer also called "logic die" or a functional silicon die or a functional semiconductor device and then a memory die (e.g., memory die-1) 110 at a top layer. There is further depicted a substrate 150 which is interfaced with the SOC-die 105 and the memory die 110 via the Ball Grid Array (BGA) 140 as shown. Electrical interconnects of the top memory die 110 are electrically interfaced to the substrate 150 first through the Through Silicon Vias (TSVs) 135 as shown and then through the BGA and into the substrate 150.

Additionally depicted are the solder balls 145 to provide electrical connectivity between the substrate and another board, such as a main board, a Printed Circuit Board (PCB) motherboard, etc.

The stacked semiconductor device 101 depicted here provides one or more three dimensional (3D) stacked memory modules (e.g., memory die-1 at element 110) which are tightly integrated into the microprocessors, such as SOC-die 105.

Such technology meets the low power consumption and high bandwidth requirements now demanded by the computing industry and consumer electronics marketplace.

Consequently, it is of critical importance that such memory dies (e.g., memory die-1) operate reliably as the integrated components cannot be swapped out after manufacture. State differently, failure of a single integrated component necessitates replacement of the entire stacked semiconductor device 101 at great expense.

According to one embodiment, a first memory layer is formed from a DRAM semiconductor die. According to a particular embodiment, the DRAM is glued or affixed to the SOC die or another logic die. According to another a second level memory die is formed from a phase change memory. Phase-change memory or SXP memory (also known as PCM, PCME, PRAM, PCRAM, Ovonic Unified Memory, Chalcogenide RAM and C-RAM) is a type of non-volatile random-access memory. By keeping the memory physically closer to the CPU die, logic die, or SOC die as is depicted here, critical applications are able to run faster.

According to certain embodiments, the memory dies form near memory for the SOC die which may be utilized as caching memory due to its close proximity with the SOC die.

Figure 1B:
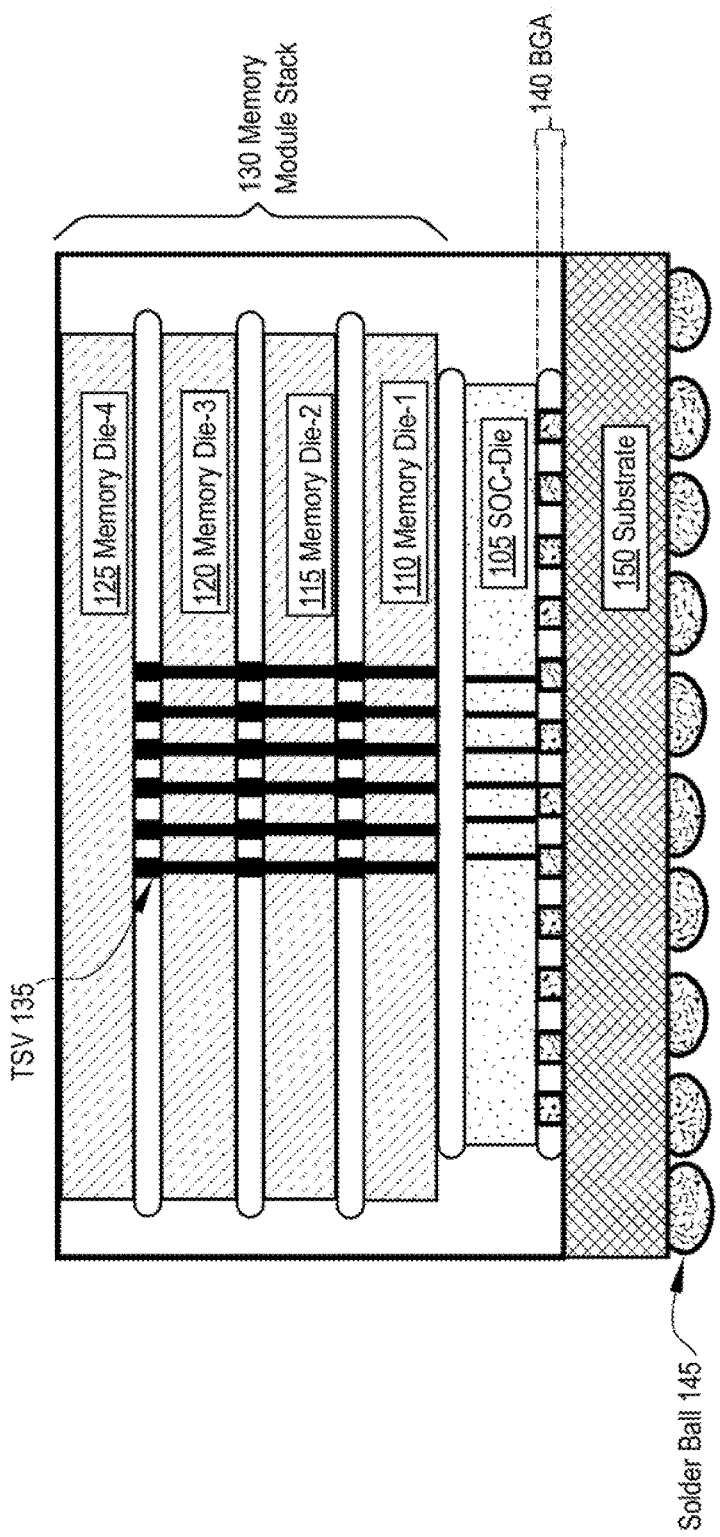
FIG. 1B depicts an exemplary stacked semiconductor device in accordance with which embodiments may operate.

FIG. 1B depicts an exemplary stacked semiconductor device 102 in accordance with which embodiments may operate.

In particular, there is depicted a System On a Chip (SOC) attached to a stack for the memory dies using TSVs 135 in which the TSVs provide connectivity from the uppermost memory die-4 at element 125 down through openings formed through each of the memory dies 3, 2, and 1, at elements 120, 115, and 110 respectively, and ultimately through the SOC-die 105 to the BGA 140 layer and into the substrate 150 which as before may be connected with another main board or PCB motherboard, etc., using the solder balls 145.

As shown, a memory module stack 130 is formed from the memory dies 1, 2, 3, and 4 (elements 110, 115, 120, and 125) providing memory to the SOC-die 105 within a single 3D stacked semiconductor package 102.

As depicted here, the stacked memory dies 1, 2, 3, and 4 (elements 110, 115, 120, and 125) are connected to one to another and also to the CPU embodied within the SOC-die 105 through the TSV 135 interconnects. The TSVs are leveraged in such a design to enable the vertical stacking of such memory chips. The 3D stacked semiconductor approach is especially beneficial at wafer level packaging permitting "vias" to be opened (e.g., a trench or opening etched into the material) from the front side of the wafer all the way through the wafer and then out the back of the wafer, forming, in essence, a hole through the functional semiconductor device. The vias or TSVs formed through the functional silicon devices may vary in diameter from 1 μm (micron) to 10 μm with a depth typically being 5 to 10 times the width.

The TSVs 135 provide a critical communications interface from the upper level functional dies, be they memory dies, SOC dies, logic dies, or otherwise, to the substrate below. Any stress to the TSVs 135 resulting from the assembly process, random defects or anomalies, or even systematic defects in the manufacturing process which forms the TSVs 135 at the per-functional silicon die level or at the assembled stacked semiconductor device 102 level has the potential to render the entire manufactured stacked semiconductor device 102 useless. It is also feasible that the TSV operates when formed and even when the dies are integrated into the stacked semiconductor device 102 but then fail shortly after, for instance, due to high electrical stress, due to temperature changes, and so forth. Through testing it is possible to cause such early life failures of the devices to occur during manufacturing and testing processes during which time the faulty TSVs may also therefore be re-worked, thus preventing scrap loss and also preventing such failure modes from reaching consumers.

Conventionally, defective stacked semiconductor device 102 necessitated scrapping the entire stacked semiconductor device 102 as it could not be re-worked and having even a single TSV 135 amongst the many utilized resulted in reduced functionality or non-functionality for the entire stacked semiconductor device 102.

More problematically, certain stacked semiconductor device 102 embody not just functional silicon devices such as SOC-dies 105 or logic dies manufactured by the producer of the stacked semiconductor device 102 but additionally embody memory dies (110, 115, 120, 125) purchased from external third party companies, meaning that purchase product which was to be integrated into a finished product was also scrapped, resulting in a substantial financial loss to the manufacturer of the stacked semiconductor device 102.

Moreover, manufacturing of the TSVs 135 is an inherently complex process and depending on the precise methodologies, the process of forming the TSVs 135 results in anywhere from a 10-12% yield loss which translates in turn to upwards of 200 million dollars in financial losses attributable to the manufacturer of such products due to TSV 135 defects and scrap at the per-device and stacked semiconductor device 102 level, with the scrap of any finished stacked semiconductor device 102 being much more costly.

It is therefore in accordance with described embodiments that a TSV 135 repair process is utilized to permit the recovery of such stacked semiconductor devices 102 even in the presence of a faulty or defective TSV 135 embedded within the stacked semiconductor device 102. Statistical analysis reveals that such a repair process is should recover approximately 99.95% of previously unworkable and therefore scrapped product, thus providing a cost savings which far outweighs the additional cost necessary to implement the described methodologies.

Figure 2:
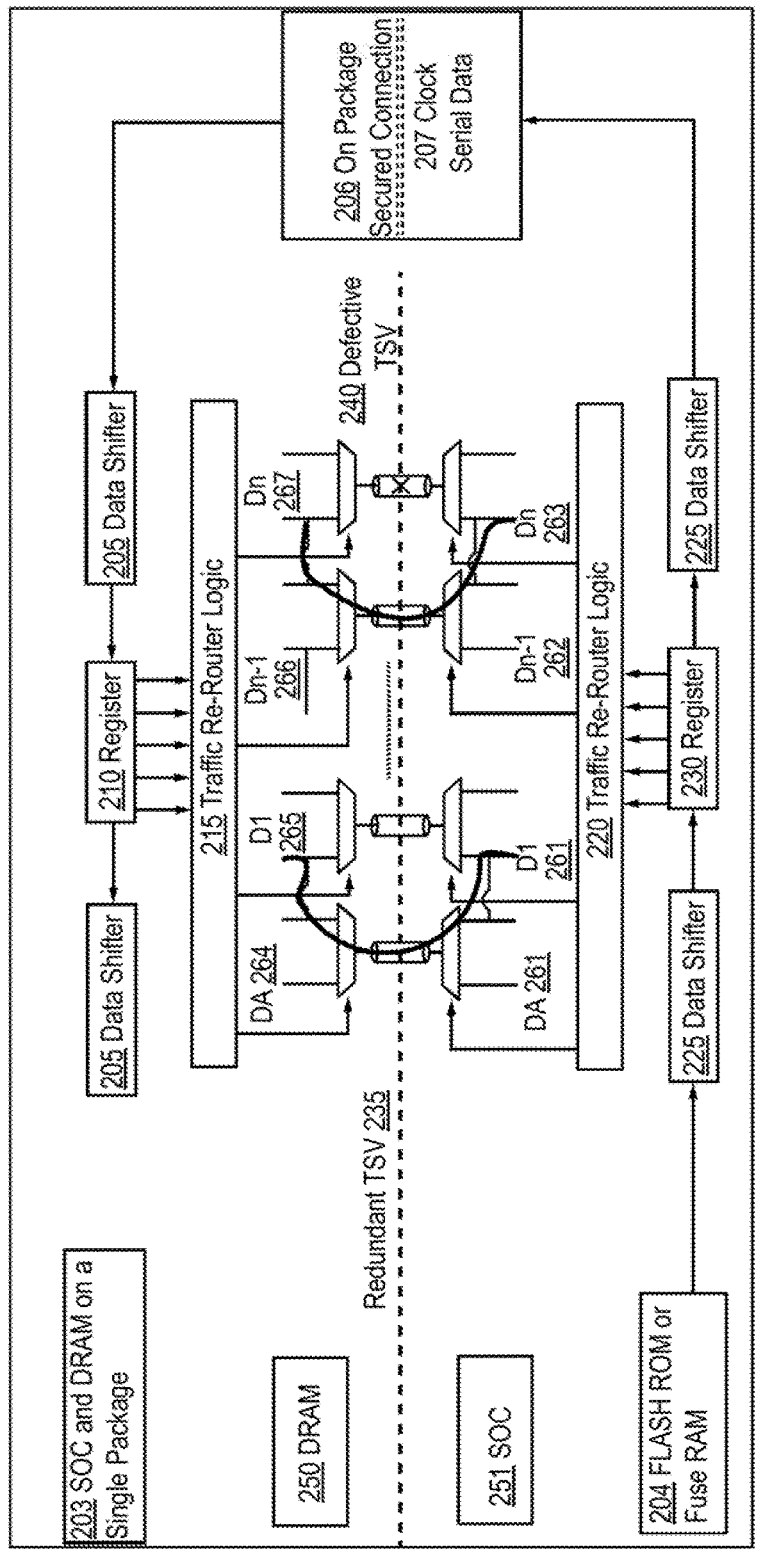
FIG. 2 depicts an exemplary stacked semiconductor device having a faulty or defective TSV identified therein along with a recovery procedure.

FIG. 2 depicts an exemplary stacked semiconductor device 201 having a faulty or defective TSV 240 identified therein along with a recovery procedure.

In particular, there is depicted an SOC and DRAM embodied within a single package 203, thus forming the stacked semiconductor device 201. The top layer is formed by the DRAM 250 which is stacked upon the bottom SOC 251 layer. Multiple TSVs provide interconnectivity from the DRAM 250 on top through the SOC 251 below.

Within the DRAM 250 it may be observed multiple TSVs including the defective TSV 240 on the far right, a redundant TSV 235 on the far left. From left to right, there are TSV connections DA 264 to DA 261 (which forms the redundant TSV 235), then D1 265 to D1 261, then Dn-1 266 to Dn-1 262 and finally Dn 267 to Dn 263 (which is the identified defective TSV 240).

Although four such TSVs are depicted here for the purposes of illustration, there may be and very likely will be many more TSVs for any given stacked semiconductor device 201.

Additionally depicted are the top traffic re-router logic 215 of the DRAM 250 and the bottom traffic re-router logic 220 of the SOC 251. An on-package secured connection 206 and clock serial data 207 are additionally provided.

The FLASH ROM or fuse RAM 204 is shown flowing to data shifter 225, to register 230, to data shifter 225, to the clock serial data 207 to the on package secured connection 206 and then around to the upper layer's data shifters 205 and registers 210. The registers 210 of the top layer and the registers 230 of the bottom layer are communicably interfaced with the traffic re-router logics 215 and 220 respectively.

It is therefore in accordance with described embodiments that a variety of algorithms and low cost hardware DFX infrastructure (DFX is "Design for X" or "Design For Excellence" in the context of manufacturing).

According to a particular embodiment, having identified a defective TSV 240 a "traffic detour string" is calculated to determine detour routes which permit the traffic from the upper layer DRAM 250 to be re-routed or detoured through one or more redundant TSVs 235.

For instance, on every cold-boot of the stacked semiconductor device the traffic detour string is downloaded from a fuse bank or the registers 230 on the SOC 251 side where a CPU resides. According to such an embodiment, a secure link is then established from the SOC 251 layer to the DRAM 250 layer through the data shifters 225 and 205 as depicted the on package secured connection 206.

For instance, utilizing a built-in safe network from a CPU of the SOC 251 the stacked DRAM 250 module the traffic-detour string is then shifted into the DRAM 250 module. Once the traffic-detour string is received at the DRAM 250 the data shifters 205 of the DRAM 250 may then program the registers 210 of the DRAM to enable the data shift or the data detour based on the received and previously computed traffic detour string.

According to a particular embodiment, the introduction and inclusion of as few as 192 storage bits via the registers 210 and 230 it is then possible to recover the yields from previously scrapped stacked semiconductor devices 201 having faulty or defective TSVs 240 by up to 99.95%.

According to particular embodiments, third party DRAM vendors (e.g., providing DRAM 250 module embedded with a stacked semiconductor device 201 by the manufacturer of the CPU and SOC 251) incorporate the register 210 storage bits via their own manufacturing processes, thus embodying the needed registers 210 and data shifter 205 logic within their devices at very little cost and effort pursuant to provided technical specifications as provided by the manufacturer of the CPU, SOC 251, and resulting stacked semiconductor device 201.

Additionally, utilizing a 2-wire interconnect within the stacked semiconductor device 201 the on package secured connection 206 is embodied within the stacked semiconductor device 201 capable of transferring the TSV detour string from the SOC 251 die fabricated and manufactured by a first manufacturer to the DRAM 250 or other memory device, even when manufactured by another third party manufacturer.

According to such embodiment, a 2-wire interface is provided within the stacked semiconductor device 201 thus permitting on package secure connections from the SOC 251 to the DRAM 250. According to such an embodiment, a mirrored image of the TSV detour string from the SOC 251 is transmitted to the third party manufacturer supplied DRAM 250 silicon module that is integrated the final stacked semiconductor device 201 end product.

No prior solutions for TSV repair are available to the marketplace presently.

Because the dedicated two wires are embedded within the stacked semiconductor device 201 to transfer the data from SOC 251 die to the DRAM 250 die, any signals transmitted thereupon simply cannot be intercepted by any hackers as there is no externally facing interface. Thus, it is not possible for hackers to derive any data flow transferred into the DRAM or even derive whether the signal traverses its intended TSV or a redundant TSV. Moreover, the re-routing capability is configurable on a per-unit basis for each stacked semiconductor device 201 manufactured, thus permitted extensive flexibility within a High Volume Manufacturing (HVM) environment. Such flexibility is needed as defects and faults may arise as random anomalies thus necessitating different routing schemes for any particular device. Because every stacked semiconductor device 201 unit manufactured may be programmed differently, it is possible to fully recover any device having a single TSV failure where just one redundant TSV is provided. Additionally, due to the very low memory requirements (e.g., as few as 192 bits of register storage) the solution also represents a very low cost to third party DRAM 250 vendors which provide additional dies to the manufacturer of the CPU and SOC 251 die who also integrates and manufactures the stacked semiconductor device 201.

According to a particular embodiment, implementing the TSV signal re-routing includes first identifying any defective micro pillars associated with the TSVs in any stacked semiconductor device 201 manufactured, then computing a detour string through an algorithm that re-routes DRAM address and data signals as described in additional detail below, and then storing the computed detour strings securely within a fuse bank which is not externally accessible. During a cold or warm boot, the stacked semiconductor device 201 then downloads its re-routing string and shifts the string from the SOC 251 die to one or more upper memory DRAM 250 dies which each then securely store the re-routing string within their fuse banks so as to implement the needed TSV path re-routing during operation.

Figure 3:
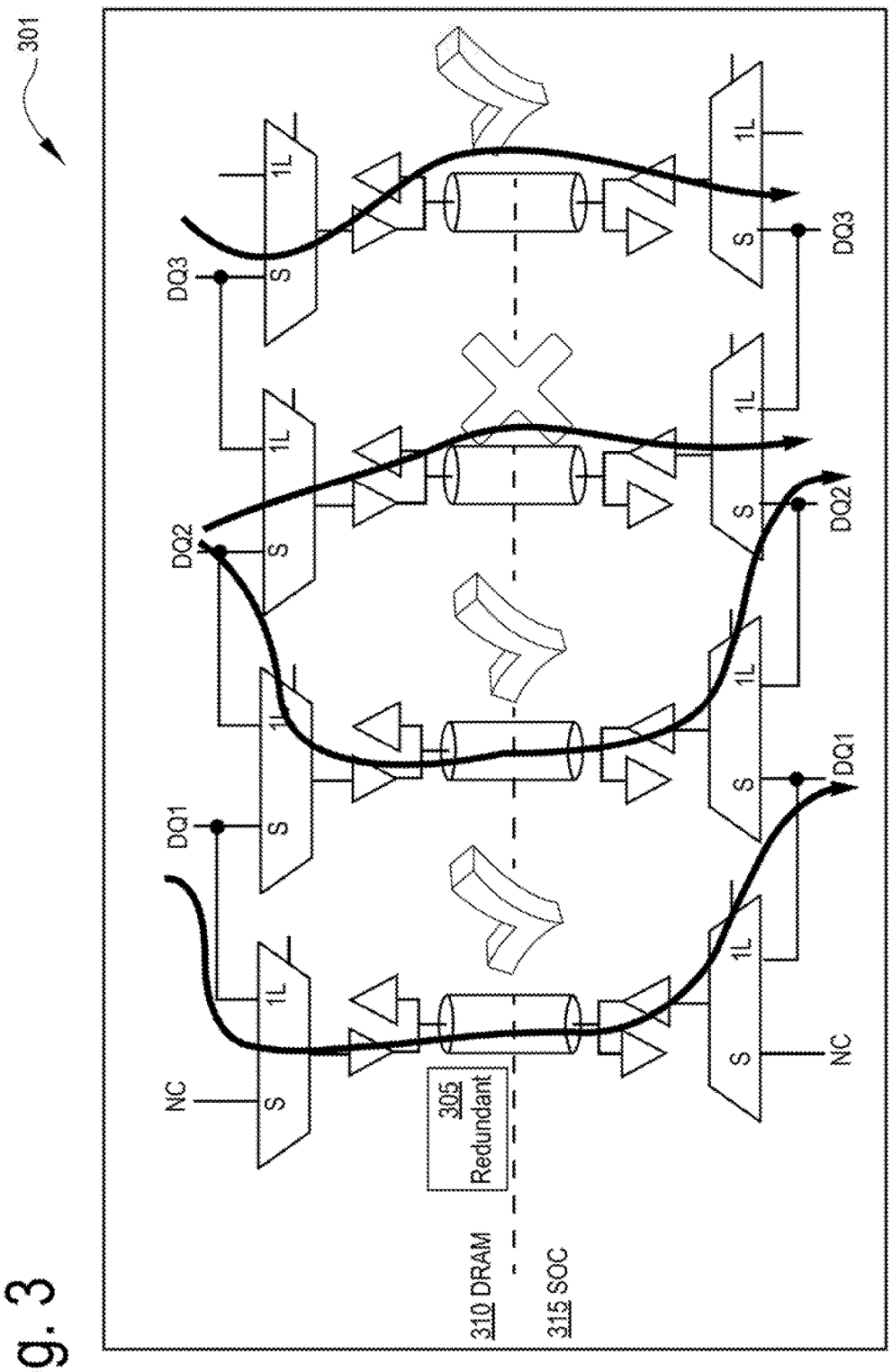
FIG. 3 depicts another exemplary stacked semiconductor device having a faulty or defective TSV identified therein along with a recovery procedure.

FIG. 3 depicts another exemplary stacked semiconductor device 301 having a faulty or defective TSV 240 identified therein along with a recovery procedure.

As depicted here, TSV pillar DQ2 is defective and a corresponding re-routing of the traffic is therefore shown with the traffic re-routing constituting a shift by 1 in this specific example. In this scheme the signal intended for TSV pillar DQ2 is routed through the DQ1 TSV pillar and the signals destined for TSV pillar DQ1 are re-routed to proceed through redundant pillar. Accordingly, in a non-defective mode, the re-routing string for this particular example would be "0000" as there would be no need to re-route when non-defective, however, because TSV pillar DQ2 is identified as defective, the re-routing string "1100" is utilized to cause the mux (multiplexer) to select the appropriate routes to detour traffic from the DRAM 310 side and the CPU or SOC 315 side.

In greater specificity, there is shown a stacked semiconductor device 301 having, by way of example, the four TSV pillars, three of which are needed for routing signals, and one of which is a redundant 305 TSV pillar through which signals or traffic between the two dies formed from the DRAM 310 and SOC 315 may be re-routed or detoured if necessary, such as in the event of an identified defective TSV pillar within the stacked semiconductor device 301.

As depicted here, the stacked semiconductor device 301 includes both a DRAM 310 module formed from the upper functional silicon die (here a memory die) and also a SOC 315 formed from the lower functional silicon die (here a CPU or logic die).

From the left to right, the left most TSV pillar forms a redundant 305 TSV pillar meaning that if all of the TSV pillars are fully functional, the left most redundant 305 will not be needed and will therefore be embedded within the stacked semiconductor device 301 but simply will not be used. However, there is depicted here a functional redundant 305 TSV pillar at the far left (TSV pillar NC), with another functional TSV pillar at the second from the left (TSV pillar DQ1), and then a faulty TSV pillar third from the left (TSV pillar DQ2), and finally another functional TSV pillar on the far right (TSV pillar DQ3).

Notably, each TSV pillar is connected with a mux and de-mux (decoder or demultiplexer), permitting both S and 1L signal routes at each potential TSV path, though only one is used for any TSV pillar, whether functional or not. Rather than a straight fixed path, embodiments as described herein permit any signal destined to traverse a specified TSV pillar to either traverse the intended TSV pillar or to be re-routed or detoured through another TSV pillar. In such a way, where a defective TSV pillar is identified as is the case with TSV pillar DQ2, the signal may be re-routed or detoured through the neighboring TSV pillar.

As shown here, the rightmost signal traverses its specified and intended TSV pillar, going from DQ3 through signal path S down through TSV pillar DQ3 and received at signal path S. This is normal and intended behavior.

However, TSV pillar DQ2 is identified as a defective TSV pillar, and the signal path simply cannot be routed through the TSV pillar. Any signal routed from DQ2 at the DRAM 310 side through signal path S to signal path S of DQ2 at the SOC 315 side will fail.

Consequently, the signal path is re-routed instead to the neighboring TSV pillar, thus causing the signal intended for DQ2 to travel through DQ1 instead. Therefore, the signal to travel through DQ2 is re-routed or detoured to travel instead through signal path 1L of DQ1, the neighboring TSV pillar at the DRAM 310 side and through TSV pillar DQ1 to signal path 1L of TSV pillar DQ1 at the SOC 315 side.

However, TSV pillar DQ1 can only carry a single signal and therefore, because its signal path has been consumed by its neighbor, it cannot carry its own intended signal. Therefore, the data shifter as programmed via the registers (refer to FIG. 2) re-routes the signal destined for DQ1 to its neighbor, thus causing the signal intended for DQ1 to re-route through signal path 1L of TSV pillar NC at DRAM 310 through TSV pillar NC (e.g., the redundant TSV pillar) down to signal path 1L at TSV pillar NC (e.g., the redundant TSV pillar) at the SOC 315 side.

Because any signal may be sent down either one of the two available paths using the provided muxes (multiplexers) it is therefore possible to logically re-route the path taken by any signal through the available TSVs, including detouring or re-routing the signals as necessary to avoid a defective TSV and instead route through a functional neighboring TSV. By then shifting each signal path to its neighbor the faulty TSV may be avoided completely. The continuous shifting will eventually reach an edge or a last available TSV which is then routed to a neighboring redundant TSV whose function is not needed when all TSVs are functional but whose functionality may be leveraged for a repair and re-routing procedure where a faulty TSV is identified.

The calculated routing string calculated is burnt into a fuse bank so that it may be subsequently read out on any cold or warm boot procedure, after which that routing string is then propagated through the layers (e.g., the multiple semiconductor dies of the stack) such that every layer is instructed how to route signals through the available TSVs, whether through a default route (e.g., a 0 in the string) or a non-default route (e.g., a 1 in the string).

Having determined the value of the routing string to fix any particular semiconductor stack and having propagated the string, the data shifters then route the signals as appropriately by muxing any given signal to either a default or non-default path, as necessary, so as to permit the signal to traverse through the TSV pillars to its intended destination, notwithstanding the presence of a faulty TSV pillar.

According to described embodiments, determining whether a faulty TSV is present in the stacked semiconductor device, calculating the re-routing string, and burning the re-routing string permanently into the fuse bank occurs only once at the time of manufacture of that stacked semiconductor device. Conversely, downloading the re-routing string, propagating it to the other layers of the stacked semiconductor device and performing the data/signal shifting via the available muxes at each TSV pillar occurs at every cold boot and potentially at every warm boot.

According to one embodiment, the fuse bank includes a plurality of fuses which are burnt in on the CPU or SOC die side at the time of manufacture of the stacked semiconductor device and cannot be modified subsequently. Consequently, the stacked semiconductor device will operate in accordance with the determined re-routing procedure and the calculated re-routing string permanently from then forward since the burnt fuses cannot be modified.

Therefore, according to a particular embodiment, processing at the time of manufacture includes first, determining that a faulty TSV is present within the stacked semiconductor package and then computing the necessary re-routing string to fix or re-route signals around the faulty TSV, and then burning that re-routing string into the fuse bank (and optionally testing to verify the re-routing string solves the problem) after which the configuration of that stacked semiconductor device is permanent and cannot be modified. Therefore, subsequent resets of the stacked semiconductor device, even a cold reboot, will then cause the device to download or read the re-routing string from the registers of the fuse bank and then shift that string through the stacked semiconductor device's various layers, causing the stacked semiconductor device to shift its signals according to the re-routing string.

Figure 4:
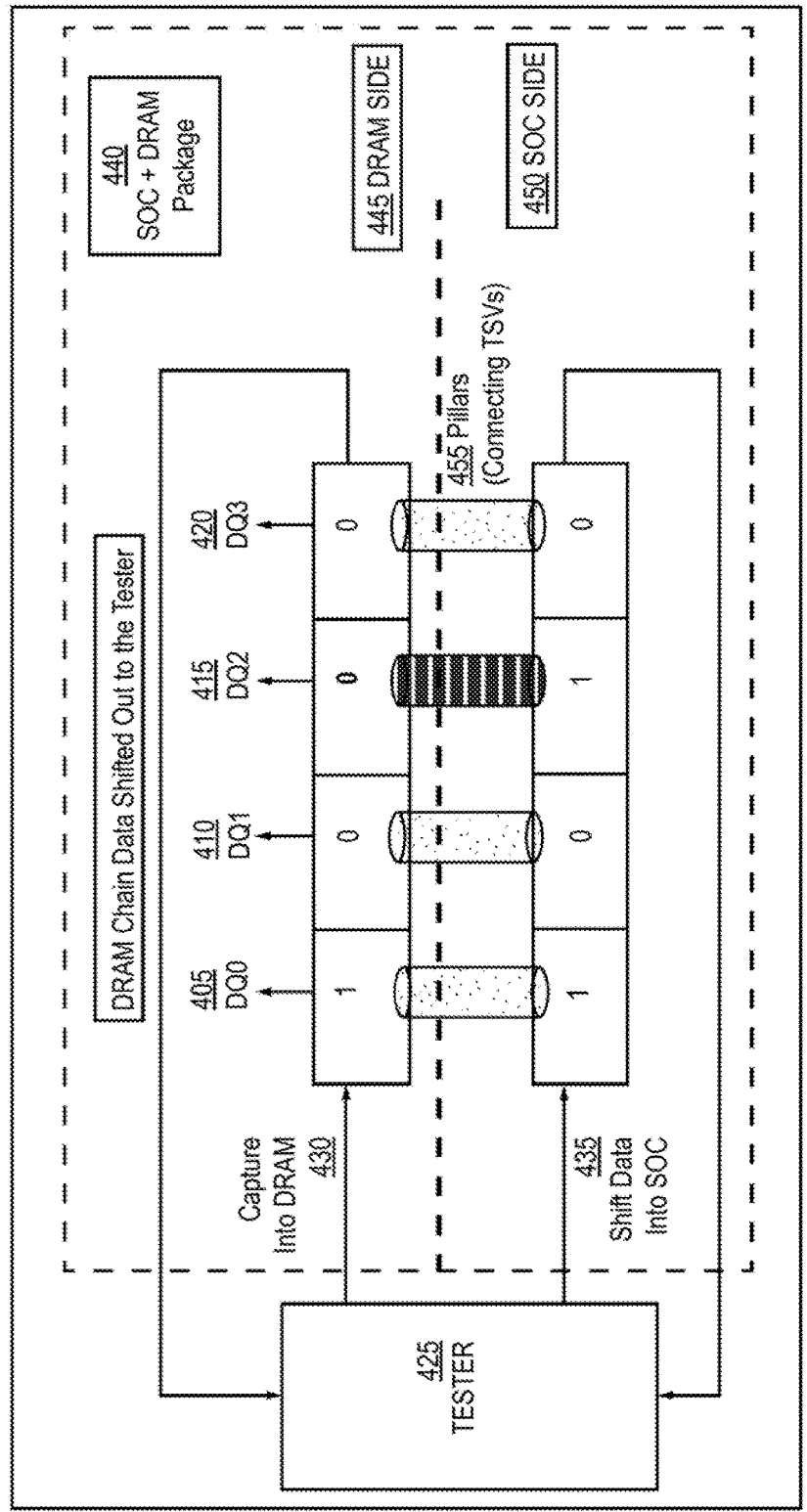
FIG. 4 depicts another exemplary stacked semiconductor device having a faulty or defective TSV in accordance with described embodiments.

FIG. 4 depicts another exemplary stacked semiconductor device 401 having a faulty or defective TSV 415 in accordance with described embodiments. Here, a faulty or defective TSV 415 is identified by an external tester which shifts vectors into the SOC and reads the capture data from the DRAM chains as depicted.

For instance, according to a particular embodiment, each of the captured bits taken from the DRAM chain data are compared with expected data which was input by the external tester 425 at the SOC side so as to identify which, if any, of the TSVs are associated with a fault and thus requires repair via the data shift and re-routing procedure.

As can be seen here, there is an external tester 425 which is not part of the stacked semiconductor device 401 formed from the SOC and DRAM package 440 which includes at least a DRAM side 445 and an SOC side 450.

The external tester 425 is depicted as inputting shift data into the SOC 435 which is then fed or transmitted through the connecting TSV pillars 455 interfacing the respective DRAM and SOC sides 445 and 450. The data is then picked up and captured into the DRAM at element 430 as shown through the respective TSV pillars (from left to right) DQ0 at element 405, DQ1 at element 410, DQ2 at element 415, and DQ3 at element 420. Ultimately the DRAM chain is data shifted out to the tester where the captured data from the DRAM side 445 may be compared with the shift data 435 input into the SOC side 450, to determine whether or not the current routing configuration is faulty or non-faulty. For instance, if the routing is the default (e.g., routing string 0000 for a four pillar configuration) such that all data paths traverse their originally intended TSV pillars, and the data compare at the tester 425 is acceptable, then it is not necessary to perform a re-routing procedure. However, if the default was previously identified as being faulty and a re-routing procedure thus instituted, then the above procedure can identify whether the re-routing is successful by inputting the shift data 435 at the SOC side 450 to traverse through the TSV pillars to the DRAM side 430 where the DRAM chain data is captured and shifted to the tester 425 for comparison as was done with the default configuration.

If the re-routing is also faulty after a data compare, then the correct routing has not yet been attained and a new routing scheme can be programmed and tested.

According to a particular embodiment, the external tester 425 communicates into the stacked semiconductor device 401 utilizing an inbuilt testing network (bus) of the stacked semiconductor device 401 over which the tester 425 sends/shifts 435 a series of data bits into the SOC chain at the SOC side 450. Next, a control signals from the tester to the DRAM stack captures previously sent data into the DRAM chain. The captured data is then shifted out of the DRAM chain and collected by the tester 425 where it is compared against input values where they are to be the same or against golden values where an expected modification of the values is expected and desirable. In such a way, it is possible to identify whether one of the TSV pillars utilized for the current iteration is faulty because if any of the TSV values are faulty then the external tester 425 will not end up with the correct data, but rather, will have unexpected data which will be revealed as a non-match when the collected values are compared against the input or expected values.

When a fault is identified by the tester 425, a detour (rerouting) pattern is computed to produce a string causing the data shifters of the stacked semiconductor device 401 to bypass a faulty TSV micro-pillar associated.

Figure 5:
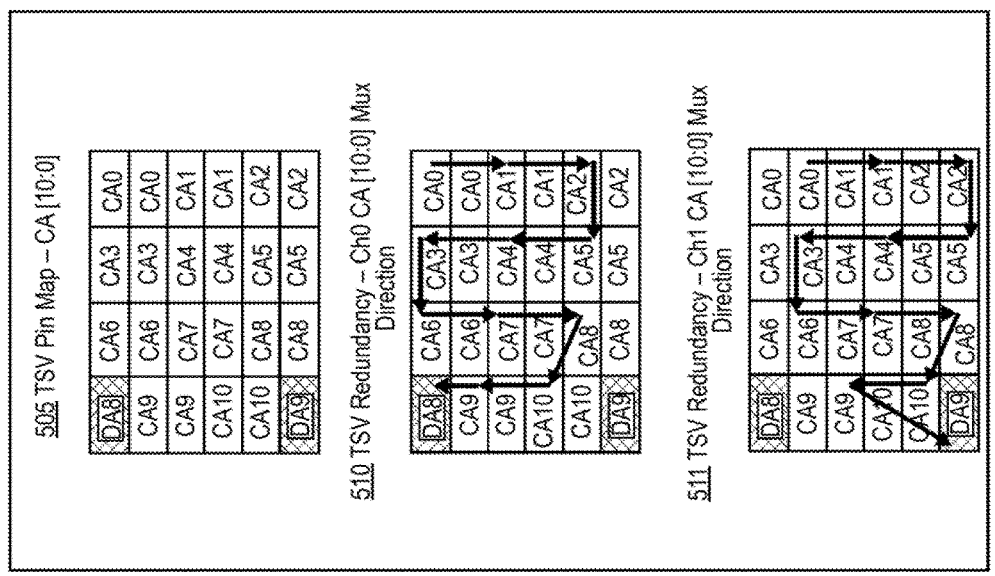
FIG. 5 depicts a TSV pillar re-routing map for two channels of the DDR/DRAM memory address lines, CA[10:0] in accordance with described embodiments.

FIG. 5 depicts a TSV pillar re-routing map 501 for two channels of the DDR/DRAM memory address lines, CA[10:0] in accordance with described embodiments.

In particular, at element 505 a TSV pin map—CA [10:0] is provided, where DA8 on a first channel and DA9 on a second channel provide redundant pillars 504 (e.g., redundant TSVs). TSV Pillars CA0 through CA10 on the first and second channels Ch0 and Ch1 represent normal (e.g., non-redundant or default) address pins 502 and 503 respectively for the first and second channels provided.

At elements 510 and 511 there is a TSV redundancy—Ch0 CA [10:0] Mux direction (element 510) and a TSV redundancy Ch1 CA [10:0] Mux direction (element 511) for the first and second channels. Such a mapping may be utilized for all the data bits as well.

As shown, two redundant TSV pillars are provided, one for each of the two channels, DA8 and DA9. At elements 510 and 511, it may be observed that a defect in Channel 0 necessitates detour or re-routing through the micro TSV pillar DA8 and a defect in channel 1 necessitates detour or re-routing through DA9. Additionally depicted here is the data shift direction in case of a faulty micro TSV pillar at each of the two channels.

FIG. 6 depicts a table 601 which may be used for shifting the address signals for any possible failed lane in accordance with described embodiments.

In particular, there is a Channel 0 CA[10:0] bus lane repair pin mux selection matrix providing the necessary detour encoding 699 beginning with 0h, the mux selects 600 from the shifted-string chain, along with the signal that appears on that lane, in the order of the signals beginning with CA9, and then the various pins, starting with redundant TSV pillar DA8 at column 615, CA9 at column 620, CA10 at column 625, CA8 at column 630, CA7 at column 635, CA6 at column 640, CA4 at column 645, CA5 at column 650, CA5 at column 655, CA2 at column 660, CA2 at column 660, CA1 at column 665, and CA0 at column 670. Such a table may be utilized to compute the re-routing string for the data shifters (e.g., 225 and 205 at FIG. 2) for storage in the device registers (e.g., 210 and 230 at FIG. 2). From the top mux select 600 beginning with 0h, there is shown each of the mux selects for each lane, from 0h mux select 616, 1h mux select 602, 2h mux select 614, 3h mux select 603, 4h mux select 604, 4h mux select 604, 5h mux select 605, 6h mux select 606, 7h mux select 607, 8h mux select 608, 9h mux select 609, Ah mux select 610, Bh mux select 611, and Ch to Fh mux select 612.

The more heavily hashed textured boxes indicate the pins which have been muxed and shifted to the left toward the DA8 pin at column 615. The remaining lighter hashed textured boxes depict those pins which remain un-shifted, that is, they are pins which are not re-routed or detoured.

FIG. 7 depicts an exemplary process flow 701 implementing a detour fuse downloading and distribution 705 scheme in accordance with described embodiments.

In particular, it may be observed within the provided detour fuse downloading and distribution 705 scheme that there is an SOC side of the TSV detour at block 740 and also a DRAM TSV repair 725 block having therein the detour registers. According to a particular embodiment, processing includes uploading the detour strings into the secured Fuse RAM 710 as depicted by the SBR transmission 715 from the SOC side TSV repair registers 720. Once the detour string is securely stored into a fuse bank or the Secure fuse Bank Registers (SBR) then on any cold boot, the previously stored string is downloaded through the side band network from the fuse RAM into the registers and into the SOC side logic. On a warm boot or warm (non-power loss or low-power mode transition) reset where the DRAM loses the value another transfer is triggered on the SOC side 740 to again download the re-routing string into the DRAM. The depicted FSM (Finite State machine) 745 takes the downloaded re-routing string and transmits it as clock 730 and serial data 735 onto a two wire bus into the DRAM to carry out the DRAM TSV repair 725 (e.g., to enable the re-routing at operation or run-time).

In accordance with one embodiment, propagating the re-routing string includes propagating a binary string of 0's and 1's to the muxes present at each TSV pillar causing the muxes to route signals down one of two paths in accordance with the re-routing string's bit (e.g., 1 or 0) at the position corresponding to that mux.

According to one embodiment, the re-routing string is propagated from the SOC die to one or more memory dies present within the stacked semiconductor device via a secure onboard side band channel. For instance, consider that 50 bits are required to represent the full re-routing string for a particular stacked semiconductor device. Rather than having 50 wires to transmit the entire string in parallel which would be very fast but extremely costly, two connecting wires are utilized for the secure onboard sideband channel through which the SOC die will transmit the entirety of the re-routing string via a serial data 735 transmission, one bit at a time, over 50 clock cycles for the exemplary 50-bit string.

Figure 8:
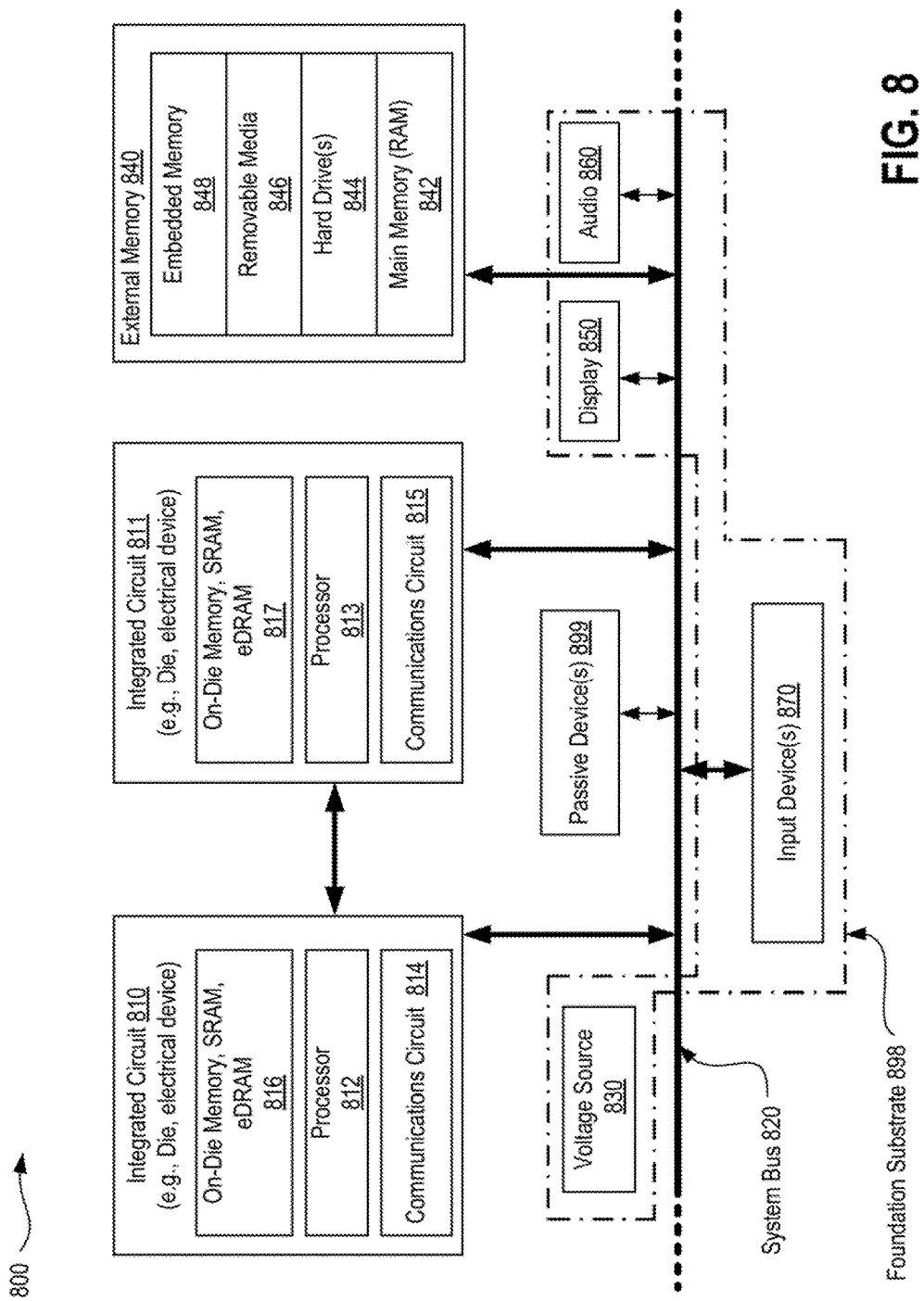
FIG. 8 is a schematic of a computer system in accordance with described embodiments.

FIG. 8 is a schematic of a computer system 800 in accordance with described embodiments. The computer system 800 (also referred to as the electronic system 800) as depicted can embody means for implementing die recovery in Two-Level Memory (2LM) stacked die subsystems, according to any of the several disclosed embodiments and their equivalents as set forth in this disclosure. The computer system 800 may be a mobile device such as a net-book computer. The computer system 800 may be a mobile device such as a wireless smart phone or tablet. The computer system 800 may be a desktop computer. The computer system 800 may be a hand-held reader. The computer system 800 may be a server system. The computer system 800 may be a supercomputer or high-performance computing system.

In accordance with one embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

Such an integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, electrical devices having gradient encapsulant protection, as disclosed herein.

In accordance with one embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In accordance with one embodiment, the integrated circuit 810 is complemented with a subsequent integrated circuit 811. Useful embodiments include a dual processor 813 and a dual communications circuit 815 and dual on-die memory 817 such as SRAM. In accordance with one embodiment, the dual integrated circuit 810 includes embedded on-die memory 817 such as eDRAM.

In one embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In accordance with one embodiment, the electronic system 800 also includes a display device 850 and an audio output 860. In one embodiment, the electronic system 800 includes an input device 870 such as a controller that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including means for implementing die recovery in Two-Level Memory (2LM) stacked die subsystems into a semiconductor substrate package, according to any of the several disclosed embodiments and their equivalents, an electronic system, a computer system, one or more methods of fabricating an integrated circuit, and one or more methods of fabricating an electronic assembly that includes a package substrate or a semiconductor package having therein means for implementing die recovery in Two-Level Memory (2LM) stacked die subsystems, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and semiconductor packages having means for implementing die recovery in Two-Level Memory (2LM) stacked die subsystems and semiconductor substrate package embodiments and their equivalents. A foundation substrate 898 may be included, as represented by the dashed line of FIG. 8. Passive devices 899 may also be included, as is also depicted in FIG. 8.

Figure 9:
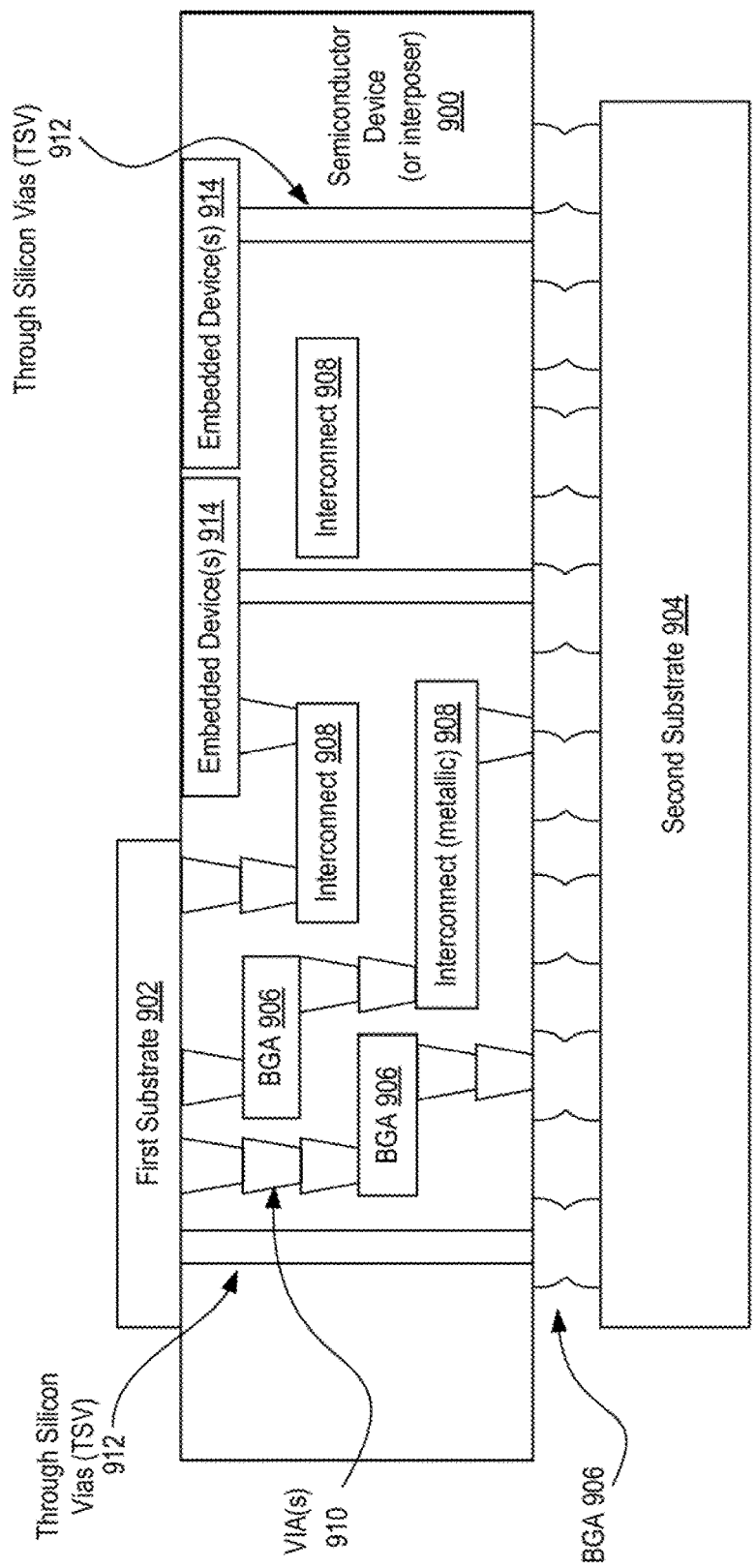
FIG. 9 illustrates an interposer that includes one or more described embodiments.

FIG. 9 illustrates an interposer 900 that includes one or more described embodiments. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with described embodiments, apparatuses or processes disclosed herein may be used in the fabrication of interposer 900.

Figure 10:
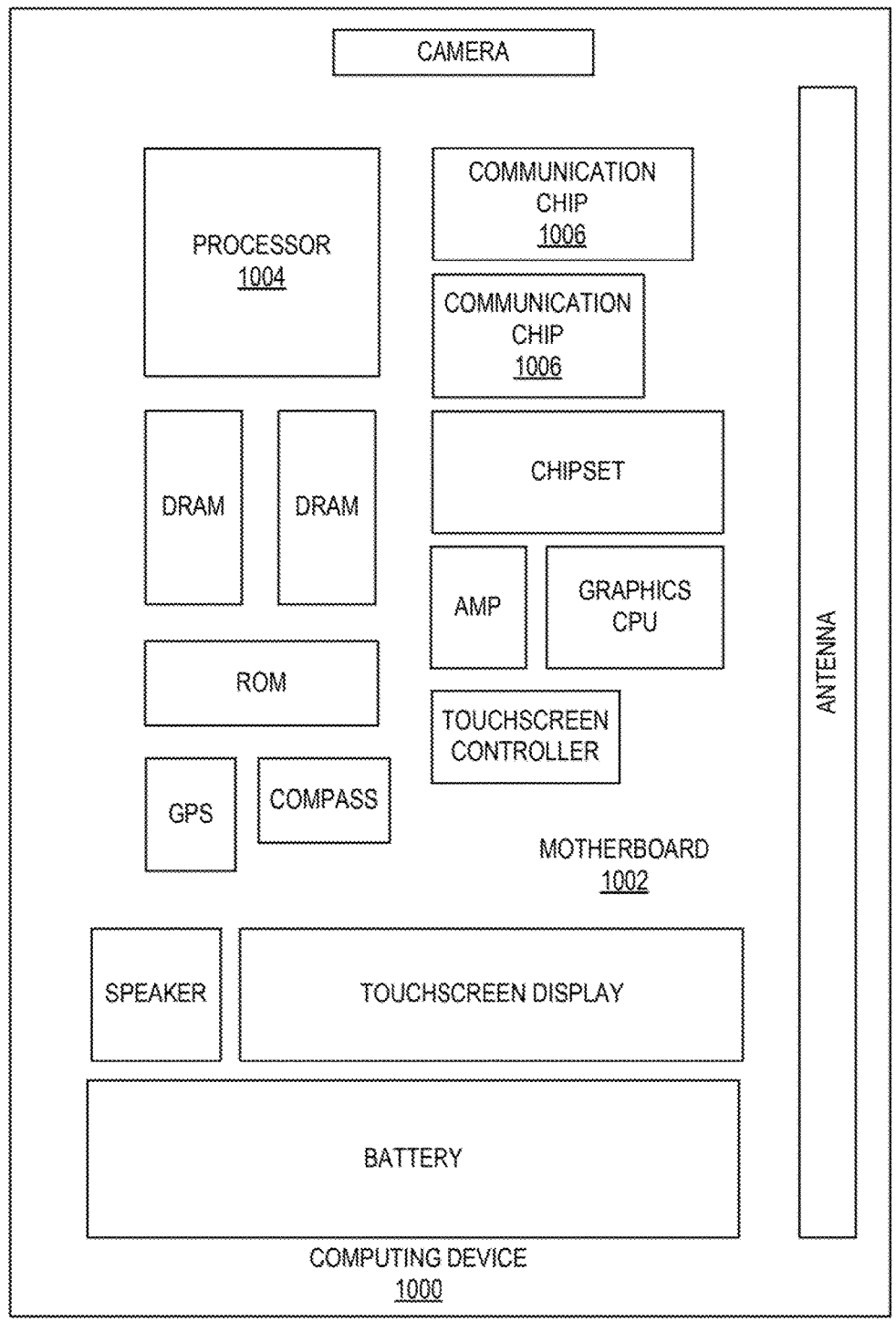
FIG. 10 illustrates a computing device in accordance with one implementation of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as MOS-FET transistors built in accordance with implementations of the invention.

In further implementations, another component housed within the computing device 1000 may contain an integrated circuit die that includes one or more devices, such as MOS-FET transistors built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
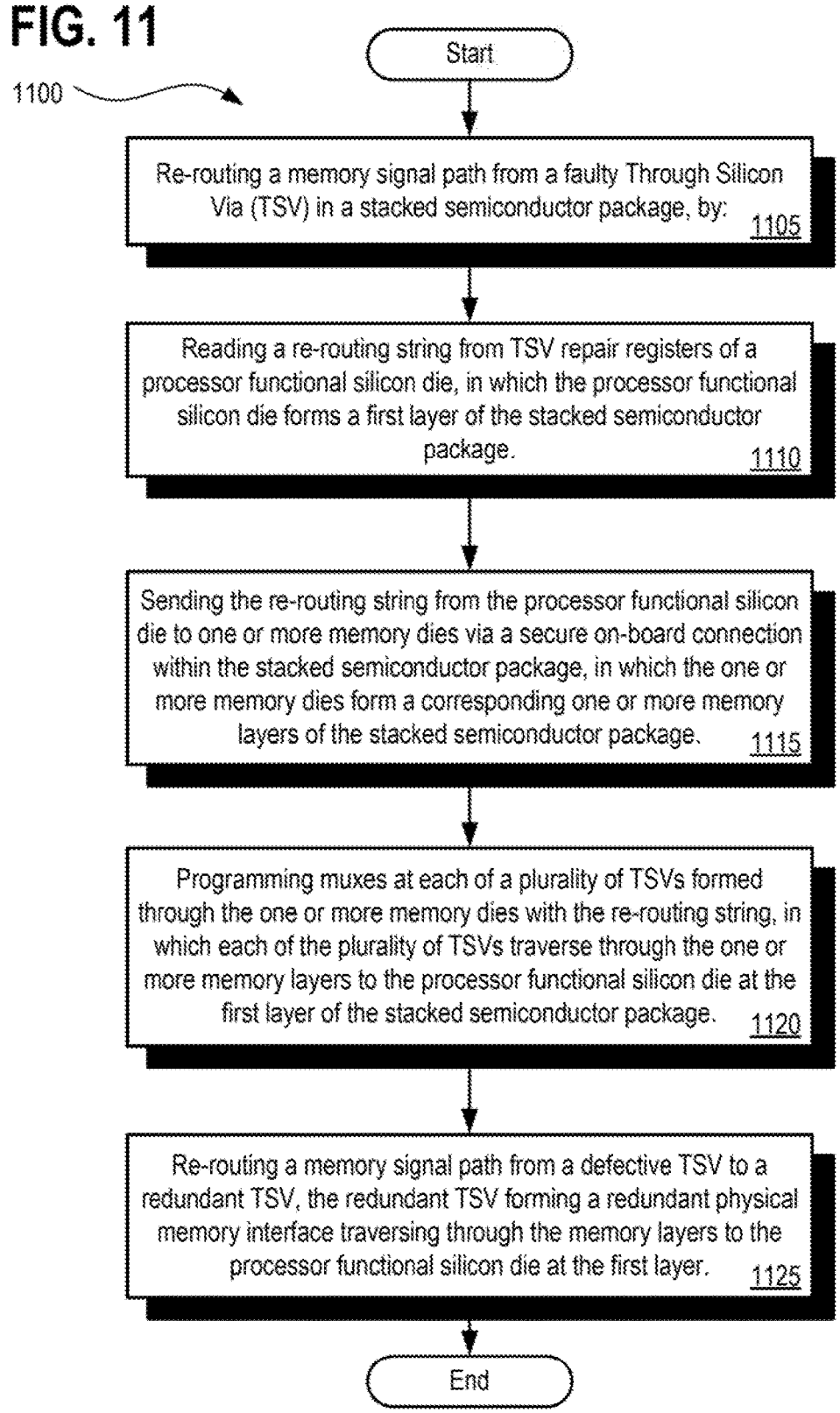
FIG. 11 is a flow diagram illustrating a method for implementing die recovery in Two-Level Memory (2LM) stacked die subsystems in accordance with described embodiments.

FIG. 11 is a flow diagram illustrating a method 1100 for implementing die recovery in Two-Level Memory (2LM) stacked die subsystems in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 1100 may be utilized in a variety of combinations.

At block 1105 the method 1100 for re-routing a memory signal path from a faulty Through Silicon Via (TSV) in a stacked semiconductor package begins with:

At block 1110 the method includes reading a re-routing string from TSV repair registers of a processor functional silicon die, in which the processor functional silicon die forms a first layer of the stacked semiconductor package.

At block 1115 the method includes sending the re-routing string from the processor functional silicon die to one or more memory dies via a secure on-board connection within the stacked semiconductor package, in which the one or more memory dies form a corresponding one or more memory layers of the stacked semiconductor package.

At block 1120 the method includes programming muxes at each of a plurality of TSVs formed through the one or more memory dies with the re-routing string, in which each of the plurality of TSVs traverse through the one or more memory layers to the processor functional silicon die at the first layer of the stacked semiconductor package.

At block 1125 the method includes re-routing a memory signal path from a defective TSV to a redundant TSV, the redundant TSV forming a redundant physical memory interface traversing through the memory layers to the processor functional silicon die at the first layer.

Figure 12:
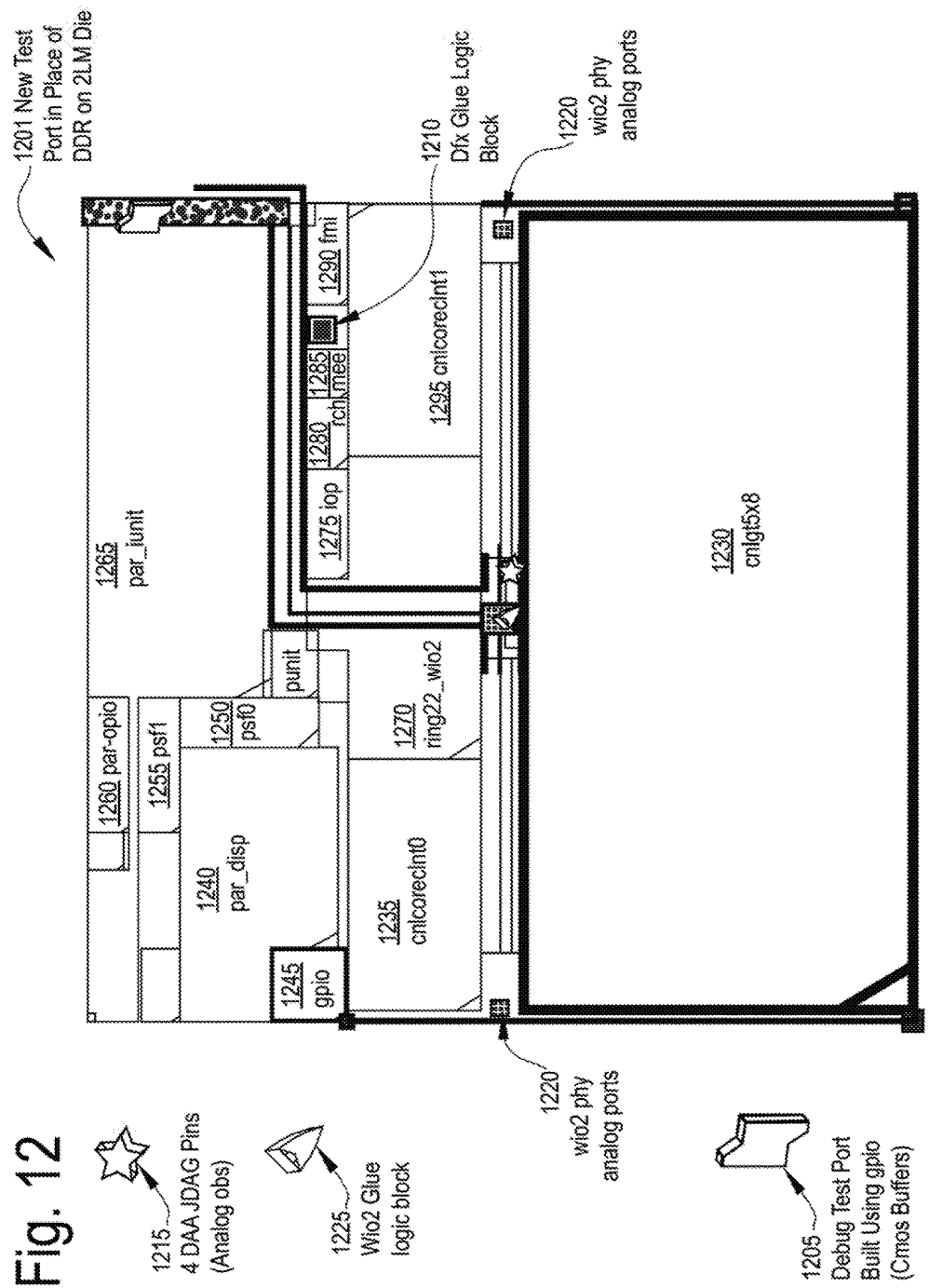
FIG. 12 depicts test ports positioned in place of external DDR memory on a 2LM die stack in accordance with described embodiments.

FIG. 12 depicts test ports positioned in place of external DDR memory on a 2LM die stack in accordance with described embodiments.

As discussed above, because the stacked memory dies are attached to the CPU die or an SOC-die such as that which is depicted at FIG. 1B, element 105, a single defective TSV or "via" can render an entire 3D stacked die package inoperable, thus representing a very large cost to the manufacturer in terms of scrap, which in turn translates to higher cost to the customer and reduced profitability for the company manufacturing such devices.

As discussed above, by providing a redundant TSV through the die stack it is possible to re-route signals and communications around a defective TSV and through a redundant TSV within the manufactured die stack. However, so as to perform the requisite repair it is first necessary to identify a defective via or TSV within the die stack.

By incorporating the new test port 1201 into the architecture of the functional silicon die it is possible to perform a variety of tests through which a defective TSV in a 3D stacked die package may thus be identified and ultimately repaired via the re-routing scheme described above.

As can be seen at the upper right hand side of the diagram, a new test port 1201 is provided in place of the DDR memory on a 2LM die stack according to described embodiments. It is through this new test port 1201 that such testing may be performed, for instance, by issuing instructions, test packages, test signals, as well as capturing and receiving signal signatures and test results through the interface provided by way of the new test port 1201.

Further depicted are par-ipio 1260, par_iunit 1265, PSF1 1255, PSF0 1250, par_disp 1240, General Purpose Input/Output (GPIO or gpio) 1245, iop 1275, rch 1280, mee 1285, Dfx (Design for x) glue logic block 1210, FMI 1290, ring22_wio2 1270, cnlcoreclnt0 1235, cnlcoreclnt1 1295, Wide Input/Output 2 for DDR memories (WIO2 or wio2) physical analog ports 1220 cnlgt5×8 1230, 4 DAA JDAG (Joint Test Action Group) pins (analog obs) 1215 positioned atop element 1230 as denoted by the star symbol 1215 and the WIO2 glue logic block 1225 also positioned atop element 1230 as denoted by the arrowhead symbol 1225. Element 1205 depicts the debut test port which is built into the architecture utilizing gpio (e.g., cmos buffers).

Wide Input/Output (referred to as Wide I/O or WIO) defines four 128-bit memory channels, providing a 512-bit wide interface to memory with an interface that supports a single data rate of 266M transfers/second and a channel bandwidth of 4.26 GBps, for a total bandwidth of 17 GBps. The follow on to Wide I/O is Wide Input/Output 2 (referred to as Wide I/O 2 or WIO2 or WiO2) and like the original WIO specification, Wide I/O 2 provides a four-channel architecture with a higher bandwidth of 6.4 GBps and 64 I/Os per channel, yielding an overall 25.6 GBps data rate and extendable under the Wide I/O 2 specification to devices having up to 128 I/Os per channel and a data rate of 51.2 GBps. Wide I/O 2 is aimed at high-end mobile applications that require high bandwidth at the lowest possible power.

With respect to the position of the new test port 1201 it is important that logic and routes do not change from die to die as doing so would affect test routing and resulting test signatures. It is therefore in accordance with described embodiments that the new test port 1201 is positioned in the same place as the DDR memory interface so as to ensure consistency from one die to another.

More specifically, the diagram depicts a very high level architecture of an exemplary processor die, chip, or functional silicon die which may be integrated into a 3D stacked die package.

The Wide 102 or WIO2 physical analog ports 1220 on the left and right sides of the diagram provide an JO interface through which DRAM memory will be physically attached to the chip. It is through the WIO2 physical analog ports 1220 that the memory dies within a 3D stacked die package will be physically attached to the chip, thus functionally interfacing the memory dies with the chip, processor, or functional silicon die in accordance with such an embodiment.

At the upper right portion of the chip diagram there is depicted the Dfx glue logic block 1210 which provides a logic interface between the DRAM memory and the chip, processor, or functional silicon die to which the memory dies are attached within the stacked 3D die package.

In order to interface with the memory dies within the stacked 3D die package such that testing may be performed on the TSVs in an effort to identify TSV faults, it is necessary to provide both a physical hardware interface and also a logic interface to the memory dies.

The WIO2 physical analog ports 1220 therefore provide the necessary hardware on the chip and the Dfx glue logic block 1210 provides storage space for the algorithms which will be then utilized to determine if a particular TSV within the memory die stack is defective.

The new test port 1201 at the upper right portion of the diagram further provides a sequence, combination, or group of high-speed buffers capable of transferring data into and out of the particular chip undergoing such TSV testing and fault identification procedures.

For instance, through the new test port 1201 the Dfx glue logic block 1210 may then transmit data at an exemplary rate of 1066 MTS (mega transfers per second) into and out of the memory dies, thus matching the DRAM speed supported by the memory. Other rates may be utilized as well. Regardless, the buffers of the new test port 1201 and the memory dies operate at matching and very high speed.

From the high speed buffers a large volume of data is then transmitted into the WIO2 logic glue logic block 1225 to the memory dies within a 3D stacked die package, with the actual data signals traversing through the WIO2 physical analog ports to the memory as described above.

According to such embodiments, Rcomp support is provided for the GPIO 1245, for instance, an exemplary 87 new GPIO pins may be provided on the platform in support of Rcomp. Such pins may be high-speed pins (e.g., 1066 MTS) and provided with platform routing using a 50 ohm resistor so as to enable GPIO 1245 port functional calls. Overall 50 ohms routing may be provided on such a package as a preferred solution over alternative more costly solutions such as alternative routing, power domains, PCU management, and so forth.

GPIO 1245 implementation on a 2LM die may include the new test port 1201 with support for speeds up to 1066 MTS, an exemplary four DAA analog pins underneath the WIO2 bumps, thus providing 2+2=4 analog pins to monitor WIO2 voltages supported by WIO2 glue logic block 1210 which muxes for incoming and outgoing routes. The DFX glue logic block 1210 is additionally communicably interfaced into the die stack memory controller(s).

Figure 13:
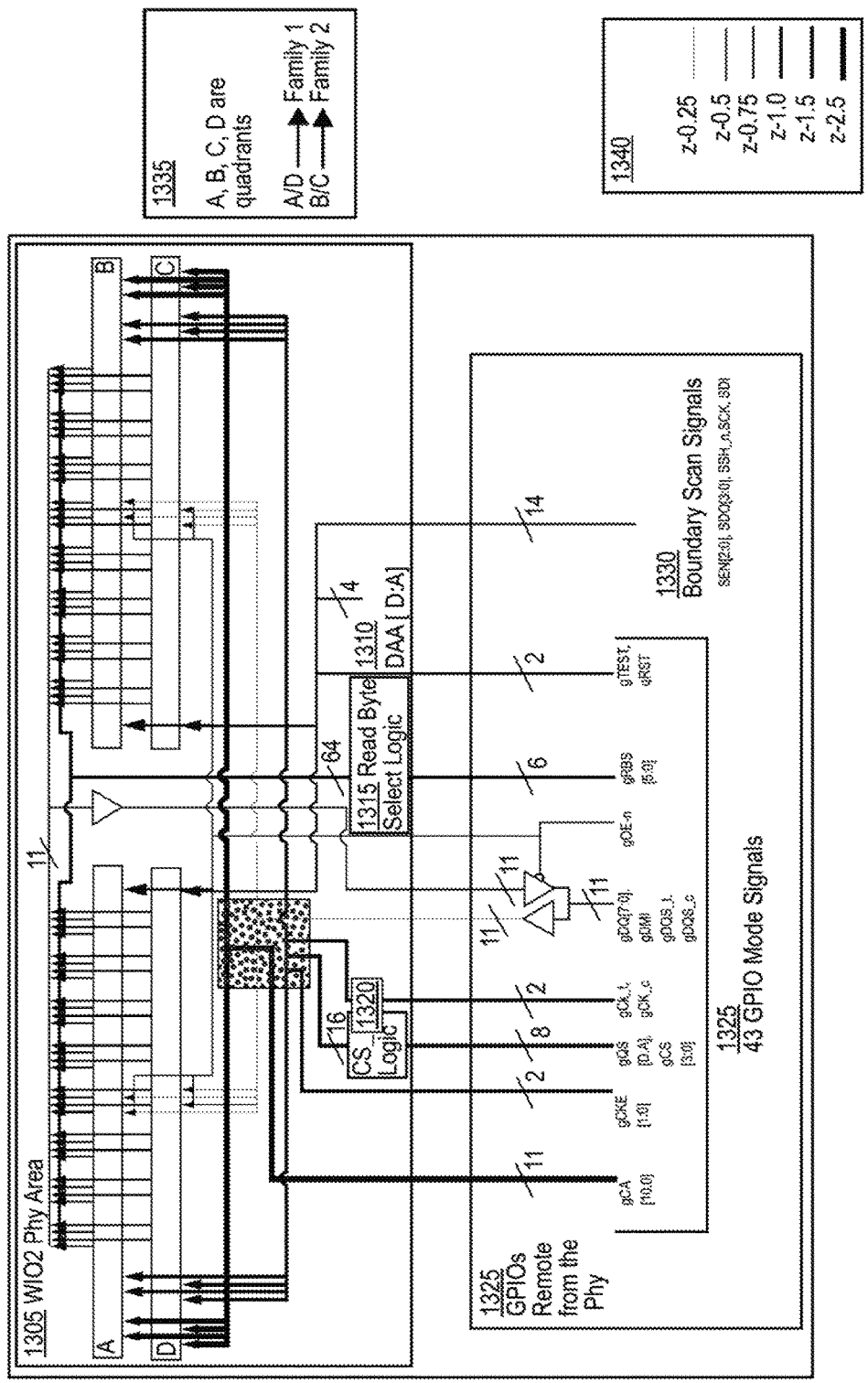
FIG. 13 depicts a WIO2 testing scheme in accordance with described embodiments.

FIG. 13 depicts a WIO2 testing scheme 1301 in accordance with described embodiments.

In particular, there is depicted the WIO2 physical area at element 1305 having therein the four quadrants A, B, C, and D as identified by element 1335, into which quadrants A and D form family 1 and quadrants B and C form family 2. Further depicted within the WIO2 physical area 1305 are the CS logic 1320, DAA [D:A] at element 1310, and the read byte select logic at element 1315.

At the bottom portion of the diagram are the GPIOs 1325, depicted here as being remote from the WIO physical area above. Within the GPIOs 1325 area are boundary scan signals 1330 (e.g., SEN[2:0], SDO[3:0], SSH_n, SCK, SDI) and an exemplary 43 GPIO mode signals as identified by element 1325. The key 1340 depicts various available signal paths, through which there may be muxing between the quadrants 1335 and families. Exemplary WIO2 testing may occur at a speed of @1066 MTS in accordance with described embodiments.

The diagram provides a very close-in view of the WIO2 glue logic block 1225 from FIG. 12 corresponding to where the DRAM is physically connected or soldered within the 3D stacked die package. The buffers described above stream into the WIO2 glue logic block 1225 at the bottom of the diagram via the variously depicted signal paths for routing. Because the DRAM is attached to the WIO2 there are many analog logics and connected to chip bumps that are soldered or otherwise electrically interfaced to the chip. The diagram shown here provides a logical description of the signals as they are connected into the WIO2 physical area 1305.

The diagram further represents a bottom side of a DRAM stacked die and therefore, the bottom of the DRAM is connected to another DRAM by electrically interfacing a first DRAM die as shown here with another DRAM die using the TSVs which traverse entirely through each respective DRAM or memory die. In such a way, each memory dies is connected within the 3D stacked die package, with each DRAM or memory die being connected to the processor die by way of the TSVs traversing each memory die below until the bottom most die layer is reached, corresponding to the chip or functional silicon die at the bottom of the die stack, assuming the functional silicon die resides at the bottom of the die stack. Other configurations are possible.

Figure 14:
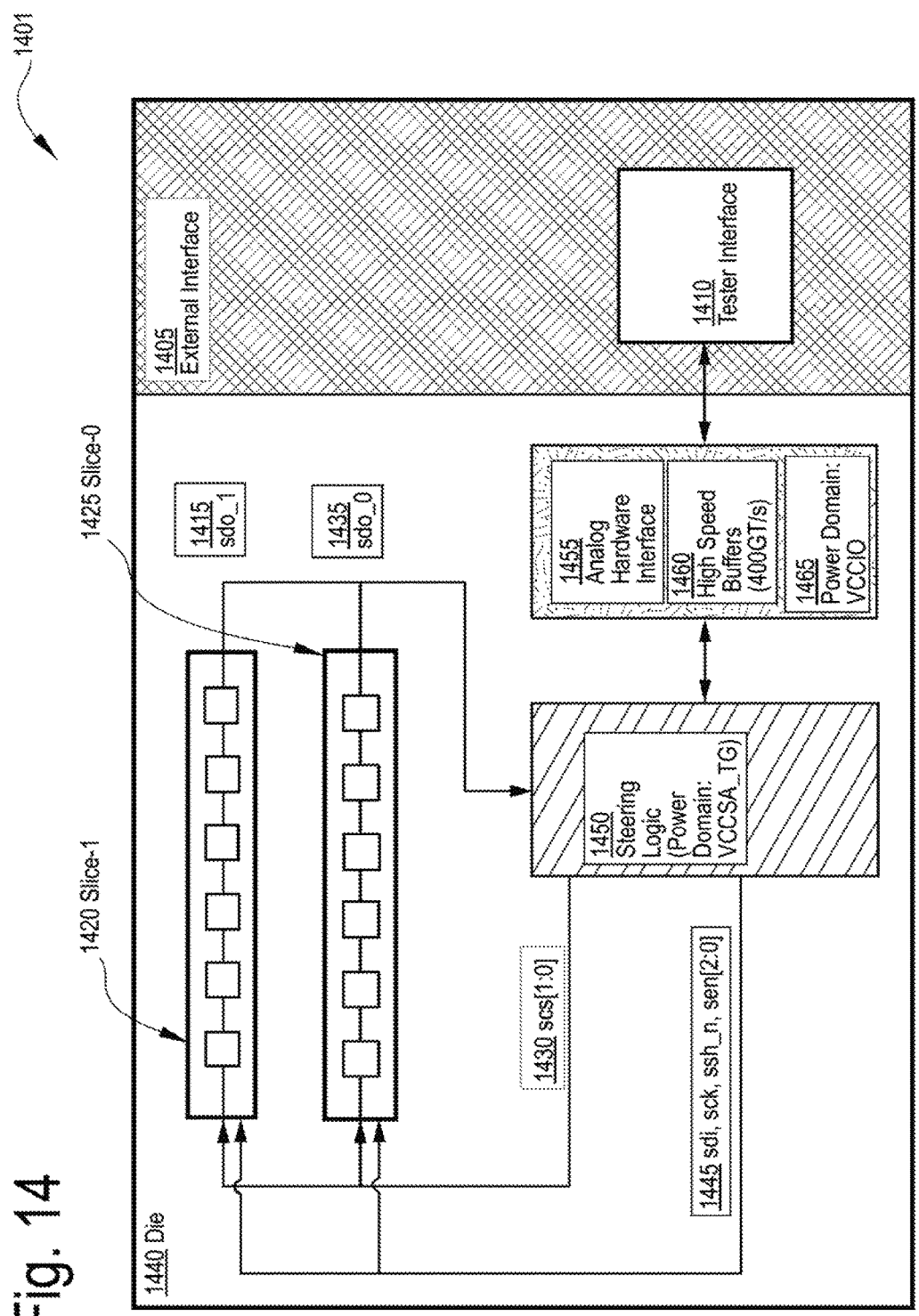
FIG. 14 depicts test port logic steering between slices of a die stack and a tester in accordance with described embodiments.

FIG. 14 depicts test port logic steering 1401 between slices (e.g., slice-1 1420 and slice-0 1425) of a die 1440 stack and a tester 1410 in accordance with described embodiments.

By communicating data between an external tester and the stacked memory dies 1440 using the hardware analog interface 1455 into the memory dies it is possible to send control signals to the memories to determine which of the plurality of TSVs are working or failed. It is then further possible to specifically identify any defective TSVs within the 2LM die package which require repair via the re-routing algorithms described previously.

As depicted here, there are a variety of signals which may be routed, including for example, signal scs[1:0] at element 1430 to select which slice is presently being operated, where 1: represents enabled and 0: represents disabled. Signal sdi at element 1445 provides the input data sent by the tester into the various slices and sck provides a clock signal driven by the tester, in which the clock and data signals (e.g., sdi signal) both travel from the source synchronously. A shift model signal ssh_n at element 1445 provides for shift mode operation in which ssh_n=0 permits shift mode whereas ssh_n=1 corresponds to non-shift mode. Signal sen[2:0] at element 1445 provides a control signal that determines the various operations which are supported by the slices (e.g., slice-1 1420 and slice-0 1425).

An analog hardware interface 1455 provides a set of high speed input/output bidirectional buffers through which to electrically transfer the signals to the external interface 1405. The steering logic 1450 is responsible for steering the logic between the slices (e.g., slice-1 1420 and slice-0 1425) and the analog logic.

Additionally depicted here are the external interface 1405 to the die as well as the tester interface 1410 which in turn is communicably interfaced to the analog hardware interface 1455 as well as the high speed buffers 1460 operating at an exemplary 400GT/s and the power domain:VCCIO 1465. The analog hardware interface 1455 block and its related components are then communicably interfaced with the steering logic 1450 having the power domain:VCCSA_TG therein, which in turn is communicably interfaced with each of the slices (e.g., slice-1 1420 and slice-0 1425) via signals sdo_1 at element 1415 and sdo_0 at element 1435.

The steering logic 1450 provides a logical interface between the memory dies as represented by each of the slices (e.g., slice-1 1420 and slice-0 1425) and the chip or functional silicon die as depicted at FIG. 12 above or FIG. 1B, element 105.

A tester interface 1410 external to the chip provides high speed buffers 1460, represented here within the analog hardware interface 1455 block, which is then interfaced into the high-speed analog logic on the chip as represented by the steering logic 1450.

The steering logic 1450 feeds into each of quadrant A, quadrant B, quadrant C and quadrant D identified by element 1335 at FIG. 13 within the WIO2 physical area 1305 of FIG. 13.

As data arrives at the chip from the tester interface 1410 it is necessary to steer the data toward the Wide IO2 interface and it is the responsibility of the steering logic 1450 to provide such data steering. Through the WIO2 glue logic block (refer to element 1225 of FIG. 12) the steering logic routes the data toward the WIO2 block where the data is then communicated to the memory dies via the various signals show here such as scs[1:0] signals 1430 and sdi, sck, ssh_n, and sen[2:0] signals as depicted at element 1445.

The steering logic 1450 uses this set of signals (1430 and 1445) to steer data to the relevant memory dies as represented here by slices (e.g., slice-1 1420 and slice-0 1425). While only two such slices or memory dies are depicted here, there may be other configurations, such as four slices, six slices, etc., each of which making up part of a 3D stacked die package with memory dies and one or more functional silicon dies or chip/processor dies.

FIG. 15 depicts an exemplary wake-up sequence 1501 of a test port during a power-up sequence in accordance with described embodiments.

As can be seen here, the wake up sequence 1501 includes various signals, including the VCCIO 1505 signal, VCCSA 1510 signal, the xxPwrGood 1515 signal for the deepest power well, a second xxPwrGood b signal at element 1520 for the deepest power well, a VCCSA_Tap_Gate 1525 signal, a VCCSA_Gated_Pwrgood/test port enabled tap signal at element 1530, and lastly the powered in VCCSA signal at element 1535. The term VCC represents power (e.g., such as the integrated circuit (IC) power-supply pin or VCC pin).

From left to right, it may be observed the various states for the above mentioned signals, in which at column 1540, status indicates that SIP may not be powered as well as status of the FIP firewall is indicated by xxPwrGood and xxPwrGood b.

At column 1545, SIP may not be powered and the status of the HIP firewall is indicated by VCCSA_Gated_Pwrgood. At column 1550, status indicates that both SIP and HIP are in full function mode. At column 1555, status indicates that SIP is still powered and HIP now enters park mode. Lastly, at column 1560, status indicates that SIP power is down and HIP is in park mode.

For the purposes of testing it is necessary to power up the 3D stacked die package and critically, the test port and the IO logic (e.g., steering logic) and WIO2 physical interfaces must be powered up before testing may proceed. The wake-up sequence 1501 therefore provides the various phases by which such power-up or wake-up sequence 1501 may be performed.

It is not sufficient to bring up only some components and not others if the will be involved in the transmission or routing of data from the test port to the memory dies through the chip and therefore, the wake-up sequence 1501 ensures that all necessary components are awake and ready (e.g., power is good and status is good) before proceeding with the test sequences by which TSV fault detection may be achieved.

The wake-up sequence 1501, once complete, will report that all powers are good which is communicated via the depicted signals, thus completing the necessary power management operations to bring up the 3D stacked die package.

Once all the signals are received as expected, it can be known to the tester interface (element 1410 at FIG. 14) that the test TO block, the power management, and the various TO interfaces are powered up and ready for test such that all the necessary logic on the chip and memory dies are ready to permit for the transfer of data in and out of the chip pursuant to the test regimes which will be utilized to identify TSV faults within the 3D stacked die package.

Figure 16A:
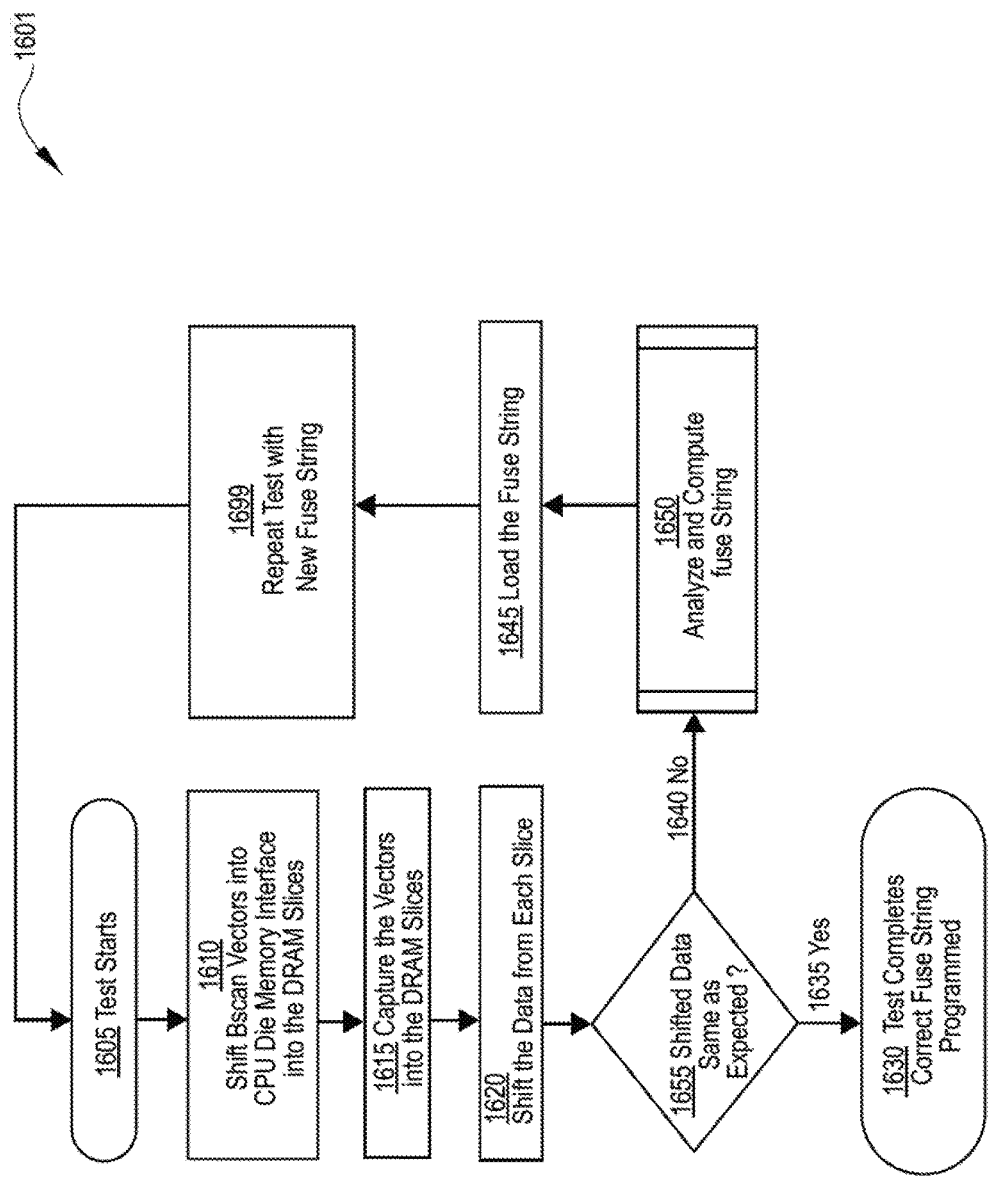
FIG. 16A illustrates an exemplary flow diagram for determining a die pass/fail state and exemplary repair mechanism for a failed die in accordance with described embodiments.

FIG. 16 illustrates an exemplary flow 1601 diagram for determining a die pass/fail state and exemplary repair mechanism for a failed die in accordance with described embodiments.

For instance, the flow diagram 1601 as depicted here shows how an external tester, such as the tester interface depicted at element 1410 of FIG. 14 may interact with the chip or functional silicon die within a 3D stacked die package so as to perform the necessary TSV fault detection testing which includes the transfer of data back and forth all the way along a communications fabric between the tester interface (element 1410 at FIG. 14) and the DRAM memory or memory dies including traversing a path through the chip to which the memories are physically and logically interfaced.

Beginning at element 1605 testing starts and proceeds to block 1610 where processing shifts Bscan vectors into the CPU die memory interface and into the DRAM slices. For instance, utilizing a Bscan protocol, a shift data signal (e.g., sdi signal) is sent along with a clock signal to start shifting the data into the memory dies. Control signals are also utilized to instruct the chip as to the correct path through which to mux the signals onto the memory dies, for instance, specifying which one of a plurality of memory dies are being targeted by the test instruction initiating the data shift sequence as well as what channel or sub-portion or cell of a memory is to receive any given data stream or data elements. For instance, the control signals tell the ship how to shift the data onto the available DRAM or memory die slices. For instance, it may be necessary to mux through TSVs establishing a default path or it may be necessary to mux through an alternate TSV path, such as through redundant TSVs as part of the TSV fault isolation process.

At block 1615, processing captures the shifted Bscan vectors into the DRAM slices or into the relevant memory die slices. For instance, through use of the sen[2:0] signals it is thus possible to manipulate the various available operations, such as start shifting, stop shifting, capture the data, etc., as well as direct the data onto the memory dies or DRAM slices so as steer the data into the correct location, such as a specified one of thousands of permissibly addressable memory cells in fulfillment of the testing sequence.

Subsequent to shifting the data onto the relevant DRAM slices processing at block 1620 then proceeds to shift the data from each slice, thus producing output from the DRAM slices which may be subsequently compared to an expected result to check for correctness.

In particular, decision point 1655 depicts that shifted data is compared to determine if it is the same as the expected data result after having been shifted into, stored by, and shifted out of the DRAM slices. Because the data is shifted into the DRAM slices for storage through a particular TSV and then shifted back out of the DRAM slices through the same TSV, a comparison of the output data against the known input data will reveal any mis-match, this indicating a faulty TSV.

If no 1640, the shifted data output from the DRAM slice results in a mis-match, then processing proceeds to block 1650 for analyzing and computing a corrective fuse string based on the potentially identified TSV fault (e.g., refer to FIG. 5, et seq. above). Processing then proceeds through block 1645 to repeat the test with the new fuse string, returning to the start of test at block 1605.

Conversely, if yes 1635, the shifted data output from the DRAM slice matches the expected result from the known input data, then processing proceeds to block 1630 where testing completes and the correct fuse string is programmed for the TSVs (e.g., refer to FIG. 7, et seq. above).

Each time the data is shifted into a DRAM slice or into one of the targeted memory dies the data must traverse through a particular via or TSV as directed by the control signals under the direction of the external tester interface (element 1410 at FIG. 14). Consequently, when the same data is brought back out, the control signals shift the data out of the same DRAM slice or targeted memory die and causes the data to either traverse again back through the same via or TSV or alternatively return to the tester interface through another path. Regardless of the return route for the data shifted out of the DRAM slice, the data has passed through a known TSV at least once and may therefore be compared against a known good result. For instance, if sequence of one's (e.g., "1111") were shifted into the DRAM slice through the TSVs of the 3D stacked die package and the return data results in "1101" then it is known not only that a fault is present, but it is determinable which TSV caused the fault based on the location of the bit mis-match. Similarly, if a single string is non-deterministic for which of a plurality of TSVs are faulty, then the faulty TSV may be identified through a process of elimination by repeating the test and changing the loaded fuse string until a correct output string is attained.

According to described embodiments, comparing data bits of the output signal with the input signal to and from the DRAM slices involves comparing return signals or captured signatures from the shifting of the vectors out of the DRAM slices pursuant to the test sequence instructions.

According to one embodiment, a signal is captured by logic communicatively interfaced with the memory dies upon shifting data out of the memory dies pursuant to the test instruction and the captured signal is then compared with the known input representing the data shifted into the memory die at the direction of the test sequence.

Take for example selecting a first one of two available memory dies and targeting the TSVs providing electrical connectivity into that first memory die. The test sequence will use the control signals to shift data vectors into the first memory die through the TSVs targeted and then, according to certain embodiments, a logic block at the memory die will capture the output signal as the data is then shifted out of the memory dies. In such a way, it is possible to ensure that a bit flipped from, for example, 0 to 1, is not then re-flipped causing a false pass. Rather, by capturing the data at the memory die as the data vectors are shifted out the signal may be analyzed after passing through the TSVs and stored by the memory dies without having to traverse more of the communication fabric than is necessary. In practice, 1000's of bits of data will be shifted through the TSVs and onto a memory die and then shifted out as output data for analysis and comparison as depicted by decision point 1655.

According to a particular embodiment multiple bits are shifted simultaneously, thus causing bits to traverse through each of the TSVs in parallel. By subsequently comparing the bits it may be determined which one of a plurality of TSVs caused a fault by identifying which of the plurality of bits are changed given that a string of bits will have passed through the plurality of TSVs as an aligned group in parallel, and thus, a bit in a left most position having been flipped will correspond to a TSV at the left most position and so forth. For instance, the memory die slice is known as it is addressable by the control signals, the TSV is known according to the position of the flipped or erroneous bit after comparison, and thus it can be determined which TSV to which memory die is faulty. By repeating the process for all available TSVs to all available memory dies, any faulty TSV may thus be identified and a new corrective fuse string computed (e.g., block 1650) and loaded and verified by then re-test. For instance, the test may progress layer by layer up the 3D stacked die package (e.g., from a first memory die in the stack to a second memory die in the stack to a third memory die in the stack and so on until all are tested) and then analyze, compute, and load a new fuse string and then re-test to verify correct functionality of the 3D stacked die package and its memory dies using the new re-routed TSV paths based on the new fuse string computed after identification of a TSV fault.

Once the 3D stacked die package and its memory dies is fully functional, the fuse string or routing string is permanently burnt into the 3D stacked die package such that it will operate pursuant to the corrected routing string at every power up.

FIG. 16B is a flow diagram illustrating a method 1600 for implementing fault identification of a Through Silicon Via (TSV) in two-level memory (2LM) stacked die subsystems in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 1600 may be utilized in a variety of combinations.

At block 1660 the method 1600 for identifying a faulty Through Silicon Via (TSV) in a stacked semiconductor package begins.

At block 1665 the method includes executing a wake-up sequence on a functional silicon die having embedded thereupon a Wide Input/Output 2 (WIO2) interface, the functional silicon die forming a first layer of the stacked semiconductor package.

At block 1670, it is in accordance with the method 1600 that the stacked semiconductor package includes two or more memory dies forming a corresponding two or more memory layers of the stacked semiconductor package and a plurality of Through Silicon Vias (TSVs) formed through the two or more memory dies, in which each of the plurality of TSVs traverse through the two or more memory layers to the functional silicon die at the first layer of the stacked semiconductor package via the WIO2 interface of the functional silicon die.

At block 1675 the method includes receiving test signals at a test port interface of the functional silicon die from an external tester and routing the test signals through steering logic communicably interfaced with the two or more memory dies.

At block 1680 the method includes shifting data, via the steering logic, into the two or more memory dies through the plurality of TSVs pursuant to the received test signals from the external tester.

At block 1685 the method includes shifting the data, via the steering logic, out of the two or more memory dies as output data and returning the output data to the external tester via the test port interface.

Figure 17:
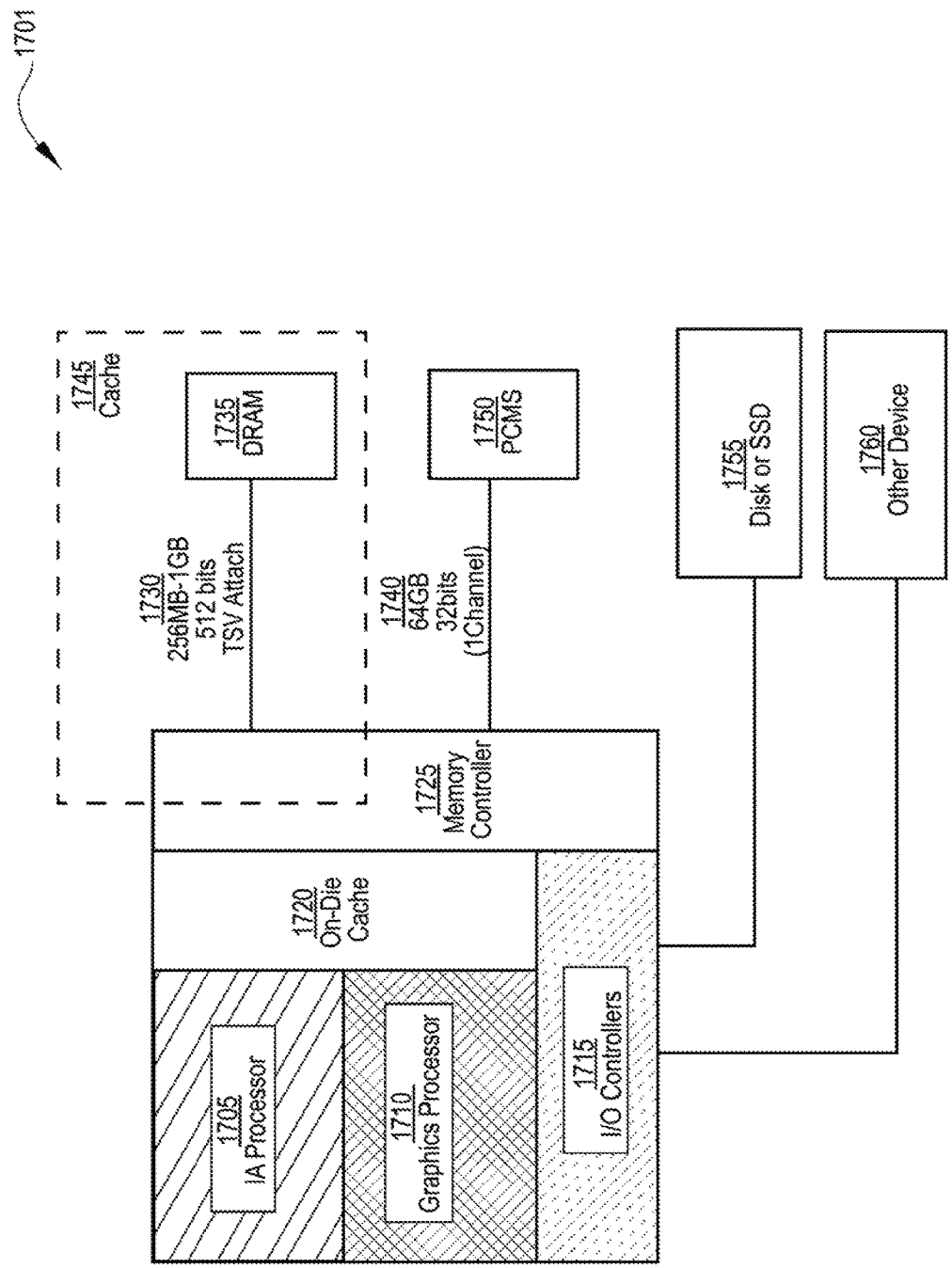
FIG. 17 depicts various elements and architecture of an exemplary Two-Level Memory (2LM) subsystem in accordance with described embodiments.

FIG. 17 depicts various elements and architecture of an exemplary Two-Level Memory (2LM) subsystem 1701 in accordance with described embodiments.

More particularly, there is depicted the IA processor 1705 operating as the CPU core module or processor, the graphics processor 1710, I/O controllers 1715, on-die cache 1720, and memory controller 1725. Interfaced to the memory controller 1725 via a 64 GB, 32 bit single channel 1740 is a PCMS (Phase Change Memory And Switch) 1750. The PCMS 1750 includes a PCM (Phase Change Memory) element layered with an Ovonic Threshold Switch (OTS) in a cross point array providing the ability to layer or stack arrays of PCMS which in turn enables greater scalability to higher memory densities such as that utilized within the 3D stacked die package or the exemplary 2LM memory subsystem, while maintaining the desirable performance characteristics associated with phase change memories.

Additionally interfaced to the memory controller 1725 via a 256 MB to 1 GB 512 bit TSV attach interface 1730 is DRAM 1735 memory thus forming cache 1745 for the 2LM subsystem 1701.

Interfaced with the IO controllers 1715 are the disk or SSD 1755 and "other" device 1760 or peripheral components.

For instance, within an exemplary 2LM memory die packages, means are described by which to test a 2LM semiconductor package for which faulty TSVs have been previously identified and "repaired" utilizing the re-routing or re-mapping of the data paths using a redundant TSV. More particularly, according to certain embodiments, a test controller is built on-die and transactions are sent to a near memory (e.g., memory provided within the package via memory die layers) subsequent to which the transactions are then received back from the near memory to verify that correct operation subsequent to the re-routing and repair of a faulty TSV within the die stack. For instance, according to certain embodiments, a hardware structure is built within the 2LM controller which serves to transform incoming requests such that the requests go only to the near memory for the purposes of testing while ordinarily, requests may go to either the near or far memories. Nevertheless, proper test coverage post repair necessitates testing of the near memory specifically. A DFX mechanism may thus be provided to direct the transactions to only the near memory controller.

In accordance with one embodiment the IA processor 1705 includes an embedded core graphics processor which interfaces with the memory controller 1725, a 2LM controller, a near memory controller, a far memory controller, and the DRAM 1735 providing a complete on-die package, such as a SOC type functional silicon die.

As depicted here, DRAM 1735 is considered a near memory providing cache 1745 capability for the IA processor 1705 and functional silicon die. According to certain embodiments, near memory is a PCM (Phase Change Memory) type cache.

Far memory is additionally provided as depicted by PCMS 1750 and the memory controller 1725 interacts with the far memory to store most data on behalf of the functional silicon die as the near memory DRAM 1735 will typically be much smaller in terms of capacity.

Figure 18:
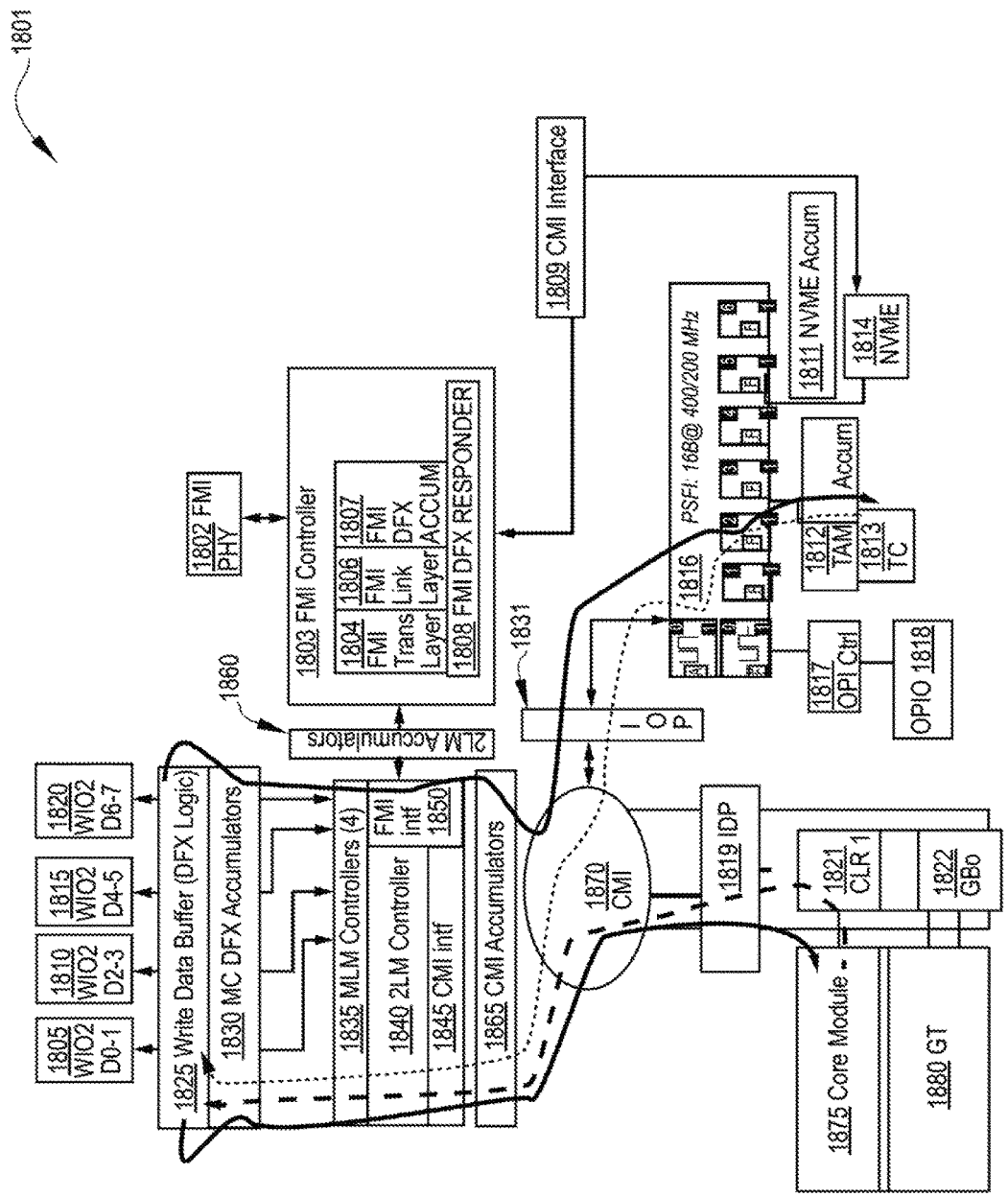
FIG. 18 depicts a sampling of exemplary transactions within an exemplary architecture between test controller agents and the near memory internal to the die stack providing test coverage of the near memory in accordance with described embodiments.

FIG. 18 depicts a sampling of exemplary transactions within an exemplary architecture 1801 between test controller agents and the near memory internal to the die stack providing test coverage of the near memory in accordance with described embodiments.

As may be observed at the bottom left, there is depicted GT 1880 and core module 1875 providing the processor or IA core for the depicted architecture 1801. The core module 1875 being interfaced with controller 1 at element 1821 and the GT 1880 component being interfaced with Gbo 1822. Controller 1 1821 and GBo 1822 are interfaced to the Converged Memory Interface (CMI) 1870 by way of IDI Port (In-Die Interface port or IDP) 1819. The CMI 1870 is in turn interfaced with IOP (TO Port) 1831 providing communications transfer of traffic between the North complex and south complex and leading to the fabric depicted at element 1816. Fabric 1816 is in turn interfaced with OPI controller 1817, IPIO 1818, TAM and accumulator 1812, TC 1813 providing a "Test Controller" operating as a dedicated hardware used for sending traffic back and forth, Non-Volatile Memory express (NVMe) 1814 providing a "Non-volatile Memory Express Engine" to transfer large volumes of data bulk data, and NVME accumulator 1811.

CMI interface 1809 interfaces to the NVME 1814 and also to the FMI controller 1803 providing a "Far Memory Interface" connecting the 2LM controller 1840, the 2LM accumulators 1860, and the NVME to the external far memory connected to the architecture 1801. The 2LM controller operates based on incoming address requests and directs the requests to either the near memory or the far memory.

Within the FMI controller 1803 there is depicted the FMI transfer layers 1804, the FMI link layer 1806, the FMI DFX accumulator 1807, and the FMI DFX responder 1808, with the FMI controller 1803 being operating on behalf of the FMI physical interface 1802.

Multiple WIO2 interfaces are provided at each of elements 1805, 1810, 1815, and 1820 corresponding to WIO2 interfaces D0-1, D2-3, D4-5, and D6-7, each communicatively interfaced with the write data buffer and DFX logic 1825 providing a 4 KB buffer used for DFX purposes that emulates a near memory type structure for testing purposes. MC DFX accumulators 1830 are provided and shown here as interfaced with the four MLM controllers 1835, each in turn being interfaced with the 2LM controller 1840, the FMI interface 1850, the CMI interface 1845, and the CMI accumulators 1865.

Test coverage is provided by way of a testing algorithm for the near memory controller by the following exemplary operations providing a typical transaction flow during functional operation of the architecture 1801: first (a) a CPU sends a memory transaction, secondly, (b) the memory address for the memory transaction is matched against a set descriptor table in the 2LM controller 1840 which checks to determine whether or not the data is present in the near memory or if the request needs to go to the 2LM (far memory). Third, (c) if the address matches, and thus is a cache hit, then data is returned from the near memory controller (NMC) and if the address does not match and is thus a cache miss, then a far memory request is initiated.

For testing purposes (e.g., not during normal functional operation) the design for test (DFX) flow operation is modified and replaces the normal operational flow set forth above. Critically, during testing phases of manufacture the near memory will not be attached to the architecture 1801 and therefore it is necessary to emulate such a memory for testing purposes in accordance with described embodiments. Moreover, far memory will not be attached on the external tester during the testing phases of manufacture and therefore, while conducting near memory testing it is necessary to prevent any requests from being directed to the far memory.

It is therefore in accordance with described embodiments that the following testing infrastructure is provided via the depicted architecture 1801 in accordance with described embodiments. Firstly, (a) there is utilized a 4 KB buffer that is already within the memory controller but is repurposed for the testing as near memory for the sake of reading, writing, and storing data during testing. Secondly, (b) memory is configured as two sets, and 16 ways for testing. Thirdly (c) all incoming requests are hashed into the two sets and 16 ways only during testing phases whereas during normal operational mode (e.g., not test) there are several thousand utilized during normal functional usage mode. Fourthly, (d) for every transaction a signature is collected by the various accumulators. Fifth (e) the Test Controller 11813 or alternatively CPU core module 1875 may be utilized as testing agents capable of initiating transactions and receiving responsive data pursuant to execution of such transactions.

The various test accumulators such as TAM accumulator 1812, 2LM accumulators 1860, CMI accumulators 1865, MC DFX accumulators 1830, FMI DFX accumulator 1807, and NVME accumulators 1811 operate to collect signals output from their connected components to accumulate signatures representative of the test operations and transactions traversing that portion of the architecture 1801. For instance, accumulation logic near the CPU core module 1875 at CMI accumulators 1865 may capture test signatures as transactions pass from the core module 1875 initiating such transactions as the test agent through the CMI 1870 and past the CMI accumulator 1865.

The arrows show the path of the various transactions going back and forth between the test agent, in this case the core module 1875 and the various elements, such as transactions going to and returning from the write data buffer 1825 or transactions originating at test controller 1813 and going to and returning from the write data buffer 1825 via an alternate path, traversing the PSFI fabric 1816 to the IOP 1831 and then again through the CMI accumulators 1865.

According to one embodiment, the 2LM controller 1840 implements tag matching logic such that incoming transactions are evaluated when the architecture is operating in its DFX test mode and cache is always marked as a cache hit or a tag match, such that all transactions are forwarded to the near memory and prevented from ever initiating transactions or requests to the far memory. Such functionality is necessary where testing of the near memory is being performed and additionally necessary in the event that the far memory is not connected with the architecture 1801 and would therefore result in erroneous behavior if transactions were permitted to proceed to the far memory after a cache miss.

Because the near memory is empty or void of cache data at power up and thus empty at the beginning of test, it is in accordance with another embodiment that the near memory is manipulated to indicate a tag match or cache hit despite the reality that any incoming transaction from the test agent during DFX test mode will, by definition for an empty cache, necessarily be a cache miss. The results of the cache check are therefore manipulated from a cache miss result to always a cache hit or a tag match status, thus preventing the transaction from proceeding to far memory. This is beneficial as it would be time-consuming to fill a full 2 GB capacity of RAM with test data for the purposes of returning a legitimate cache hit whereas simply manipulating the result during DFX test mode is significantly faster.

According to one embodiment, naked die testing is performed during a DFX test mode, in which either a CPU core module 1875 or a test controller 1813 acting as the transaction initiating agent sends a transaction to an address. Once the transaction is issued, logic in the 2LM controller 1840 manipulates the address carried by the transaction to specify a desired target controller such that a tag match or cache hit may be guaranteed once the transaction, with the modified address, arrives at the target controller. Naked die testing, also referred to as bare die testing, is testing performed against a functional silicon die for which there is no near memory attached and for which there is no far memory attached, thus rendering the functional silicon die naked or bare of all memories. Testing infrastructure and costs are greatly reduced by testing the bare die, however, in order to test the memory controllers an auto-response agent is provided or the missing and non-connected memories are emulated by accepting transactions and handling the transactions as though they successfully completed.

For instance, an address of a transaction may be modified to target a specific one of four memory controllers where that specific transaction is intended to be routed to the purposes of testing the fabric and providing test scope for that path. For instance, the logic may programmatically be configured to target a specific memory controller or systematically loop through the available memory controllers and so forth. Similarly, the logic may be instructed to change the address to a memory controller as specified by an external tester issuing test sequences or test instructions to the agent or the logic or both.

According to one embodiment, an address map is utilized to programmatically alter the addresses of the transaction such that incoming transactions route to a specified memory controller. In other embodiments, a specialized hardware component with DFX test registers may be utilized to perform the address mapping. In yet another embodiment, the logic changes any address falling within a specified range to a different address corresponding to one of the available memory controllers so as to systematically test each available memory controller within the architecture.

In a related embodiment, all transactions are modified to indicate a cache miss or a tag mis-match, thus forcing all transactions to bypass cache memory provided by the near memory and instead route to a far memory controller where far memory may not be connected or physically configured and is therefore emulated.

For instance, posted transactions which do not require a response and for which the initiating agent does not expect a response are fulfilled by terminating or killing the transaction. Conversely, non-posted transactions which require a response back to the initiating agent will therefore responsively generate a transaction appropriate response which is then routed back through the fabric of the architecture 1801 and to the originating agent, whether that is the test controller or the CPU.

It is additionally beneficial to perform bare die testing because such an approach eliminates the possibility that the externally provided far memory or the connected near memory silicon dies are faulty. Rather, any error will be the result of transactions traversing the fabric of the depicted architecture 1801 and will not be attributable to external conditions (e.g., bad memory) which can result in a false failure mode. Further still, the physical size of the test beds is reduced as there is no need to provide space for such memoires as well as reduced costs associated with providing such memories for testing purposes.

Because errors cannot be associated with memories which are not present during bare die or naked die testing, the analysis and root cause of any failure mode is additionally simplified thus further reducing the cost of test.

According to one embodiment, there is a small cache embedded within the near memory controller which thus able to perform caching operations even when testing is being performed upon a naked die. For instance, the near memory controller can accept data writes into its small cache and then perform legitimate cache hits or tag matches while in DFX testing mode so as to provide further test coverage where appropriate. For instance, according to a particular embodiment, the small cache within the near memory controller constitutes a 4 KB Write Data Buffer (WDB) capable of being repurposed and utilized as a very small 4 KB cache while the architecture 1801 is operating in testing mode.

In such a way, rather than attempting to fill a 2 GB memory which is time consuming or even providing the 2 GB memory which is costly, the caching functionality may be emulated by the near memory controller so as to permit comprehensive test coverage throughout the communications fabric of the architecture 1801 up to and into the caching behavior of the near memory controller.

According to one embodiment, the write data buffer provides 32 lines of cache which is filled at the beginning of a test sequence with known entries, such that matching requests may then be requested causing a cache hit in which case the cache line is then retrieved and returned responsive to a request (e.g., such as a read transaction) from the cache of the near memory controller without necessitating filling of a very large 2 GB memory cache and while permitting naked die testing. According to such an embodiment, the transaction is mapped to the corresponding cache line of the near memory controller thus permitting the cache hit for a transaction initiated as part of a test sequence, thus causing the transaction to route to the near memory controller and match the cache line responsive to which the near memory controller will read the cache line (as mapped for that transaction) and respond in accordance with the auto-response logic by either sending a response with known data or manipulating the response with a known value regardless of what data was retrieved from the cache.

According to another embodiment, a configurable muxing mechanism determines whether or not a response will be issued responsive to a transaction and optionally is configurable to determine what type of response is to be issued. For instance, different responses may occur based on whether the initiating agent is a CPU or a test controller, each having different capabilities for handling the return response after initiating a transaction.

For instance, the configurable muxing mechanism may be programmed to determine whether to write data into the very tiny cache established by the 4 KB write data buffer within the near memory controller or whether write data is to be written to attached cache memory, for instance, in the event that such memories are connected during test and test coverage is to expand from the controller and onto such connected memories.

According to another embodiment, an auto response mechanism co-located with the memory controller or embedded within the memory controller is configured to accept incoming transactions and terminate the transaction or respond as appropriate without requiring external memory to be connected to the architecture 1801, thus permitting naked die testing. For instance, the auto response mechanism may accept a write transaction and kill the transaction without writing to memory (which is not present) thus providing an expected behavior to the initiating agent which does not expect a response to the write transaction. Conversely, for a read transaction, the auto response mechanism may generate pseudorandom data in response which is then sent to the initiating agent in reply to the read request, again providing expected behavior notwithstanding the lack of connected memory.

Figure 19:
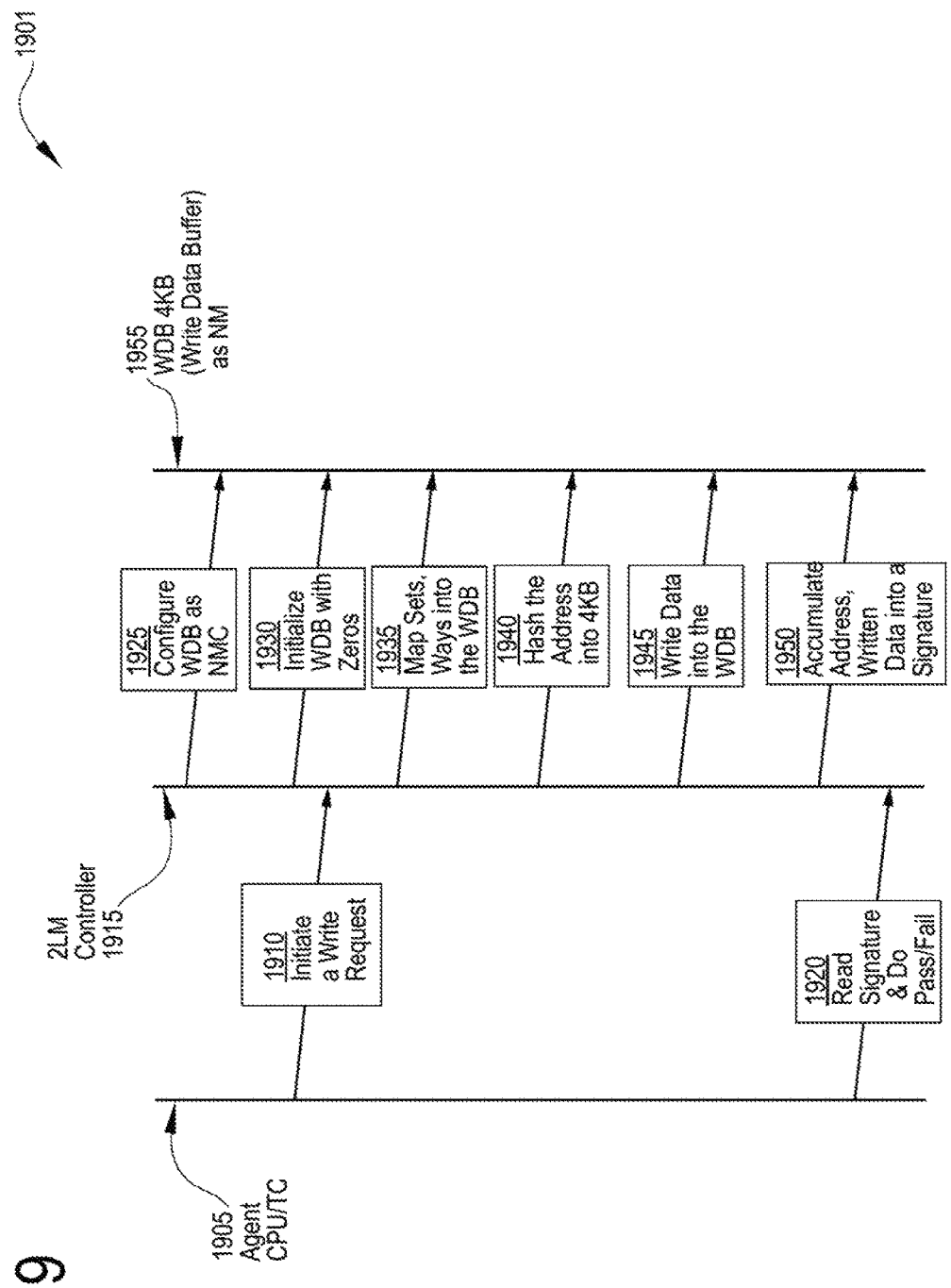
FIG. 19 depicts exemplary transactions providing test coverage between the die stack 2LM controller and the near memory controllers using a write operation while in DFX mode in accordance with described embodiments.

FIG. 19 depicts exemplary transactions 1901 providing test coverage between the die stack 2LM controller and the near memory controllers using a write operation while in DFX mode in accordance with described embodiments.

For instance, beginning at the top center, the 2LM controller 1915 initiates transaction 1925 to configure the Write Data Buffer (WDB) as a Near Memory Controller (NMC) with the transaction being received by the 4 KB write data buffer 1955 as Near Memory (NM).

Next, the 2LM controller 1915 initializes the write data buffer with all zeros via transaction 1930. An agent 1905 (e.g., such as the Test controller (TC) or CPU) then initiates a write request to the 2LM controller 1915 via transaction 1910. The 2LM controller 1915 in turn maps sets and ways into the write data buffer via transaction 1935 and hashes the address into 4 KB via transaction 1940. Next the 2LM controller 1915 accumulates addresses and written data into a signature at transaction 1950 and lastly, the agent 1905 reads the signature and conducts its pass/fail analysis as depicted by transaction 1920.

Figure 20:
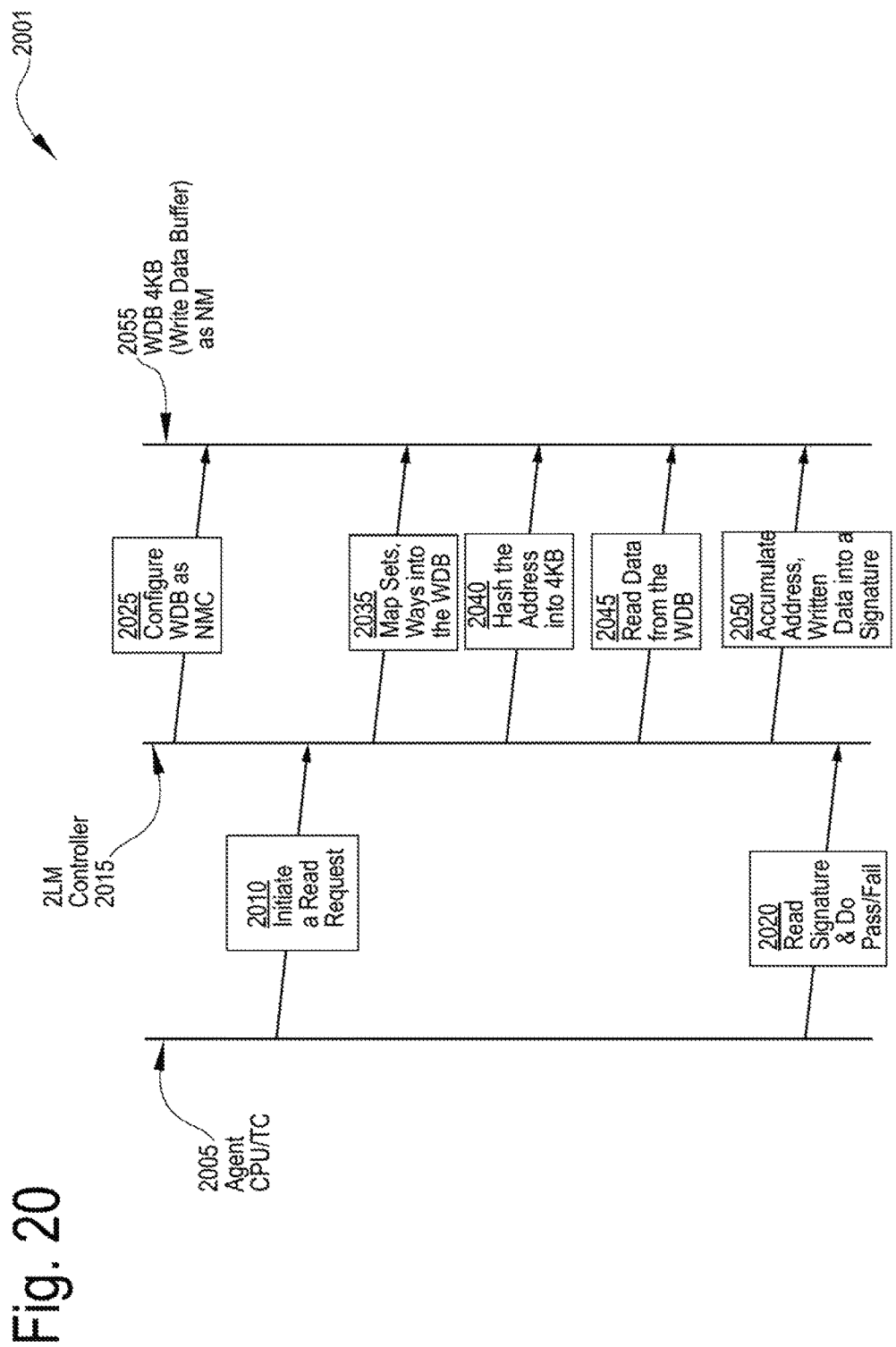
FIG. 20 depicts alternative exemplary transactions providing test coverage between the die stack 2LM controller and the near memory controllers using a read operation while in DFX mode in accordance with described embodiments.

FIG. 20 depicts alternative exemplary transactions 2001 providing test coverage between the die stack 2LM controller and the near memory controllers using a read operation while in DFX mode in accordance with described embodiments.

For instance, beginning at the top center, the 2LM controller 2015 initiates transaction 2025 to configure the Write Data Buffer (WDB) as a Near Memory Controller (NMC) with the transaction being received by the 4 KB write data buffer 2055 as Near Memory (NM).

Next, agent 2005 (e.g., such as the Test controller (TC) or CPU) initiates a read request to the 2LM controller 2015 via transaction 2010. The 2LM controller 2015 in turn maps sets and ways into the write data buffer via transaction 2035 and hashes the address into 4 KB via transaction 2040. Next, the 2LM controller 2015 reads data from the write data buffer as shown at transaction 2045 and the 2LM controller 2015 then accumulates addresses and written data into a signature at transaction 2050. Lastly, agent 2005 reads the signature and conducts its pass/fail analysis as depicted by transaction 2020.

Figure 21:
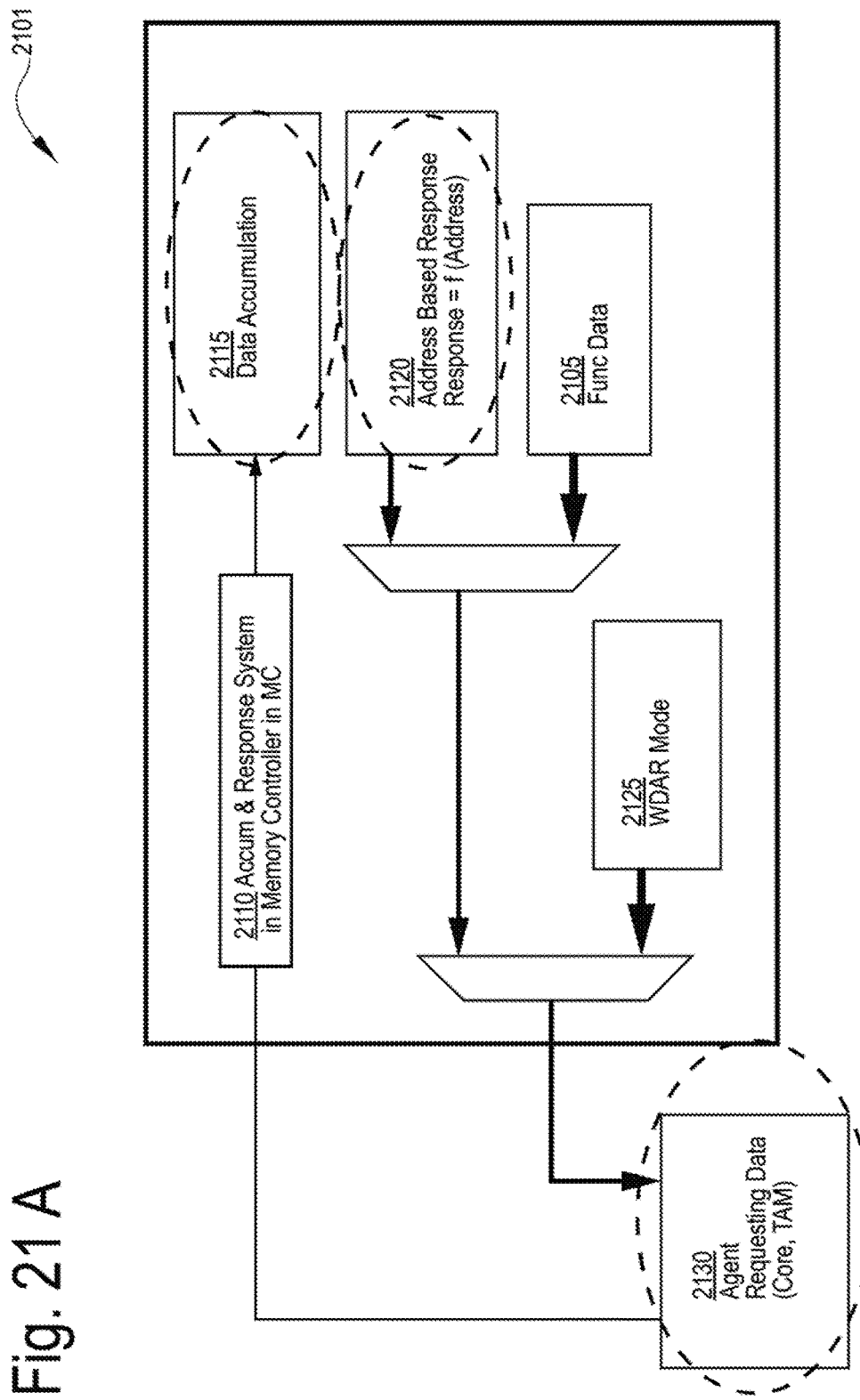
FIG. 21A depicts an exemplary accumulation and auto response mechanism embedded within a memory controller of the die stack in accordance with described embodiments.
FIG. 21B is a flow diagram illustrating a method for implementing testing of fault repairs to a Through Silicon Via (TSV) in Two-Level Memory (2LM) stacked die subsystems in accordance with described embodiments.
FIG. 21C is another flow diagram illustrating an alternative method for implementing testing of fault repairs to a Through Silicon Via (TSV) in Two-Level Memory (2LM) stacked die subsystems in accordance with described embodiments.

FIG. 21A depicts an exemplary accumulation and auto response mechanism 2101 embedded within a memory controller of the die stack in accordance with described embodiments.

In particular, there is depicted an agent 2130 initiating transactions such as requesting data or writing data as performed by a test controller, a Test Agent Module (TAM), or an on-die CPU processor core.

Transactions are sent from the agent 2130 to the accumulator and response system 2110 in the memory controller. Block 2115 provides a data accumulation phase and block 2120 provides address based responses=f (address) such that mapping may be performed to manipulate the routing of any given transaction during testing mode. Block 2105 provide functional data, with the signal from blocks 2120 and 2105 being muxed and combined with signals in WDAR (Write Data Always Respond) mode 2125 which are again muxed and returned to agent 2130.

Such an accumulation and auto response mechanism 2101 provides good test coverage by accumulating data before the write data buffer where cache lines are stored and before transactions are permitted to go DRAM upon occurrence of a cache miss. Moreover, a deterministic response is provided by the fixed mapping of a memory controller (MC) decoded physical address to the response while the responses are programmable at speed. Such mechanism therefore facilitates a self-checking mechanism for DDR4, 16 GB, X8 full occupancy all ranks in all channels with the ability to modify the responses dynamically and programmatically, thus resulting in reduced simulation effort for several tests as expected responses and signatures may be computed through software.

Figure 21B:
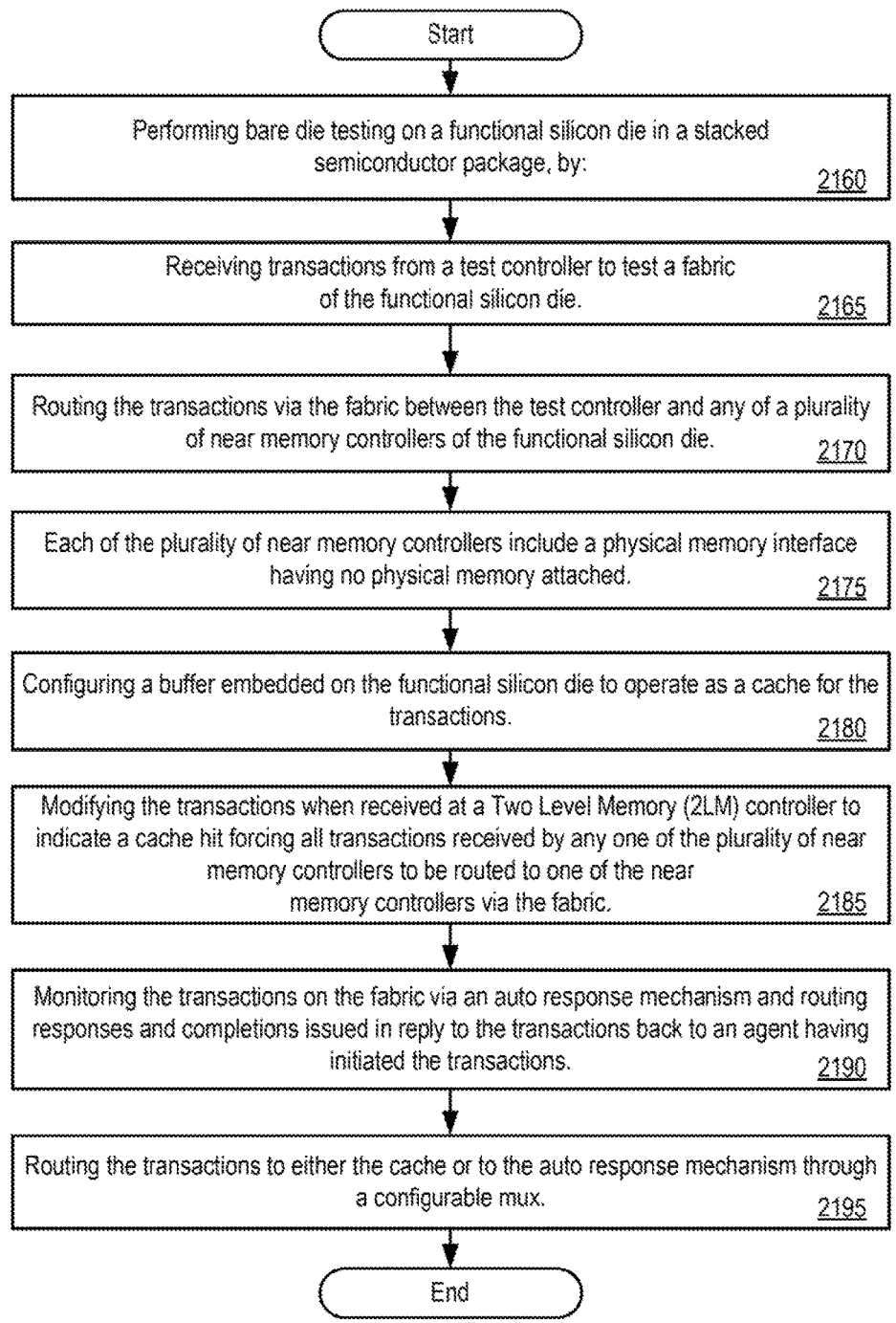

FIG. 21B is a flow diagram 2100 illustrating a method for implementing testing of fault repairs to a Through Silicon Via (TSV) in Two-Level Memory (2LM) stacked die subsystems in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 1600 may be utilized in a variety of combinations.

At block 2160 the method 2100 for performing bare die testing on a functional silicon die in a stacked semiconductor package begins.

At block 2165 the method includes receiving transactions from a test controller to test a fabric of the functional silicon die.

At block 2170 the method includes routing the transactions via the fabric between the test controller and any of a plurality of near memory controllers of the functional silicon die.

At block 2175 each of the plurality of near memory controllers include a physical memory interface having no physical memory attached.

At block 2180 the method includes configuring a buffer embedded on the functional silicon die to operate as a cache for the transactions.

At block 2185 the method includes modifying the transactions when received at a Two Level Memory (2LM) controller to indicate a cache hit forcing all transactions received by any one of the plurality of near memory controllers to be routed to one of the near memory controllers via the fabric.

At block 2190 the method includes monitoring the transactions on the fabric via an auto response mechanism and routing responses and completions issued in reply to the transactions back to an agent having initiated the transactions.

At block 2195 the method includes routing the transactions to either the cache or to the auto response mechanism through a configurable mux.

FIG. 21C is another flow diagram illustrating an alternative method 2199 for implementing testing of fault repairs to a Through Silicon Via (TSV) in Two-Level Memory (2LM) stacked die subsystems in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 2199 may be utilized in a variety of combinations.

At block 2162 the alternative method 2199 for performing testing on a functional silicon die in a stacked semiconductor package begins.

At block 2164 the method includes receiving transactions from a test controller to test a fabric of the functional silicon die, the functional silicon die having embodied therein a System On a Chip (SOC).

At block 2166 the method includes routing the transactions via the fabric between the test controller and any of a plurality of near memory controllers of the functional silicon die.

At block 2168 each of the plurality of near memory controllers include a physical memory interface having a Dynamic Random Access Memory (DRAM) module or a Phase Change Memory (PCM) module attached thereto.

At block 2172 the method includes modifying the transactions when received at a Two Level Memory (2LM) controller to indicate a cache hit forcing all transactions received by any one of the plurality of near memory controllers to be routed to one of the near memory controllers via the fabric.

At block 2174 the method includes Routing the modified received transactions from the 2LM controller to a specified one of the plurality of near memory controllers based on programmable address mapping.

At block 2176, the one specified near memory controller having received the modified transactions is to either: (i) write data accompanying posted transactions to the DRAM or PCM module attached thereto without further response to the agent having originated the transactions or (ii) read non-posted transactions from the DRAM or PCM module attached thereto based on a specified address accompanying the non-posted transaction and respond to the agent having originated the transactions with data read from the DRAM or PCM module.

Figure 22:
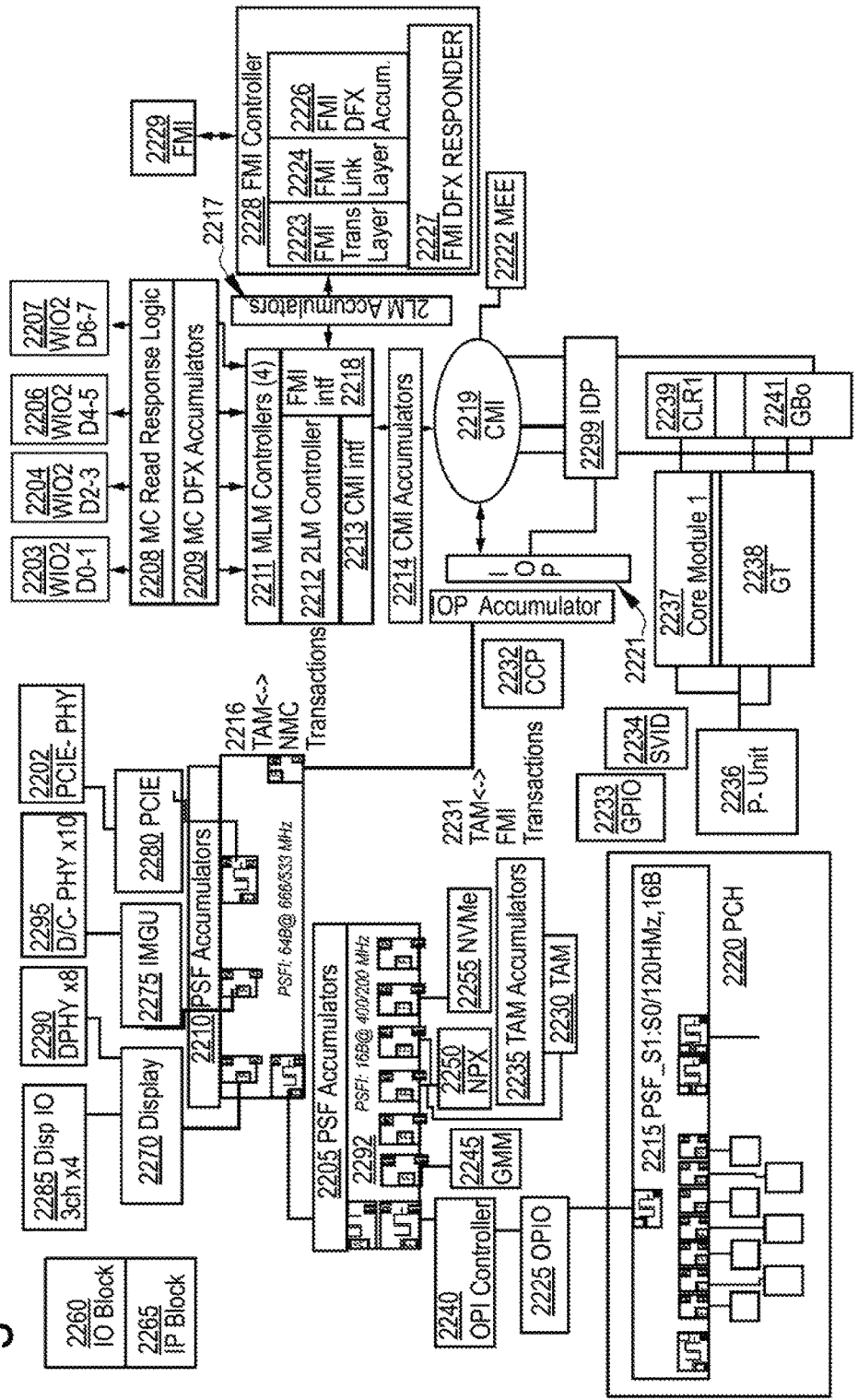
FIG. 22 depicts a high-level block diagram of a system which implements testing of a far memory subsystem within Two-Level Memory (2LM) stacked die subsystems in accordance with described embodiments.

FIG. 22 depicts a high-level block diagram 2201 of a system which implements testing of a far memory subsystem within Two-Level Memory (2LM) stacked die subsystems in accordance with described embodiments.

In view of the above described stacked 3D semiconductor die package, there are now further described means for testing a far memory controller for a 2LM memory package sub-system. During normal operation of such a 2LM memory package sub-system, any request which misses at the near memory will cause the request to then be routed to the far memory controller and ultimately out to an externally connected SXP memory device. However, during testing it may be preferable at certain operations to conduct testing of the far memory controller without having any external SXP memory connected to the 2LM memory package sub-system at the far memory interface during testing. However, conventional solutions do not permit testing of the far memory controller sub-system without such memory being physically connected with the 2LM memory package sub-system at the far memory interface.

It is therefore further described in accordance the various embodiments a virtual device which is built into the far memory controller and mimics or spoofs the missing externally connected far memory. In such an embodiment, the virtual device will further respond on behalf of the missing external SXP memory devices with the corresponding protocol appropriate responses so that complete testing coverage all the way out through the far memory controller and up to the far memory interface may be performed without necessitating the coupling with the external SXP memory at the far memory interface. Additionally provided is a DFX mechanism to bypass the near memory controller direct transactions only to the far memory controller by utilizing an "always miss" procedure so that all transactions will "miss" at the near memory controller and effectively by-pass the near memory.

Specifically depicted here within diagram 2201 are PSF accumulators 2210 and 2205 (e.g., PSFI: 64B@ 666/533 MHz) which interface with the TAM NMC (Near Memory Controller) transactions 2216 and TAM FMI transactions 2231, including CCP 2232, SVID 2234, and GPIO 2233. The PSF accumulators 2210 further interface with display 2270 and Display IO 2285 (e.g., three channel by four) and DPHY×8 2290, IMGU 2275 and D/C—PHY×10 2295, PCIE 2280 and PCIE—PHY 2202, thus forming the IO block 2260 and IP blocks 2265 respectively.

Connected with PSF accumulators 2205 (e.g., PSFI: 16B@ 400/200 MHz at element 2292) are OPI controller 2240, OPIO 2225, GMM 2245, NPX 2250, Non-Volatile Memory express (NVMe) 2255, TAM accumulators 2235 and TAM 2230, as well as PSF_S1:S0/120 HMz, 16B at element 2215 and PCH 2220.

Transitioning to the right side of the diagram 2201, there are depicted the multiple WIO2 interfaces 2203, 2204, 2206, and 2207 corresponding to WIO2 interfaces D0-1, D2-3, D4-5, and D6-7, each communicatively interfaced with the Memory Controller (MC) read response logic 2208 and MC DFX accumulators 2209, which in turn are connected with MLM controllers (4) at element 2211, 2LM controller at element 2212, the FMI interface 2218 the CMI interface 2213, which then in turn connect with 2LM accumulators 2217 and CMI accumulators 2214 respectively.

The 2LM accumulators 2217 are connected with the FMI controller 2228 which is connected with or includes FMI 2229, FMI transfer layer 2223, FMI link layer 2224, FMI DFX accumulator 2226, and FMI DFX responder 2227.

the CMI accumulators 2214 are connected with CMI 2219, MEE 2222, IOP 2221, IDP 2299, CLR1 2239, GBo 2241, core module 1 at element 2237, GT 2238, and P-unit 2236.

As can be seen within the diagram 2201 of an exemplary 2LM memory sub-system, there are two distinct levels of memory. One type of memory provided is a near memory which is attached to the die itself, also referred to as first level memory. Near memory is typically but not necessarily DRAM type memory. Another type of memory is then provided as a far memory or a second level memory, and is not attached to the die in question, but rather, is interfaced with the die through the Far Memory Interface (FMI) 2229 and the corresponding FMI controller 2228.

Because the memory which is attached to the die itself is much closer to the CPU it is referred to as near memory whereas memory located out on a package board or a main board much farther from the CPU is referred to as far memory given its greater distance from the CPU core module 2237. Such far memory may be phase change memory in accordance with described embodiments. Usually the near memory is a more expensive memory and the far memory is composed of less costly memory, but while typical, such an arrangement is not mandatory.

With reference to the diagram 2201, when CPU core module 2237 senses a transaction, the transaction will first be routed via the fabric and check in with the near memory, for instance, at the 2LM controller 2212. During ordinary operational processing, if the check results in a tag match or a cache hit then the transaction reads the requested data from the near memory via 2LM controller 2212 and a responsive transaction with the retrieved payload data is then returned to the CPU core module 2237 having originated the transaction. Because the near memory is physically in close proximity with the CPU core module 2237, the access times are very fast. However, the near memory is also limited in terms of capacity as there is a limit to the amount of space that may be consumed by such on-die memory and thus a limit to the amount of near memory that may be attached to the CPU die.

If the transaction does not result in a cache hit at the near memory's 2LM controller 2212 then the request transaction is next routed to the far memory controller 2228 and on to a far memory interface 2229 and then out to externally connected external memory, providing the physical far memory data storage for the 2LM memory sub-system. The request transaction will result in a data payload being retrieved from the externally connected far memory and then returned to the CPU core module 2237 by the FMI controller 2228.

During certain phases of testing, there will be near memory attached to the CPU die and accessible to the CPU core module 2237 whereas the expected far memory which ordinarily resides on the platform, separate from the CPU die, will be missing. The 2LM controller 2212 is responsible for directing the transactions towards the near memory or the far memory when a transaction is sent by the CPU core module 2237, with the transaction traveling through the 2LM controller 2212 and then onto the near memory or onwards toward the far memory controller 2228 depending on whether the request can be fulfilled by the near memory or is a cache miss at the near memory.

During testing, however, it may be necessary to provide test coverage up through to the far memory controller 2228 and far memory interface 2229, regardless of the fact that the far memory is missing and is therefore not externally connected with the CPU die undergoing test.

It is therefore further provided that a test controller or a Test Agent Module (TAM) 2230 is interfaced with the fabric of the CPU die as depicted by diagram 2201 with the TAM being interfaced into the PSFI fabric 2292.

With the inclusion of the test controller or Test Agent Module, a transaction generation engine is thus provided can generate and issue transactions onto the fabric for testing purposes. As described previously, the CPU core module 2237 may additionally or alternatively be utilized to generate such transactions. However, unlike the CPU core module 2237 which has additional responsibilities and may therefore be resource-constrained, the Test Agent Module (TAM) 2230 is dedicated and may therefore be utilized to generate a greater volume of transactions for testing purposes without distracting the CPU core module 2237 or without placing further resource demands on the CPU core module 2237. In other embodiments, the Test Agent Module (TAM) 2230 may operate as a new test port capable of receiving instructions and transactions from an external tester, separate from the CPU die, and communicate or transmit those received transactions directly on to the fabric 2292 for processing via the depicted 2LM memory substructure diagram 2201. Moreover, where the Test Agent Module (TAM) 2230 is a dedicated hardware component according to select embodiments it is capable of generating a very large quantity of transactions capable of flooding or filling the various buffers for the purposes of fully exercising and testing the CPU die undergoing testing procedures. Regardless, both the test controller/TAM 2230 and the CPU core module 2237 are fully capable of generating and issuing protocol appropriate transactions onto the fabric 2292 and the far memory controller will not distinguish between such generated transactions for the purposes of processing the transaction.

For the purposes of testing, transactions may be originated at the CPU core module 2237 and routed through the fabric to the far memory controller 2228 and FMI 2229 to verify that the intervening components are functioning properly. With such transactions traversing through the 2LM controller 2212, the co-located 2LM accumulators 2217 will thus observe and record or collect all signals passing through so as to generate a test signature which may then be compared against a known good test signal or a known good test signature to verify correct operation of the CPU die undergoing test.

Test signals and test signatures may additionally be collected at other accumulation points. For instance, the memory controller DFX accumulator 2209 collects any transactions routed by the four MLM (Multi-Level Memory) controllers 2211 to the WIO2 interfaces 2203, 2204, 2206, and 2207 on the way to the die-attached near memory (e.g., where the DRAM memory components are physically to the CPU die).

Additional test signal and test signature collection points include the fabric PSF accumulators 2210, the TAM accumulators 2235 to collect any signals emanating from the test controller or test agent module 2230, as well as the IOP accumulator 2221.

Figure 23:
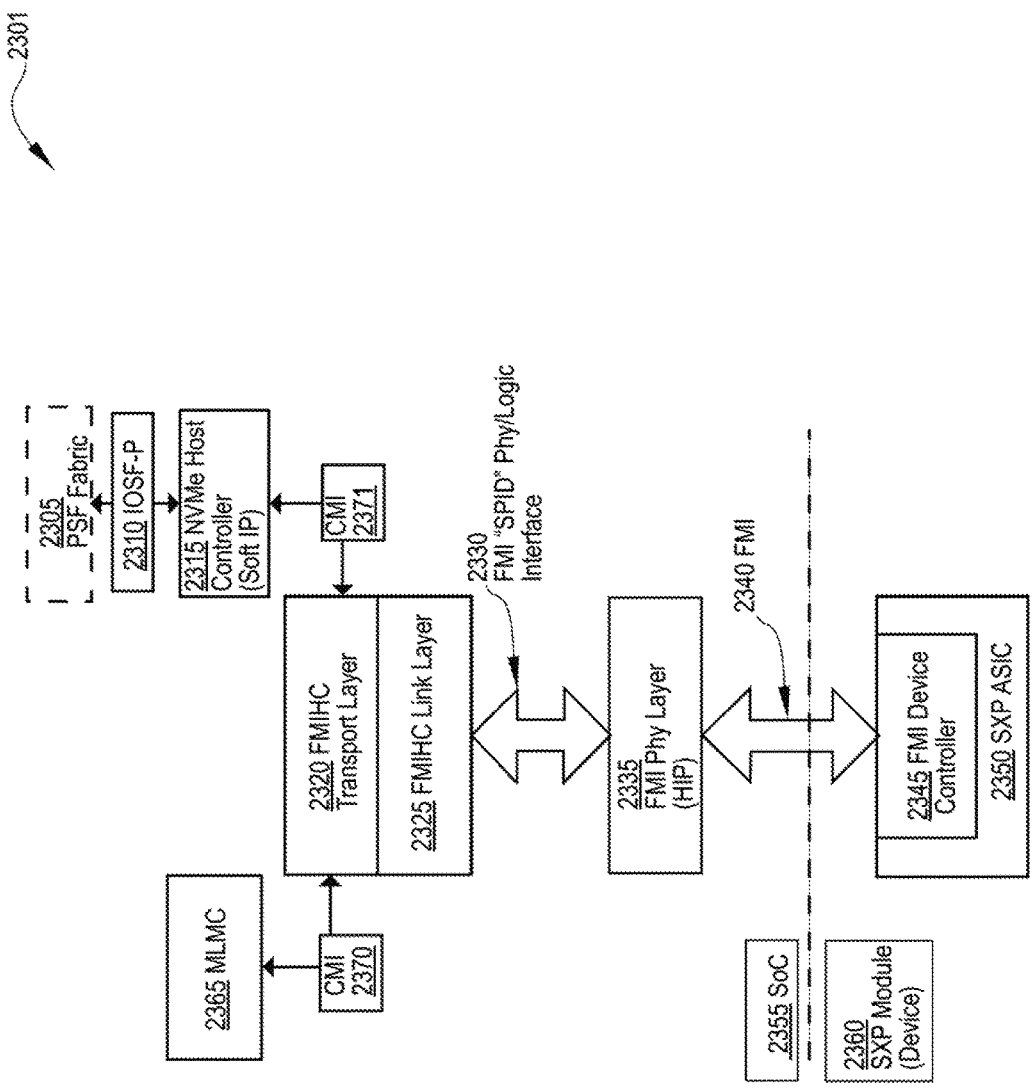
FIG. 23 depicts an exemplary FMI controller interface of a die stack to an external SXP memory device external to the die stack in accordance with described embodiments.

FIG. 23 depicts an exemplary FMI controller interface 2301 of a die stack to an external SXP memory device external to the die stack in accordance with described embodiments.

In particular, there is depicted on the bottom side of the dividing line an SXP Module (or device) 2360 and on the top side of the dividing line a System on a Chip (SoC) 2355, in which the Far Memory Interface (FMI) device controller 2345 further is shown here as having attached thereto an SXP ASIC 2350 which interfaces with the Far Memory Interface (FMI) 2340 within the SoC 2355. The FMI 2340 is then in turn interfaced with the FMI physical layer 2335 (HIP) and then interfaced with the FMI "SPID" physical to logic interface 2330, which then leads to the FMIHC link layer 2325 and the FMIHC transport layer 2320. The FMIHC transport layer 2320 is then in turn interfaced with each of the depicted CMI interfaces 2370 and 2371, with CMI 2370 being connected with MLMC (Multi-Level Memory Controller) 2365 and with CMI 2371 being interfaced with the NVMe Host Controller 2315 implementing soft IP and the IOSF-P 2310 and finally to the system fabric depicted here by the PSF fabric 2305.

In such a way, the depicted diagram depicts how an exemplary FMI 2340 controller connects to the external SXP ASIC 2350 device, thus providing an interface from the die upon which the SoC 2355 chip is embodied and any components which exist outside of the SoC 2355 die.

As can be seen here, the FMI controller interface 2301 provides a complete communications path from the CPU die undergoing test to the externally connected memory through the FMI device controller 2345.

Through such a communication path any generated transactions are routed from an on-die CPU core module core all the way to the far memory controller 2345 or from a test controller to the far memory controller 2345, depending on what entity generated the particular transaction.

Figure 24:
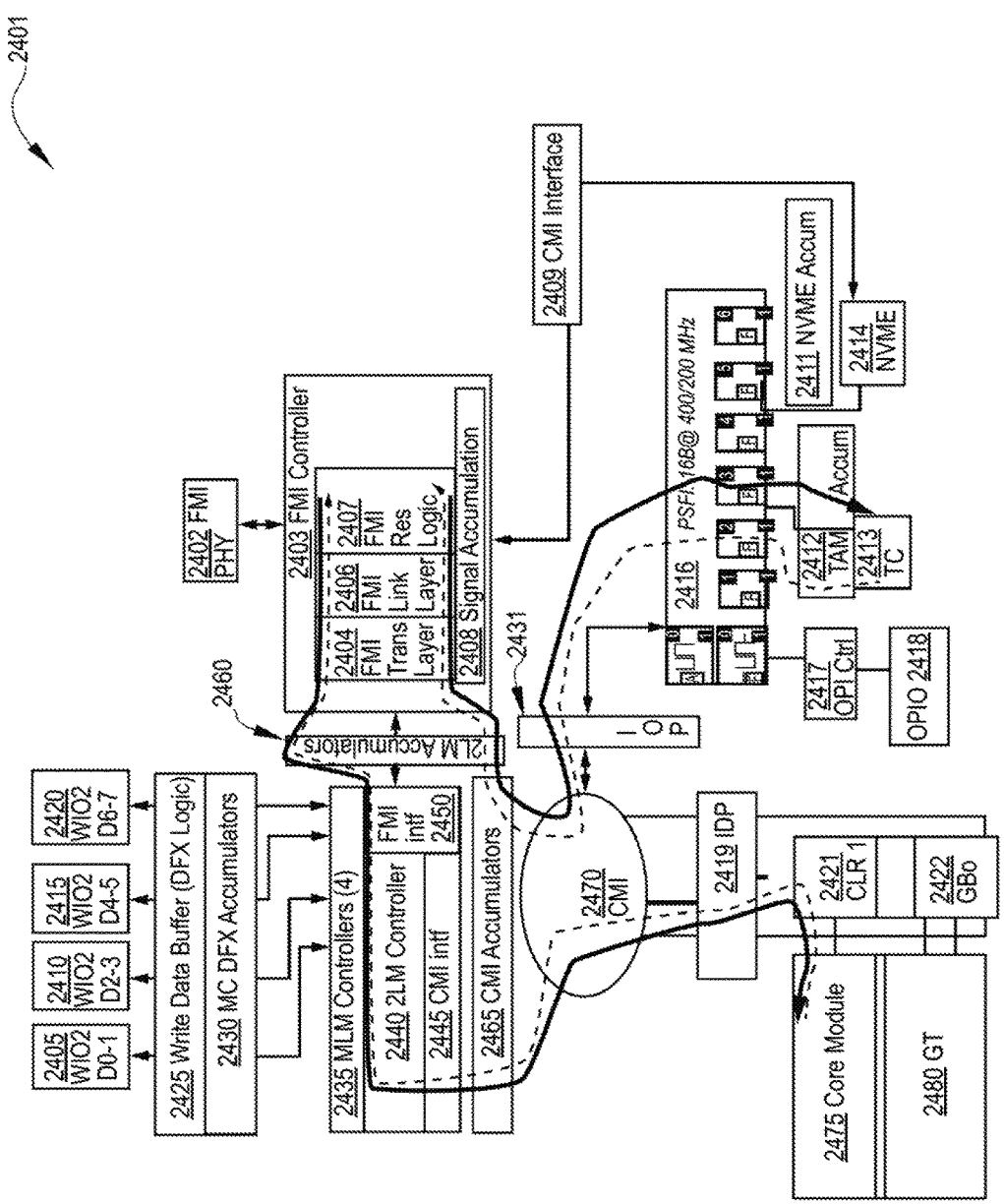
FIG. 24 depicts an exemplary architecture for a test controller agent sending transactions to an FMI controller interface and receiving transactions from the FMI controller interface in accordance with described embodiments.

FIG. 24 depicts an exemplary architecture 2401 for a test controller agent sending transactions to an FMI controller interface and receiving transactions from the FMI controller interface in accordance with described embodiments.

From the bottom left, there is depicted GT 2480 and core module 2475 providing the processor or IA core for the depicted architecture 2401. The core module 2475 being interfaced with controller 1 at element 2421 and the GT 2480 component being interfaced with Gbo 2422. Controller 1 2421 and GBo 2422 are interfaced to the Converged Memory Interface (CMI) 2470 by way of IDI Port (In-Die Interface port or IDP) 2419. The CMI 2470 is in turn interfaced with IOP (IO Port) 2431 providing communications transfer of traffic between the North complex and south complex and leading to the fabric depicted at element 2416. Fabric 2416 is in turn interfaced with OPI controller 2417, IPIO 2418, TAM and accumulator 2412, TC 2413 providing a "Test Controller" operating as a dedicated hardware used for sending traffic back and forth, Non-Volatile Memory express (NVMe) 2414 providing a "Nonvolatile Memory Express Engine" to transfer large volumes of data bulk data, and NVME accumulator 2411.

CMI interface 2409 interfaces to the NVME 2414 and also to the FMI controller 2403 providing a "Far Memory Interface" connecting the 2LM controller 2440, the 2LM accumulators 2460, and the NVME to the external far memory connected to the architecture 2401.

Within the FMI controller 2403 there is depicted the FMI transfer layers 2404, the FMI link layer 2406, the FMI response logic 2407, and the signal accumulation 2408 logic, with the FMI controller 2403 being operable on behalf of the FMI physical interface 2402.

Multiple WIO2 interfaces are provided at each of elements 2405, 2410, 2415, and 2420 corresponding to WIO2 interfaces D0-1, D2-3, D4-5, and D6-7. MC DFX accumulators 2430 are provided and shown here as interfaced with the four MLM (Multi-Level Memory) controllers 2435, each in turn being interfaced with the 2LM controller 2440, the FMI interface 2450, the CMI interface 2445, and the CMI accumulators 2465.

According to the depicted embodiment, there are communication paths between the testing agents such as the CPU core module 2475 and test controller (TC 2413) and then to the Far memory interface, thus providing a scope of test coverage to be verified. A DFX logic implemented within the write data buffer 2425 "decodes and responds back to incoming transactions. The FMI interface at element 2450 intercepts the incoming requests and translates them into an appropriate message which may then be routed back to the transaction originator, whether that is the test controller 2413 or the CPU core module 2475 or an external tester communicating onto the architecture via a test interface port. The various accumulators additionally collect incoming data into a signature for subsequent test validation. For instance, the various accumulators depicted here as the signal accumulation 2408 may capture any signal passing through and record those signals as a signature or generate a test signature utilizing those signals so as to later validate the test sequences executed between the FMI controller 2403 and the CPU core module 2475 or test controller 2413.

As is further depicted, the far memory FMI response logic 2407 provides a mechanism within the far memory controller 2403 capable of mimicking the functionality of the FMI controller 2403 and spoofing return transitions in response to incoming transactions directed toward the missing far memory which during normal operation would be externally connected with the physical far memory interface (FMI PHY) 2402 but which may remain absent during testing.

If the CPU core module 2475 issues a posted transaction which does not require any response to the CPU core module, then the FMI response logic 2407 will capture the posted transaction and terminate thus providing the expected behavior since the posted transaction will simply address a particular address of memory under normal circumstances when the far memory is connected. If instead the CPU core module 2475 issues a non-posted transaction meaning that a response is required to be returned to the transaction originating agent, then the FMI response logic 2407 will emulate the behavior of reading an address from the far memory in fulfillment of the read request specified by the non-posted transaction and then proceed to generate simulated data or pseudorandom data depending on the test procedure, with the generated data then being returned as a responsive payload to the transaction originator, in this particular example, returning the responsive payload to the CPU core module 2475 having originated the transaction.

In alternative embodiments, such as the example depicted by the exemplary architecture 2401, the test controller (TC) 2413 may generate a non-posted transaction as a transaction originator but the FMI response logic 2407 will alter the address or identifier of the transaction originating agent thus causing the response transaction with the payload to be returned to the CPU core module 2475 rather than being returned to the test controller 2413.

The FMI response logic 2407 provides a smart logic mechanism which evaluates any incoming transaction and processes the incoming transaction in a transaction appropriate manner, such as terminating posted transactions and responding to posted transactions with generated data which cannot be retrieved from the far memory due to the far memory not being connected to the FMI physical interface 2402.

Utilizing the signal accumulation component 2408 the FMI response logic 2407 additionally collects test signals and test signatures for the transactions traversing this particular portion of the architecture 2401 thus permitting the test signatures to be later compared with a known good sample to verify correct operation of the CPU die undergoing test.

According to one embodiment, there is a data generator which automatically generates data from seed data, so as to produce pseudorandom data in an expected manner which may be replicated by the test controller 2413. Such data is returned as payload data responsive to incoming transactions processed by the FMI response logic 2407 with the test signature being collected at the signal accumulation block 2408 for subsequent comparison and with the generated data also being subjected to subsequent validation by the test controller, with the validation of the data to verify that the generated data which is passed back with the payload and thus traversing the fabric on a return route from the FMI controller 2403 to the test controller 2413 or to the CPU core module 2475 remains correct after traversing the return route.

According to a particular embodiment, logic at the 2LM controller 2440 forces a tag mis-match, such that every time a transaction arrives the processing which checks to see if there is a near memory cache hit is forced to indicate a cache miss or a tag mis-match or a tag no-match, thus requiring that the transaction proceed to far memory instead.

By forcing the cache miss at the 2LM controller 2440 all transactions may be systematically and purposefully routed to the far memory controller 2403 for the sake of testing the fabric and components from the CPU core module 2475 or test controller 2413 and the targeted FMI controller 2403 and FMI physical interface 2402.

In such a way, no transactions are permitted to advance to or be serviced by the near memory while such logic in the 2LM controller 2440 remains active, such as during a far memory testing phase. Conversely, during a near memory testing phase, the same logic performs the opposite function, thus forcing all transactions to tag-match, thus indicating a cache hit such that transactions are serviced only by the near memory and never route to the far memory controller 2403.

Additional benefits of forcing all transactions to cache miss at the 2LM controller 2440 is that it may be performed regardless of whether the near memory has been attached, as no transaction will attempt to write or read from near memory which will result in erroneous processing if the near memory is missing as could be the case during manufacture of a 3D stacked die package. Additionally, where the near memory has been attached and is therefore present, no cache miss will occur until the near memory has been completely filled and consumed with prior transaction data, thus necessitating processing to completely fill a 1 GB or 2 GB near memory which can be very time-consuming. Bypassing the near memory completely therefore eliminates such issues during a far memory testing phase.

Figure 25:
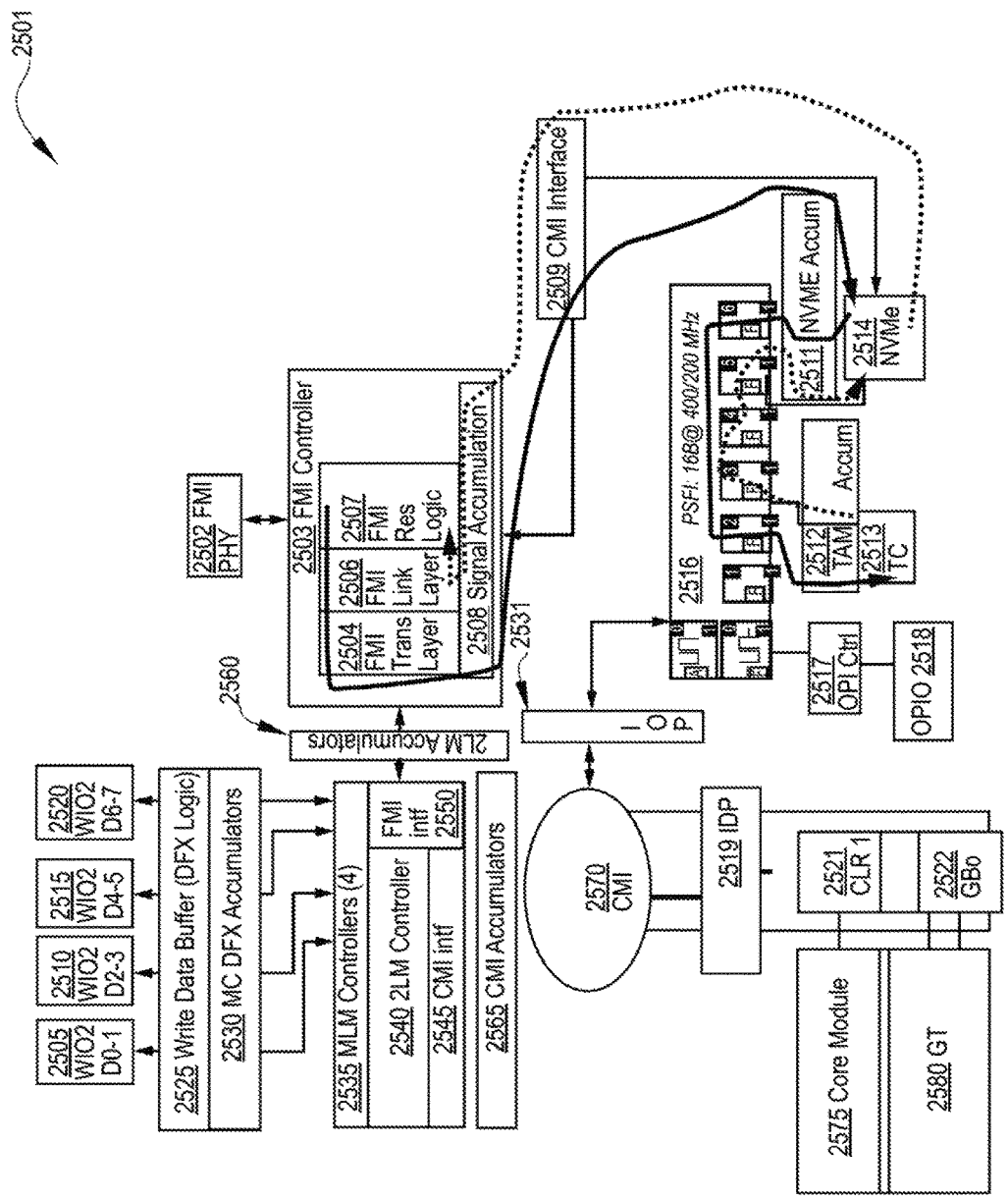
FIG. 25 depicts an exemplary architecture for a test controller agent communicating with an FMI controller interface through an NVME engine in accordance with described embodiments.

FIG. 25 depicts an exemplary architecture 2501 for a test controller agent communicating with an FMI controller interface through a NVME engine in accordance with described embodiments. Similar to the FIG. 24 above, depicted here is the same architecture except that the testing agent 2513 is now communicating with the FMI controller 2503 by way of the NVMEe (NVME engine) 2514 rather than CMI 2570 which therefore provides expanded test coverage as a different communications route is enforced for any transactions from the test controller 2513 or the CPU core module 2575 to the FMI controller 2503.

Here the depicted architecture includes GT 2580 and core module 2575; the core module 2575 being interfaced with controller 1 at element 2521 and the GT 2580 component being interfaced with Gbo 2522. Controller 1 2521 and GBo 2522 are interfaced to the Converged Memory Interface (CMI) 2570 by way of IDI Port (In-Die Interface port or IDP) 2519. The CMI 2570 is in turn interfaced with IOP (10 Port) 2531 providing communications transfer of traffic between the North complex and south complex and leading to the fabric depicted at element 2516. Fabric 2516 is in turn interfaced with OPI controller 2517, IPIO 2518, TAM and accumulator 2512, TC 2513 providing a "Test Controller" operating as a dedicated hardware used for sending traffic back and forth, NVME 2514 providing a "Nonvolatile Memory Express Engine" to transfer large volumes of data bulk data, and NVME accumulator 2511.

CMI interface 2509 interfaces to the NVME 2514 and also to the FMI controller 2503 providing a "Far Memory Interface" connecting the 2LM controller 2540, the 2LM accumulators 2560, and the NVME to the external far memory connected to the architecture 2501.

Within the FMI controller 2503 there is depicted the FMI transfer layers 2504, the FMI link layer 2506, the FMI response logic 2507, and the FMI DFX responder 2508, with the FMI controller 2503 being operating on behalf of the FMI physical interface 2502.

Multiple WIO2 interfaces are provided at each of elements 2505, 2510, 2515, and 2520 corresponding to WIO2 interfaces D0-1, D2-3, D4-5, and D6-7, each communicatively interfaced with the write data buffer and DFX logic 2525 providing a 4 KB buffer. MC DFX accumulators 2530 are provided and shown here as interfaced with the four MLM (Multi-Level Memory) controllers 2535, each in turn being interfaced with the 2LM controller 2540, the FMI interface 2550, the CMI interface 2545, and the CMI accumulators 2565.

More particularly, there is depicted here a specific routing through the fabric that is only for the far memory controller 2503 without permitting any transaction to traverse through the 2LM controller 2540. Such a path is provided for the purposes of efficiency where there is a large bulk transfer necessary to be issued directly to the far memory controller 2503 without the longer indirect route through the 2LM controller 2540 which requires checking for near memory cache hits. In such a way, a bypass path is established from the NVMe 2514 through the CMI interface 2509 and onto the FMI controller 2503.

The Non-Volatile Memory express (NVMe) 2514 permits large data transfers, such as a series of transactions performing continuous writes to the far memory which may be instructed to route through the NVMe 2514, thus bypassing the longer route through the 2LM controller 2540 for the sake of speed. With such functionality available, it is necessary to test such a route for the devices under test at the time of manufacture.

It is therefore in accordance with such embodiments that the test controller 2513 issues transactions directed toward the NVMe 2514 bypass, which causes them to completely ignore the 2LM controller route and thus, there is neither a cache hit or a cache miss required, as the transactions never look to determine whether the near memory is capable of servicing such transactions. Rather, the transactions are issued directly to the FMI controller 2503 via the NVMe 2514 bypass, and thus testing the route and components between the NVMe 2514 and the FMI controller 2503.

According to such an embodiment, the TAM accumulators 2512 will collect any test signals and test signatures emanating from the test controller 2513 and the NVME accumulators 2511 will collect any test signals and test signatures that traverse over the NVMe 2514 bypass. Additionally, the signal accumulation logic 2508 will collect signatures and test signals arriving at or emanating from the FMI controller 2503. Such signatures and test signals may then later be compared with a known good sample to verify correct operation of the CPU die undergoing test.

Figure 26:
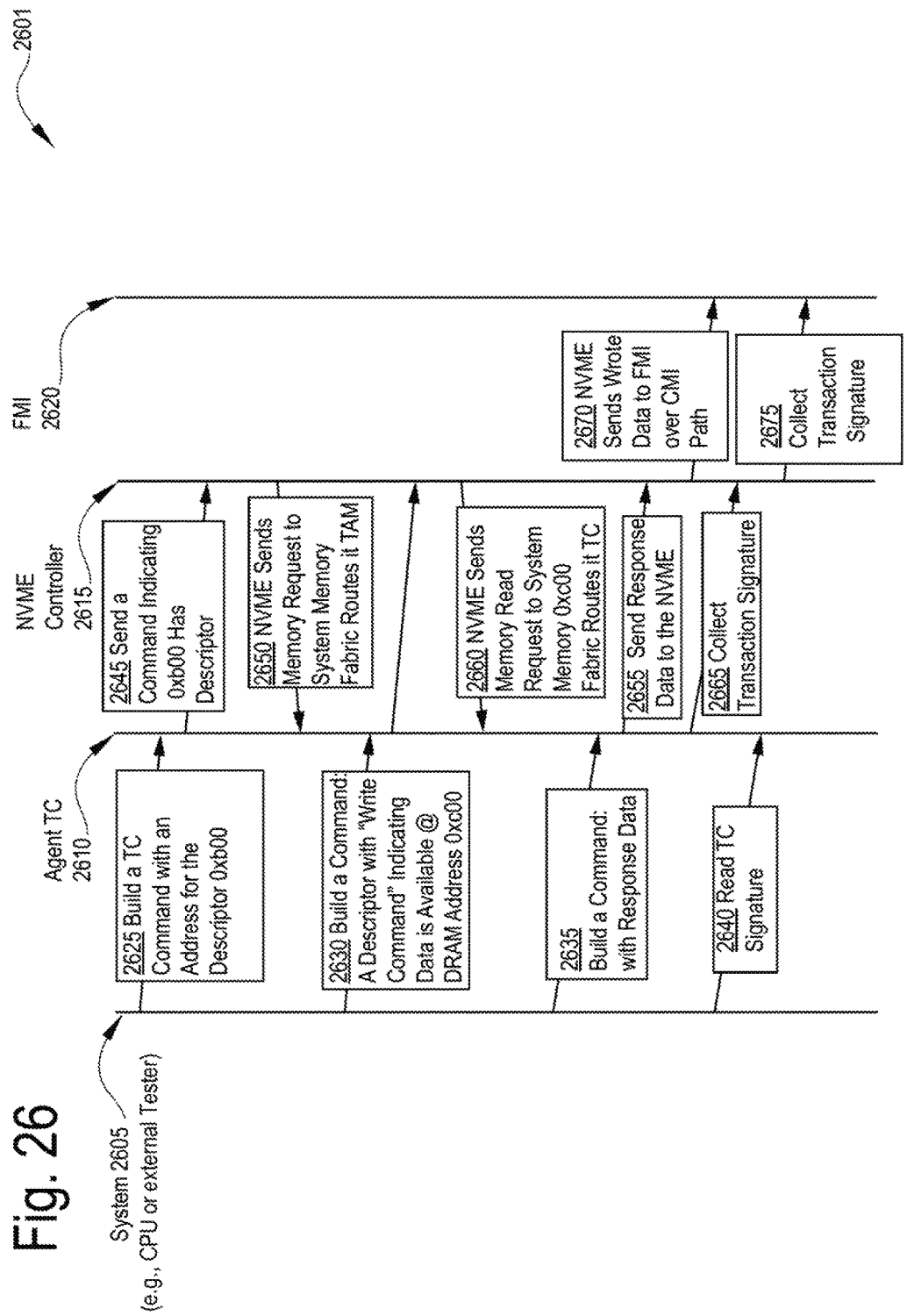
FIG. 26 depicts an exemplary transaction protocol between a test controller agent and an NVME controller for a write command in accordance with described embodiments.

FIG. 26 depicts an exemplary transaction protocol 2601 between a test controller agent and an NVME controller for a write command in accordance with described embodiments.

According to described embodiments, the transaction protocol 2601 establishes handshaking procedures between the test agent test controller 2610 (also referred to as Test Agent Module or "TAM") and the NVME controller 2615 and the Far Memory Interface FMI 2620 or an FMI controller, all operating within system 2605.

For instance, for transactions directed toward the FMI interface 2620 through the NVME controller 2615 therefore bypassing the 2LM controller, there needs to be an address specifying where transaction is to go and where to start the data transfer or an address to which the data is to be transferred.

The descriptor indicates that information is being provided for a specified target which is indicated by the descriptor. The description additionally defines what kind of transaction or operation included within the transaction as well as a memory address to which the transaction is to write or from which the transaction is to read or fetch the requested data.

Beginning at the top left with system 2605 (e.g., such as a CPU core module or an external tester or any agent which generates transactions on behalf of the system), the transaction protocol 2601 initiates from the system 2605 instructions to build a test controller (TC) command with an address for the descriptor 0xb00 at element 2625. Thus, the test controller 2610 sends the non-volatile memory express controller 2615 a command letting the NVME controller 2615 know that it may go and retrieve the information from descriptor 0xb00.

The built command then proceeds to the Agent test controller 2610 which in turn receives the previously built command and then proceeds to send a command indicating that 0xb00 has the descriptor as shown at block 2645. The transaction protocol then proceeds to NVME controller 2615 which responsively sends a memory request to system memory which is routed by the fabric to the Test Agent Module (TAM) as depicted by block 2650.

At block 2630, system 2605 is shown as building a command having a descriptor with a "write command" indicating data is available at the DRAM address 0xc00. The built command is communicated to agent test controller 2610 which then relays the built command forward to the NVME controller 2615 which responds by sending a memory read request to the system memory 0xc00 and the fabric routes the memory read request to the test controller as indicated at block 2660.

As indicated by block 2635, system 2605 then proceeds to build a command with response data which is communicated to the agent test controller 2610 which then in turn sends the response data to the NVME as indicated by block 2655 with the NVME controller 2615 then in turn sending the wrote data to the FMI (Far Memory Interface) over the Converged Memory Interface (CMI) path as indicated by block 2670.

System 2605 then reads the test controller signature as indicated by block 2640 and the agent test controller 2610 then collects the transaction signature at block 2665 which is communicated through the NVME controller 2615 which similarly collects the transaction signature at block 2675 which is communicated to the Far memory interface (FMI) 2620, thus ending the transaction protocol 2601.

Normally transactions would not route to back to the test controller when the system 2605 is under normal operational mode; however, while the system 2605 is in test mode the responsive transactions are routed back to the agent test controller 2610 as part of the test sequence, with such responsive transactions then being evaluated at the test controller along with collected test signatures and other data such as response payloads which are returned to the test controller.

Figure 27:
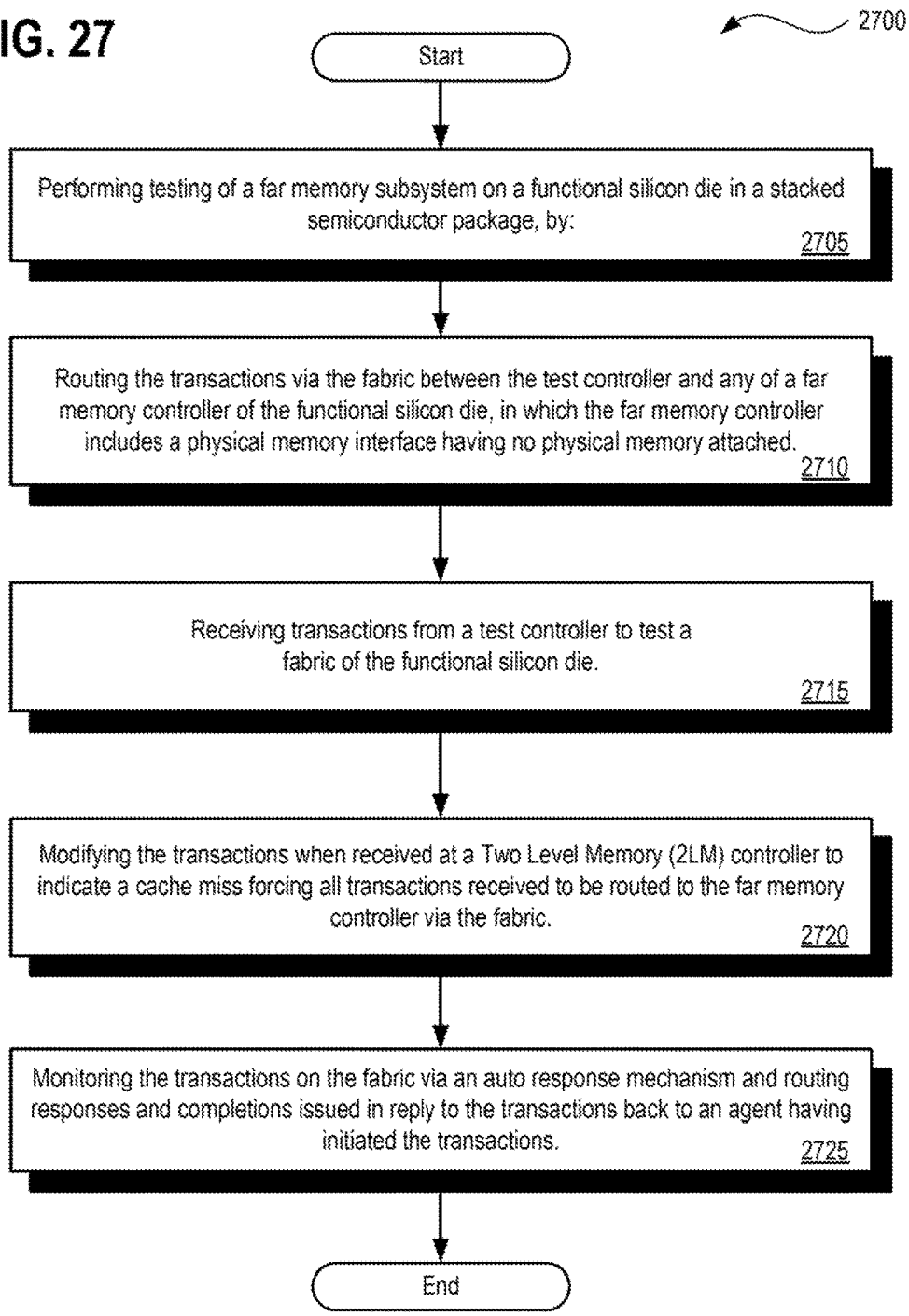
FIG. 27 is a flow diagram illustrating a method for implementing testing of a far memory subsystem within two-level memory (2LM) stacked die subsystems in accordance with described embodiments.

FIG. 27 is a flow diagram illustrating a method 2700 for implementing testing of a far memory subsystem within two-level memory (2LM) stacked die subsystems in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 1100 may be utilized in a variety of combinations.

At block 2705 the method 2700 for implementing testing of a far memory subsystem within two-level memory (2LM) stacked die subsystems begins with: performing testing of a far memory subsystem on a functional silicon die in a stacked semiconductor package, by the following operations.

At block 2710 the method includes routing the transactions via the fabric between the test controller and any of a far memory controller of the functional silicon die, in which the far memory controller includes a physical memory interface having no physical memory attached.

At block 2715 the method includes receiving transactions from a test controller to test a fabric of the functional silicon die.

At block 2720 the method includes modifying the transactions when received at a Two Level Memory (2LM) controller to indicate a cache miss forcing all transactions received to be routed to the far memory controller via the fabric.

At block 2720 the method includes monitoring the transactions on the fabric via an auto response mechanism and routing responses and completions issued in reply to the transactions back to an agent having initiated the transactions.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is a stacked semiconductor package, including: a processor functional silicon die at a first layer of the stacked semiconductor package; one or more memory dies forming a corresponding one or more memory layers of the stacked semiconductor package; a plurality of Through Silicon Vias (TSVs) formed through the one or more memory dies, in which each of the plurality of TSVs traverse through the one or more memory layers to the processor functional silicon die at the first layer of the stacked semiconductor package; a plurality of physical memory interfaces electrically interfacing the one or more memory dies to the processor functional silicon die at the first layer through the memory layers via the plurality of TSVs; a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV.

According to another embodiment of the stacked semiconductor package, each TSV forms a physical memory path providing a continuous electrical interface from one of the memory dies through the one or more memory layers to the processor functional silicon die; and in which each memory signal path forms a logical memory path traversing one of the physical memory paths through the TSVs; in which one or more of the memory signal paths may be re-routed along the redundant physical memory interface using the redundant TSV; and in which a defective physical memory path associated with a defective TSV may be bypassed by re-routing the memory signal path to functional physical signal path associated with a functional TSV or the redundant physical memory interface associated with the redundant TSV.

According to another embodiment of the stacked semiconductor package, a re-routing string computed and permanently written to the stacked semiconductor package at a time of manufacture is used to reroute the memory signal path from the defective physical memory interface at the defective TSV to the functional signal path traversing the redundant TSV.

According to another embodiment of the stacked semiconductor package, the memory signal path re-routed from the defective physical memory interface to the functional signal path carries memory address and data traffic from the memory dies between one of the memory dies and the processor functional silicon die.

According to another embodiment, the stacked semiconductor package further includes: a package substrate layer forming a bottom layer of the stacked semiconductor package; and in which the processor functional silicon die at the first layer of the stacked semiconductor package is affixed to the package substrate layer.

According to another embodiment of the stacked semiconductor package, a first memory die forms a first memory layer positioned atop the processor functional silicon die layer; and in which a second memory die forms a second memory layer positioned atop the first memory layer.

According to another embodiment of the stacked semiconductor package, the second memory die is electrically interfaced to the processor functional silicon die through the plurality of TSVs which traverse through the second first memory die at the first memory layer.

According to another embodiment of the stacked semiconductor package, the stacked semiconductor package embodies a Two-Level-Memory (2LM) stacked die subsystem having one or more memory silicon dies forming the one or more memory layers and one or more functional silicon dies formed from a System On a Chip (SOC) functional silicon die having the processor functional silicon die embedded therein or a logic functional silicon die forming the processor functional silicon die or a CPU die embodying the processor functional silicon die at the first layer of the stacked semiconductor package.

According to another embodiment of the stacked semiconductor package, the first layer is formed from a System On a Chip (SOC) functional silicon die manufactured by the manufacturer of the stacked semiconductor package; and in which a second layer is formed from a DRAM memory silicon die manufactured by a third party and acquired by the manufacturer of the stacked semiconductor package and integrated into the stacked semiconductor package by the manufacturer of the stacked semiconductor package.

According to another embodiment of the stacked semiconductor package, at least one of the memory dies are formed from a phase change memory die.

According to another embodiment of the stacked semiconductor package, the processor functional silicon die includes a System On a Chip (SOC) functional silicon die having a secured fuse block embedded therein; and in which a re-routing string used to reroute the memory signal path from the defective physical memory interface to the functional signal path is permanently written into the secured fuse block of the SOC functional silicon die at the time of manufacture of the stacked semiconductor package.

According to another embodiment of the stacked semiconductor package, the re-routing string is downloaded from the secured fuse block into registers of the SOC functional silicon die at every cold boot of the stacked semiconductor package.

According to another embodiment, there is a method for re-routing a memory signal path from a faulty Through Silicon Via (TSV) in a stacked semiconductor package, by: reading a re-routing string from TSV repair registers of a processor functional silicon die, in which the processor functional silicon die forms a first layer of the stacked semiconductor package; sending the re-routing string from the processor functional silicon die to one or more memory dies via a secure on-board connection within the stacked semiconductor package, in which the one or more memory dies form a corresponding one or more memory layers of the stacked semiconductor package; programming muxes at each of a plurality of TSVs formed through the one or more memory dies with the re-routing string, in which each of the plurality of TSVs traverse through the one or more memory layers to the processor functional silicon die at the first layer of the stacked semiconductor package; and re-routing a memory signal path from a defective TSV to a redundant TSV, the redundant TSV forming a redundant physical memory interface traversing through the memory layers to the processor functional silicon die at the first layer.

According to another embodiment of the method, the re-routing string from the processor functional silicon die to the one or more memory dies via the secure on-board connection within the stacked semiconductor package includes sending the re-routing string over a two wire serial interface.

According to another embodiment of the method, the two wire interface includes a clock and a serial data interface from the processor functional silicon die to the one or more memory dies.

According to another embodiment of the method, the two wire interface transmits the re-routing string via a serial data one bit at a time, with one bit transmitted per clock cycle.

According to another embodiment, the method further includes: storing the re-routing string within a detour registers at each of the one or more memory dies; and in which programming the muxes at each of a plurality of TSVs with the re-routing string includes programming the muxes at each of the plurality of TSVs at each of the one or more memory dies from the detour registers at each of the one or more memory dies having the re-routing string stored therein.

According to another embodiment of the method, the secure on-board connection includes a side band interface the stacked semiconductor package which is inaccessible external to the stacked semiconductor package such that any data flow transferred through the secure onboard connection cannot be derived from outside of the stacked semiconductor package.

According to another embodiment of the method, the TSVs form TSV micro pillars oriented vertically through the entire stack of the one or more memory dies, electrically interfacing the processor functional silicon die with the one or more memory dies of the stacked semiconductor package.

According to another embodiment of the method, the processor functional silicon die includes a System On a Chip (SOC) functional silicon die having a secured fuse block embedded therein; and in which the re-routing string used for re-routing the memory signal path from the defective TSV to the redundant TSV is permanently written into the secured fuse block of the SOC functional silicon die at the time of manufacture of the stacked semiconductor package.

According to another embodiment, the method further includes: downloading the re-routing string from the secured fuse block into registers of the SOC functional silicon die at every cold boot of the stacked semiconductor package; and shifting the re-routing string from the registers of the SOC functional silicon die to detour registers at the one or more memory dies via a secure on-board connection of the stacked semiconductor package as part of the cold boot process for the stacked semiconductor package.

According to another embodiment of the method, the stacked semiconductor package embodies a Two-Level-Memory (2LM) stacked die sub-system having one or more memory silicon dies forming the one or more memory layers and one or more functional silicon dies formed from a System On a Chip (SOC) functional silicon die having the processor functional silicon die embedded therein or a logic functional silicon die forming the processor functional silicon die or a CPU die embodying the processor functional silicon die at the first layer of the stacked semiconductor package.

According to yet another embodiment there is an electronics module including: a printed circuit board; a stacked semiconductor package electrically interfaced to the printed circuit board; and in which the stacked semiconductor package includes: (i) a substrate layer; (ii) a processor functional silicon die at a first layer of the stacked semiconductor package atop the substrate layer; (iii) one or more memory dies forming a corresponding one or more memory layers of the stacked semiconductor package; (iv) a plurality of Through Silicon Vias (TSVs) formed through the one or more memory dies, in which each of the plurality of TSVs traverse through the one or more memory layers to the processor functional silicon die at the first layer of the stacked semiconductor package; (v) a plurality of physical memory interfaces electrically interfacing the one or more memory dies to the processor functional silicon die at the first layer through the memory layers via the plurality of TSVs; (vi) a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV.

According to another embodiment of the electronics module, the electronics module includes one of: a drone and robot control electronics module; a smartphone electronics module; a tablet electronics module; a gesture control electronics module for a computer; a 3D photography electronics module; a 3D immersive gaming electronics module; a face recognition electronics module to perform face recognition base security in lieu of alphanumerical passwords; an image capture device electronics module having one or more optical and Complementary metal-oxide-semiconductor (CMOS) components affixed to the printed circuit board as the top side or bottom side components; a depth sensing camera electronics module to perform any of stereoscopic imaging depth sensing, coded light depth sensing, or laser time of flight depth sensing.

According to another embodiment of the electronics module, the electronics module includes is embedded within a wearable technology to be worn as one of: a clothing item; sports attire; a shoe; fashion electronics to be worn as a clothing item or an accessory; tech togs to be worn as a clothing item or an accessory; or fashionable technology to be worn as a clothing item or an accessory.

According to alternatively described embodiments, there is a stacked semiconductor package, including: a functional silicon die having embedded thereupon a Wide Input/Output 2 (WIO2) interface, the functional silicon die forming a first layer of the stacked semiconductor package; two or more memory dies forming a corresponding two or more memory layers of the stacked semiconductor package; a plurality of Through Silicon Vias (TSVs) formed through the two or more memory dies, in which each of the plurality of TSVs traverse through the two or more memory layers to the functional silicon die at the first layer of the stacked semiconductor package via the WIO2 interface of the functional silicon die; a test port interface to receive test signals from an external tester and route the test signals through steering logic communicably interfaced with the two or more memory dies; in which the steering logic is to shift data into the two or more memory dies through the plurality of TSVs pursuant to the received test signals from the external tester; and in which the steering logic is to further shift the data out of the two or more memory dies as output data and return the output data to the external tester via the test port interface.

According to another embodiment of the stacked semiconductor package, the test port interface includes a high speed test interface connected with the external tester; in which the high speed test interface includes a plurality of buffers having an I/O speed matching an I/O speed of the two or more memory dies.

According to another embodiment of the stacked semiconductor package, the steering logic to shift the data out of the two or more memory dies as output data includes the steering logic to shift the data out of the two or more memory dies pursuant to the received test signals from the external tester without passing the output data through any of the plurality of TSVs; and in which the output data is captured as an output signal at the memory layers.

According to another embodiment of the stacked semiconductor package, the steering logic to return the output data to the external tester via the test port interface includes the steering logic to return the output signal to the external tester for analysis and comparison to a known good signal.

According to another embodiment of the stacked semiconductor package, the steering logic to return the output data to the external tester via the test port interface includes the steering logic to return the output signal to the external tester for analysis to identify a faulty TSV among the plurality of TSVs; and in which the steering logic is to further receive a new routing string from the external tester.

According to another embodiment of the stacked semiconductor package, the test port interface loads the new routing string into the two or more memory dies to bypass the faulty TSV pursuant to instruction signals from the external tester; and in which the test port is to receive new test signals from the external tester to repeat a test sequence using the new routing string loaded into the two or more memory dies.

According to another embodiment of the stacked semiconductor package, the steering logic to shift data into the two or more memory dies through the plurality of TSVs pursuant to the received test signals from the external tester includes the steering logic to shift data into the two or more memory dies using control signals.

According to another embodiment of the stacked semiconductor package, the steering logic to shift data into the two or more memory dies through the plurality of TSVs pursuant to the received test signals from the external tester includes the steering logic to shift data into one of the two memory dies during a first iteration of a test sequence and to shift data into a second one of the two memory dies during a second iteration of the test sequence.

According to another embodiment of the stacked semiconductor package, the steering logic to shift data into the two or more memory dies through the plurality of TSVs pursuant to the received test signals from the external tester includes the steering logic shift data into one of the two memory dies and into a specified plurality of cells of the one memory die by uniquely addressing the one memory die pursuant to the received test signals.

According to another embodiment of the stacked semiconductor package, the steering logic communicably links the test port interface with each of the two or more memory dies through a communications traffic of the functional silicon die.

According to another embodiment of the stacked semiconductor package, the test port interface is embedded upon the functional silicon die.

According to another embodiment of the stacked semiconductor package, the test port is co-located with a Double Data Rate (DDR) memory interface of the functional silicon die.

According to another embodiment, the stacked semiconductor package further includes: a plurality of physical memory interfaces electrically interfacing the two or more memory dies to the functional silicon die at the first layer through the memory layers via the plurality of TSVs.

According to another embodiment, the stacked semiconductor package further includes: a redundant physical memory interface formed by a redundant TSV traversing through the memory layers to the functional silicon die at the first layer through which to reroute a memory signal path from a defective physical memory interface at a defective TSV to a functional signal path traversing the redundant TSV.

According to another embodiment of the stacked semiconductor package, the stacked semiconductor package embodies a two-level memory (2LM) stacked die subsystem.

According to another embodiment of the stacked semiconductor package, the 2LM stacked die sub-system is formed from a first memory die affixed atop a functional silicon die at a bottom layer of the stacked semiconductor package and further formed from a second memory die affixed atop the first memory die.

According to another embodiment of the stacked semiconductor package, a re-routing string computed by the external tester and permanently written to the stacked semiconductor package at a time of manufacture is used to reroute a memory signal path from a defective physical memory interface at an identified defective TSV to a functional signal path traversing a redundant TSV; in which functional silicon die includes a System On a Chip (SOC) functional silicon die manufactured by the manufacturer of the stacked semiconductor package; and in which the re-routing string used to reroute the memory signal path from the defective physical memory interface to the functional signal path is permanently written into a secured fuse block of the SOC functional silicon die at the time of manufacture of the stacked semiconductor package.

According to another embodiment of the stacked semiconductor package, the first layer is formed from a System On a Chip (SOC) functional silicon die manufactured by the manufacturer of the stacked semiconductor package; and in which a second layer is formed from one of a DRAM memory silicon die or a phase change memory die manufactured by a third party and acquired by the manufacturer of the stacked semiconductor package and integrated into the stacked semiconductor package by the manufacturer of the stacked semiconductor package.

According to yet another embodiment, there is a method for identifying a faulty Through Silicon Via (TSV) in a stacked semiconductor package, in which the method includes: executing a wake-up sequence on a functional silicon die having embedded thereupon a Wide Input/Output 2 (WIO2) interface, the functional silicon die forming a first layer of the stacked semiconductor package; in which the stacked semiconductor package includes two or more memory dies forming a corresponding two or more memory layers of the stacked semiconductor package and a plurality of Through Silicon Vias (TSVs) formed through the two or more memory dies, in which each of the plurality of TSVs traverse through the two or more memory layers to the functional silicon die at the first layer of the stacked semiconductor package via the WIO2 interface of the functional silicon die; receiving test signals at a test port interface of the functional silicon die from an external tester and routing the test signals through steering logic communicably interfaced with the two or more memory dies; shifting data, via the steering logic, into the two or more memory dies through the plurality of TSVs pursuant to the received test signals from the external tester; and shifting the data, via the steering logic, out of the two or more memory dies as output data and returning the output data to the external tester via the test port interface.

According to another embodiment, the method further includes: returning the output data to the external tester via the test port interface for analysis to identify a faulty TSV among the plurality of TSVs; receiving a new routing string from the external tester; loading the new routing string into the two or more memory dies to bypass the faulty TSV pursuant to instruction signals from the external tester; and receiving new test signals from the external tester to repeat a test sequence using the new routing string loaded into the two or more memory dies.

According to another embodiment, the method further includes: storing the re-routing string within detour registers at each of the one or more memory dies; and programming muxes at each of the plurality of TSVs with the re-routing string from the detour registers at each of the one or more memory dies at a subsequent boot of the stacked semiconductor package.

According to yet another embodiment, there is an electronics module including: a printed circuit board; a stacked semiconductor package electrically interfaced to the printed circuit board; and in which the stacked semiconductor package includes: (i) a substrate layer; (ii) a functional silicon die having embedded thereupon a Wide Input/Output 2 (WIO2) interface, the functional silicon die forming a first layer of the stacked semiconductor package positioned atop the substrate layer; (iii) two or more memory dies forming a corresponding two or more memory layers of the stacked semiconductor package; (iv) a plurality of Through Silicon Vias (TSVs) formed through the two or more memory dies, in which each of the plurality of TSVs traverse through the two or more memory layers to the functional silicon die at the first layer of the stacked semiconductor package via the WIO2 interface of the functional silicon die; and (v) a test port interface to receive test signals from an external tester and route the test signals through steering logic communicably interfaced with the two or more memory dies; in which the steering logic is to shift data into the two or more memory dies through the plurality of TSVs pursuant to the received test signals from the external tester; and in which the steering logic is to further shift the data out of the two or more memory dies as output data and return the output data to the external tester via the test port interface.

According to another embodiment, the electronics module includes one of: a drone and robot control electronics module; a smartphone electronics module; a tablet electronics module; a gesture control electronics module for a computer; a 3D photography electronics module; a 3D immersive gaming electronics module; a face recognition electronics module to perform face recognition base security in-lieu of alphanumerical passwords; an image capture device electronics module having one or more optical and Complementary metal-oxide-semiconductor (CMOS) components affixed to the printed circuit board as the top side or bottom side components; a depth sensing camera electronics module to perform any of stereoscopic imaging depth sensing, coded light depth sensing, or laser time of flight depth sensing.

According to another embodiment, the electronics module is embedded within a wearable technology to be worn as one of: a clothing item; sports attire; a shoe; fashion electronics to be worn as a clothing item or an accessory; tech togs to be worn as a clothing item or an accessory; or fashionable technology to be worn as a clothing item or an accessory.

According to another alternative embodiment, there is a stacked semiconductor package, including: a functional silicon die; a test controller having signature accumulation logic embedded therein; a fabric to route transactions between the test controller and any of a plurality of near memory controllers of the functional silicon die; in which each of the plurality of near memory controllers include a physical memory interface having no physical memory attached; and a buffer embedded on the functional silicon die to operate as a cache for the transactions; a Two Level Memory (2LM) controller having logic to modify received transactions to indicate a cache hit forcing all received transactions to be routed to one of the near memory controllers via the fabric; an auto response mechanism to observe the transactions on the fabric and route responses and completions issued in reply to the transactions back to an agent having initiated the transactions; and a configurable mux to route the transactions to the cache or to the auto response mechanism.

According to another embodiment of the stacked semiconductor package, the 2LM controller further includes configurable logic to route the transactions to a specified one of the plurality of near memory controllers via the fabric.

According to another embodiment of the stacked semiconductor package, the configurable logic of the 2LM controller routes the transactions to the specified one of the plurality of near memory controllers based on a programmable address mapping based on one of configurable address ranges or 1:1 address mappings.

According to another embodiment of the stacked semiconductor package, each of the plurality of near memory controllers emulate the physical memory which is not attached to the physical memory interfaces; and in which the transactions perform bare functional silicon die testing for the functional silicon die including testing the fabric's routing of transactions between the test controller and the plurality of near memory controllers.

According to another embodiment of the stacked semiconductor package, the buffer is embodied within a 4 kilobyte (KB) Write Data Buffer (WDB); and in which the 4 KB WDB is configured as a near memory cache during when test mode is enabled for the functional silicon die.

According to another embodiment of the stacked semiconductor package, the configured 4 KB WDB provides a 32 line cache.

According to another embodiment of the stacked semiconductor package, one or more of the transactions write to the cache provided by the buffer embedded on the functional silicon die based on the configuration of the configurable mux; in which the 2LM controller modifies the one or more transactions to indicate a cache hit; and in which one of the near memory controllers read from the cache provided by the buffer embedded on the functional silicon die and issue a response with the cache read to the agent having initiated the one or more transactions.

According to another embodiment of the stacked semiconductor package, one or more of the transactions include a write transaction directed toward one of the plurality of near memory controllers; in which the auto response mechanism terminates the write transaction as a posted transaction without responding to the agent having initiated the one or more transactions.

According to another embodiment of the stacked semiconductor package, one or more of the transactions include a read transaction directed toward one of the plurality of near memory controllers; in which the auto response mechanism generates pseudorandom data responsive to the one or more read transactions and issues a response with the generated pseudorandom data to the agent having initiated the one or more transactions.

According to another embodiment of the stacked semiconductor package, the agent having initiated the one or more transactions includes one of: (i) an external tester communicably interfaced with the functional silicon die via the test controller; (ii) a processor core embedded within the functional silicon die; or (iii) the test controller.

According to another embodiment of the stacked semiconductor package, the test controller having the signature accumulation logic embedded therein collects signals from the fabric as the transactions traverse the fabric between the test controller and the plurality of near memory controllers; and in which the test controller is to further compare the collected signals with known good test signatures to validate correct functioning of the functional silicon die.

According to another embodiment of the stacked semiconductor package, the functional silicon die forms a first layer of the stacked semiconductor package; in which the stacked semiconductor package further includes two or more memory dies forming 2LM stacked die sub-system within a corresponding two or more memory layers of the stacked semiconductor package; in which the 2LM stacked die sub-system is formed from the first memory die affixed atop the functional silicon die at a bottom layer of the stacked semiconductor package and further formed from the second memory die affixed atop the first memory die; and in which the functional silicon die at the first layer embodies a System On a Chip (SOC) functional silicon die manufactured by the manufacturer of the stacked semiconductor package.

According to another embodiment there is a method for performing bare die testing on a functional silicon die in a stacked semiconductor package, in which the method includes: receiving transactions from a test controller to test a fabric of the functional silicon die; routing the transactions via the fabric between the test controller and any of a plurality of near memory controllers of the functional silicon die; in which each of the plurality of near memory controllers include a physical memory interface having no physical memory attached; configuring a buffer embedded on the functional silicon die to operate as a cache for the transactions; modifying the transactions when received at a Two Level Memory (2LM) controller to indicate a cache hit forcing all transactions received by any one of the plurality of near memory controllers to be routed to one of the near memory controllers via the fabric; monitoring the transactions on the fabric via an auto response mechanism and routing responses and completions issued in reply to the transactions back to an agent having initiated the transactions; and routing the transactions to either the cache or to the auto response mechanism through a configurable mux.

According to another embodiment of the method, the 2LM controller further includes configurable logic to route the transactions to a specified one of the plurality of near memory controllers via the fabric; and in which the method further includes routing the transactions via the configurable logic of the 2LM controller to the specified one of the plurality of near memory controllers based on a programmable address mapping, the programmable address mapping being based on one of configurable address ranges or 1:1 address mappings.

According to another embodiment, the method further includes: emulating the physical memory which is not attached to the physical memory interface at each of the plurality of near memory controllers; and performing bare functional silicon die testing for the functional silicon die using the transactions, in which the bare functional silicon die testing includes testing the fabric's routing of the transactions between the test controller and the plurality of near memory controllers.

According to another embodiment of the method, the buffer is embodied within a 4 kilobyte (KB) Write Data Buffer (WDB); and in which the 4 KB WDB is configured as a near memory cache during when test mode is enabled for the functional silicon die.

According to yet another alternative embodiment, there is a stacked semiconductor package, including: a functional silicon die having embodied therein a System On a Chip (SOC); a test controller having signature accumulation logic embedded therein; a fabric to route transactions between the test controller and any of a plurality of near memory controllers of the functional silicon die; in which each of the plurality of near memory controllers include a physical memory interface having a Dynamic Random Access Memory (DRAM) module or a Phase Change Memory (PCM) module attached thereto; and a Two Level Memory (2LM) controller having logic to modify received transactions to indicate a cache hit forcing all received transactions to be routed to one of the near memory controllers via the fabric; the 2LM controller further including logic to route the modified received transactions to a specified one of the plurality of near memory controllers based on programmable address mapping; in which the one specified near memory controller having received the modified transactions is to either: (i) write data accompanying posted transactions to the DRAM or PCM module attached thereto without further response to the agent having originated the transactions or (ii) read non-posted transactions from the DRAM or PCM module attached thereto based on a specified address accompanying the non-posted transaction and respond to the agent having originated the transactions with data read from the DRAM or PCM module.

According to another embodiment of the stacked semiconductor package, the one specified near memory controller having received the modified transactions to either: (i) write the data accompanying the posted transactions includes the near memory controller to write data to a range of addresses specified with the transactions via a beginning address and an ending address or (b) read data from the range of addresses specified with the transactions via the beginning and ending addresses.

According to another embodiment of the stacked semiconductor package, the beginning and ending addresses are specified by the test controller as part of performing functional silicon die testing including a test of the fabric's routing of the transactions between the test controller and the plurality of near memory controllers.

According to another embodiment of the stacked semiconductor package, the agent having initiated the one or more transactions includes one of: (i) an external tester communicably interfaced with the functional silicon die via the test controller; (ii) a processor core embedded within the functional silicon die; or (iii) the test controller.

According to another embodiment of the stacked semiconductor package, the test controller having the signature accumulation logic embedded therein collects signals from the fabric as the transactions traverse the fabric between the test controller and the plurality of near memory controllers; and in which the test controller is to further compare the collected signals with known good test signatures to validate correct functioning of the functional silicon die.

According to another embodiment, the stacked semiconductor package further includes: a Converged Memory Interface (CMI) having a signal accumulator embedded therein to collect test signatures; an In Die interface Port (IDP) having a signal accumulator embedded therein to collect test signatures; a 2LM controller having a signal accumulator embedded therein to collect test signatures; a Far Memory Interface (FMI) controller having a signal accumulator embedded therein to collect test signatures; in which the collected test signatures are forwarded to the test controller; and in which the test controller is to further compare the collected signals with known good test signatures to validate correct functioning of the functional silicon die.

According to yet another embodiment, there is a method for performing testing on a functional silicon die in a stacked semiconductor package, in which the method includes: receiving transactions from a test controller to test a fabric of the functional silicon die, the functional silicon die having embodied therein a System On a Chip (SOC); routing the transactions via the fabric between the test controller and any of a plurality of near memory controllers of the functional silicon die; in which each of the plurality of near memory controllers include a physical memory interface having a Dynamic Random Access Memory (DRAM) module or a Phase Change Memory (PCM) module attached thereto; modifying the transactions when received at a Two Level Memory (2LM) controller to indicate a cache hit forcing all transactions received by any one of the plurality of near memory controllers to be routed to one of the near memory controllers via the fabric; routing the modified received transactions from the 2LM controller to a specified one of the plurality of near memory controllers based on programmable address mapping; and in which the one specified near memory controller having received the modified transactions is to either: (i) write data accompanying posted transactions to the DRAM or PCM module attached thereto without further response to the agent having originated the transactions or (ii) read non-posted transactions from the DRAM or PCM module attached thereto based on a specified address accompanying the non-posted transaction and respond to the agent having originated the transactions with data read from the DRAM or PCM module.

According to another embodiment of the method, the one specified near memory controller having received the modified transactions to either: (i) write the data accompanying the posted transactions includes the near memory controller to write data to a range of addresses specified with the transactions via a beginning address and an ending address or (b) read data from the range of addresses specified with the transactions via the beginning and ending addresses.

According to another embodiment of the method, the test controller having the signature accumulation logic embedded therein collects signals from the fabric as the transactions traverse the fabric between the test controller and the plurality of near memory controllers; and in which the test controller is to further compare the collected signals with known good test signatures to validate correct functioning of the functional silicon die.

According to alternatively described embodiments, there is a stacked semiconductor package, including: a functional silicon die; a test controller having signature accumulation logic embedded therein; a fabric to route transactions between the test controller and a far memory controller of the functional silicon die; in which the far memory controller includes a physical memory interface having no physical memory attached; a Two Level Memory (2LM) controller having logic to modify received transactions to indicate a cache miss forcing all received transactions to be routed to the far memory controller via the fabric; and an auto response mechanism to observe the transactions on the fabric and route responses and completions issued in reply to the transactions back to an agent having initiated the transactions.

According to another embodiment of the stacked semiconductor package, the test controller interacts with a far memory sub-system embodied within the functional silicon die having the far memory controller operating therein; in which the test controller initiates the transactions to the far memory controller; and in which the transactions initiated by the test controller are routed to the far memory controller via one of the 2LM controller or via a Non-Volatile Memory express (NVMe) bypass path which routes the transactions to the far memory controller without traversing the 2LM controller.

According to another embodiment, the stacked semiconductor package further includes: a Non-Volatile Memory express (NVMe) bypass path to optionally route the transactions to the far memory controller without traversing the 2LM controller the direction of the test controller; and an NVMe accumulator to collect test signals and/or test signatures for the transactions which traverse the NVMe bypass path between the test controller having initiated the transactions and the far memory controller.

According to another embodiment of the stacked semiconductor package, the 2LM controller further includes signature accumulation logic to collect test signals and/or test signatures for the transactions which traverse the 2LM controller between the agent having initiated the transactions and the far memory controller.

According to another embodiment of the stacked semiconductor package, the 2LM controller is to further return any collected test signals and/or test signatures to the test controller.

According to another embodiment of the stacked semiconductor package, the auto response mechanism emulates the physical memory which is not attached to the physical memory interface of the far memory controller.

According to another embodiment, the stacked semiconductor package further includes: a plurality of near memory controllers, each having a physical near memory interface without any near memory components attached thereto; and in which the transactions perform bare functional silicon die testing for the functional silicon die having no near memory components attached thereto, in which the bare functional silicon die testing includes testing the fabric's routing of transactions between the test controller and the far memory controller.

According to another embodiment, the stacked semiconductor package further includes: a plurality of near memory controllers, each having a physical near memory interface having Dynamic Random Access Memory (DRAM) components attached thereto as near memory for the stacked semiconductor package; in which the transactions perform functional silicon die testing for the functional silicon die subsequent to having the DRAM components attached to the physical near memory interfaces; and in which the functional silicon die testing includes testing the fabric's routing of transactions between the test controller and the far memory controller.

According to another embodiment of the stacked semiconductor package, the 2LM controller modifies the received transactions to indicate a cache miss without checking to determine whether or not data requested by the received transaction resides within near memory of the stacked semiconductor package; and in which the 2LM controller modifies forward the received transactions to the far memory controller based on the indication of the cache miss for each of the received transactions.

According to another embodiment of the stacked semiconductor package, one or more of the transactions include a write transaction directed toward the far memory controller; and in which the auto response mechanism terminates the write transaction as a posted transaction without responding to the agent having initiated the one or more transactions.

According to another embodiment of the stacked semiconductor package, one or more of the transactions include a read transaction directed toward the far memory controller; and in which the auto response mechanism generates pseudorandom data responsive to the one or more read transactions and issues a response with the generated pseudorandom data to the agent having initiated the one or more transactions.

According to another embodiment of the stacked semiconductor package, the agent having initiated the transactions includes one of: (i) an external tester communicably interfaced with the functional silicon die via the test controller; (ii) a processor core embedded within the functional silicon die; or (iii) the test controller.

According to another embodiment of the stacked semiconductor package, the test controller having the signature accumulation logic embedded therein collects signals from the fabric as the transactions traverse the fabric between the test controller and the far memory controller; and in which the test controller is to further compare the collected signals with known good test signatures to validate correct functioning of the functional silicon die.

According to another embodiment of the stacked semiconductor package, the functional silicon die at the first layer embodies a System On a Chip (SOC) functional silicon die manufactured by the manufacturer of the stacked semiconductor package.

In accordance with yet another embodiment there is a method for performing testing of a far memory subsystem on a functional silicon die in a stacked semiconductor package, in which the method includes: receiving transactions from a test controller to test a fabric of the functional silicon die; routing the transactions via the fabric between the test controller and any of a far memory controller of the functional silicon die; in which the far memory controller includes a physical memory interface having no physical memory attached; modifying the transactions when received at a Two Level Memory (2LM) controller to indicate a cache miss forcing all transactions received to be routed to the far memory controller via the fabric; and monitoring the transactions on the fabric via an auto response mechanism and routing responses and completions issued in reply to the transactions back to an agent having initiated the transactions.

According to another embodiment of such a method, the test controller interacts with a far memory sub-system embodied within the functional silicon die having the far memory controller operating therein; and in which the test controller initiates the transactions to the far memory controller; in which the transactions initiated by the test controller are routed to the far memory controller via one of the 2LM controller or via a Non-Volatile Memory express (NVMe) bypass path which routes the transactions to the far memory controller without traversing the 2LM controller.

According to another embodiment, the method further includes: routing one or more transactions to the far memory controller without traversing the 2LM controller the direction of the test controller via a Non-Volatile Memory express (NVMe) bypass; and collecting test signals and/or test signatures for the transactions which traverse the NVMe bypass path between the test controller having initiated the transactions and the far memory controller via an NVMe accumulator embedded within the functional silicon die.

According to another embodiment, the method further includes: collecting test signals and/or test signatures for the transactions which traverse the 2LM controller between the agent having initiated the transactions and the far memory controller via 2LM signature accumulation logic embedded within the functional silicon die.

According to another embodiment, the method further includes: returning any collected test signals and/or test signatures collected by the 2LM signature accumulation logic to the test controller; and comparing the returned collected test signals and/or test signatures against known good values to verify correct functioning of the far memory subsystem.

According to another embodiment, the method further includes: emulating the physical memory which is not attached to the physical memory interface of the far memory controller via the auto response mechanism.

According to another embodiment of such a method, the far memory subsystem further includes a plurality of near memory controllers, each having a physical near memory interface without any near memory components attached thereto; and in which the method further includes performing bare functional silicon die testing for the functional silicon die having no near memory components attached thereto via the transactions issued by the test controller, in which the bare functional silicon die testing includes testing the fabric's routing of transactions between the test controller and the far memory controller.

According to yet another embodiment, there is an electronics module including: a printed circuit board; a stacked semiconductor package electrically interfaced to the printed circuit board; and in which the stacked semiconductor package includes: (i) a substrate layer; (ii) a functional silicon die; (iii) a test controller having signature accumulation logic embedded therein; (iv) a fabric to route transactions between the test controller and a far memory controller of the functional silicon die, in which the far memory controller includes a physical memory interface having no physical memory attached; (v) a Two Level Memory (2LM) controller having logic to modify received transactions to indicate a cache miss forcing all received transactions to be routed to the far memory controller via the fabric; and (vi) an auto response mechanism to observe the transactions on the fabric and route responses and completions issued in reply to the transactions back to an agent having initiated the transactions.

According to another embodiment of the electronics module, the test controller interacts with a far memory sub-system embodied within the functional silicon die having the far memory controller operating therein; in which the test controller initiates the transactions to the far memory controller; and in which the transactions initiated by the test controller are routed to the far memory controller via one of the 2LM controller or via a Non-Volatile Memory express (NVMe) bypass path which routes the transactions to the far memory controller without traversing the 2LM controller.

According to another embodiment, the electronics module includes one of: a drone and robot control electronics module; a smartphone electronics module; a tablet electronics module; a gesture control electronics module for a computer; a 3D photography electronics module; a 3D immersive gaming electronics module; a face recognition electronics module to perform face recognition base security in-lieu of alphanumerical passwords; an image capture device electronics module having one or more optical and Complementary metal-oxide-semiconductor (CMOS) components affixed to the printed circuit board as the top side or bottom side components; a depth sensing camera electronics module to perform any of stereoscopic imaging depth sensing, coded light depth sensing, or laser time of flight depth sensing.

According to another embodiment, the electronics module is embedded within a wearable technology to be worn as one of: a clothing item; sports attire; a shoe; fashion electronics to be worn as a clothing item or an accessory; tech togs to be worn as a clothing item or an accessory; or fashionable technology to be worn as a clothing item or an accessory.

What is claimed is:

1. A stacked semiconductor package, comprising:
a functional silicon die;
a test controller having signature accumulation logic embedded therein;
a fabric to route transactions between the test controller and a far memory controller of the functional silicon die;
wherein the far memory controller includes a physical memory interface having no physical memory attached;
a Two Level Memory (2LM) controller having logic to modify received transactions to indicate a cache miss forcing all received transactions to be routed to the far memory controller via the fabric; and
an auto response mechanism to observe the transactions on the fabric and route responses and completions issued in reply to the transactions back to an agent having initiated the transactions.

2. The stacked semiconductor package of claim 1:
wherein the test controller interacts with a far memory sub-system embodied within the functional silicon die having the far memory controller operating therein;
wherein the test controller initiates the transactions to the far memory controller; and
wherein the transactions initiated by the test controller are routed to the far memory controller via one of the 2LM controller or via a Non-Volatile Memory express (NVMe) bypass path which routes the transactions to the far memory controller without traversing the 2LM controller.

3. The stacked semiconductor package of claim 1, further comprising:

a Non-Volatile Memory express (NVMe) bypass path to optionally route the transactions to the far memory controller without traversing the 2LM controller the direction of the test controller; and
an NVMe accumulator to collect test signals and/or test signatures for the transactions which traverse the NVMe bypass path between the test controller having initiated the transactions and the far memory controller.

4. The stacked semiconductor package of claim 1:
wherein the 2LM controller further comprises signature accumulation logic to collect test signals and/or test signatures for the transactions which traverse the 2LM controller between the agent having initiated the transactions and the far memory controller.

5. The stacked semiconductor package of claim 4:
wherein the 2LM controller is to further return any collected test signals and/or test signatures to the test controller.

6. The stacked semiconductor package of claim 1:
wherein the auto response mechanism emulates the physical memory which is not attached to the physical memory interface of the far memory controller.

7. The stacked semiconductor package of claim 1, further comprising:
a plurality of near memory controllers, each having a physical near memory interface without any near memory components attached thereto; and
wherein the transactions perform bare functional silicon die testing for the functional silicon die having no near memory components attached thereto, wherein the bare functional silicon die testing includes testing the fabric's routing of transactions between the test controller and the far memory controller.

8. The stacked semiconductor package of claim 1, further comprising:
a plurality of near memory controllers, each having a physical near memory interface having Dynamic Random Access Memory (DRAM) components attached thereto as near memory for the stacked semiconductor package;
wherein the transactions perform functional silicon die testing for the functional silicon die subsequent to having the DRAM components attached to the physical near memory interfaces; and
wherein the functional silicon die testing includes testing the fabric's routing of transactions between the test controller and the far memory controller.

9. The stacked semiconductor package of claim 1:
wherein the 2LM controller modifies the received transactions to indicate a cache miss without checking to determine whether or not data requested by the received transaction resides within near memory of the stacked semiconductor package; and
wherein the 2LM controller modifies forward the received transactions to the far memory controller based on the indication of the cache miss for each of the received transactions.

10. The stacked semiconductor package of claim 1:
wherein one or more of the transactions comprise a write transaction directed toward the far memory controller; and
wherein the auto response mechanism terminates the write transaction as a posted transaction without responding to the agent having initiated the one or more transactions.

11. The stacked semiconductor package of claim 1:
wherein one or more of the transactions comprise a read transaction directed toward the far memory controller; and
wherein the auto response mechanism generates pseudo-random data responsive to the one or more read transactions and issues a response with the generated pseudorandom data to the agent having initiated the one or more transactions.

12. The stacked semiconductor package of claim 1, wherein the agent having initiated the transactions comprises one of:
(i) an external tester communicably interfaced with the functional silicon die via the test controller;
(ii) a processor core embedded within the functional silicon die; or
(iii) the test controller.

13. The stacked semiconductor package of claim 1:
wherein the test controller having the signature accumulation logic embedded therein collects signals from the fabric as the transactions traverse the fabric between the test controller and the far memory controller; and
wherein the test controller is to further compare the collected signals with known good test signatures to validate correct functioning of the functional silicon die.

14. The stacked semiconductor package of claim 1:
wherein the functional silicon die at the first layer embodies a System On a Chip (SOC) functional silicon die manufactured by the manufacturer of the stacked semiconductor package.

15. A method for performing testing of a far memory subsystem on a functional silicon die in a stacked semiconductor package, wherein the method comprises:
receiving transactions from a test controller to test a fabric of the functional silicon die;
routing the transactions via the fabric between the test controller and any of a far memory
controller of the functional silicon die;
wherein the far memory controller includes a physical memory interface having no physical memory attached;
modifying the transactions when received at a Two Level Memory (2LM) controller to indicate a cache miss forcing all transactions received to be routed to the far memory controller via the fabric; and
monitoring the transactions on the fabric via an auto response mechanism and routing responses and completions issued in reply to the transactions back to an agent having initiated the transactions.

16. The method of claim 15:
wherein the test controller interacts with a far memory sub-system embodied within the functional silicon die having the far memory controller operating therein; and
wherein the test controller initiates the transactions to the far memory controller;
wherein the transactions initiated by the test controller are routed to the far memory controller via one of the 2LM controller or via a Non-Volatile Memory express (NVMe) bypass path which routes the transactions to the far memory controller without traversing the 2LM controller.

17. The method of claim 15, further comprising:
routing one or more transactions to the far memory controller without traversing the 2LM controller the direction of the test controller via a Non-Volatile Memory express (NVMe) bypass; and
collecting test signals and/or test signatures for the transactions which traverse the NVMe bypass path between the test controller having initiated the transactions and the far memory controller via an NVMe accumulator embedded within the functional silicon die.

18. The method of claim 15:
collecting test signals and/or test signatures for the transactions which traverse the 2LM controller between the agent having initiated the transactions and the far memory controller via 2LM signature accumulation logic embedded within the functional silicon die.

19. The method of claim 18:
returning any collected test signals and/or test signatures collected by the 2LM signature accumulation logic to the test controller; and
comparing the returned collected test signals and/or test signatures against known good values to verify correct functioning of the far memory subsystem.

20. The method of claim 15, further comprising:
emulating the physical memory which is not attached to the physical memory interface of the far memory controller via the auto response mechanism.

21. The method of claim 15:
wherein the far memory subsystem further includes a plurality of near memory controllers, each having a physical near memory interface without any near memory components attached thereto; and
wherein the method further includes performing bare functional silicon die testing for the functional silicon die having no near memory components attached thereto via the transactions issued by the test controller, wherein the bare functional silicon die testing includes testing the fabric's routing of transactions between the test controller and the far memory controller.

22. An electronics module comprising:
a printed circuit board;
a stacked semiconductor package electrically interfaced to the printed circuit board; and
wherein the stacked semiconductor package comprises:
(i) a substrate layer;
(ii) a functional silicon die;
(iii) a test controller having signature accumulation logic embedded therein;
(iv) a fabric to route transactions between the test controller and a far memory controller of the functional silicon die, wherein the far memory controller includes a physical memory interface having no physical memory attached;
(v) a Two Level Memory (2LM) controller having logic to modify received transactions to indicate a cache miss forcing all received transactions to be routed to the far memory controller via the fabric; and
(vi) an auto response mechanism to observe the transactions on the fabric and route responses and completions issued in reply to the transactions back to an agent having initiated the transactions.

23. The electronics module of claim 22:
wherein the test controller interacts with a far memory sub-system embodied within the functional silicon die having the far memory controller operating therein;
wherein the test controller initiates the transactions to the far memory controller; and
wherein the transactions initiated by the test controller are routed to the far memory controller via one of the 2LM controller or via a Non-Volatile Memory express (NVMe) bypass path which routes the transactions to the far memory controller without traversing the 2LM controller.

24. The electronics module of claim 22, wherein the electronics module comprises one of:
   a drone and robot control electronics module;
   a smartphone electronics module;
   a tablet electronics module;
   a gesture control electronics module for a computer;
   a 3D photography electronics module;
   a 3D immersive gaming electronics module;
   a face recognition electronics module to perform face recognition base security in-lieu of alphanumerical passwords;
   an image capture device electronics module having one or more optical and Complementary metal-oxide-semiconductor (CMOS) components affixed to the printed circuit board as the top side or bottom side components;
   a depth sensing camera electronics module to perform any of stereoscopic imaging depth sensing, coded light depth sensing, or laser time of flight depth sensing.

25. The electronics module of claim 22, wherein the electronics module is embedded within a wearable technology to be worn as one of:
   a clothing item;
   sports attire;
   a shoe;
   fashion electronics to be worn as a clothing item or an accessory;
   tech togs to be worn as a clothing item or an accessory; or
   fashionable technology to be worn as a clothing item or an accessory.

* * * * *